(12) United States Patent
Cok et al.

(10) Patent No.: US 11,981,559 B2
(45) Date of Patent: May 14, 2024

(54) ENCLOSED CAVITY STRUCTURES

(71) Applicant: X-Celeprint Limited, Dublin (IE)

(72) Inventors: Ronald S. Cok, Rochester, NY (US); Raja Fazan Gul, Cork (IE); António José Marques Trindade, Cork (IE)

(73) Assignee: X-Celeprint Limited, Dublin (IE)

( * ) Notice: Subject to any disclaimer, the term of this patent is extended or adjusted under 35 U.S.C. 154(b) by 628 days.

(21) Appl. No.: 17/098,241

(22) Filed: Nov. 13, 2020

(65) Prior Publication Data

US 2021/0061645 A1  Mar. 4, 2021

Related U.S. Application Data

(63) Continuation of application No. 17/027,671, filed on Sep. 21, 2020, which is a continuation-in-part of
(Continued)

(51) Int. Cl.
*B81C 1/00* (2006.01)
*B81B 7/00* (2006.01)
(Continued)

(52) U.S. Cl.
CPC ........ *B81B 7/0077* (2013.01); *B81C 1/00269* (2013.01); *H10N 30/02* (2023.02);
(Continued)

(58) Field of Classification Search
None
See application file for complete search history.

(56) References Cited

U.S. PATENT DOCUMENTS

| 6,111,338 A | 8/2000 | Otsuchi et al. |
| 6,142,358 A * | 11/2000 | Cohn ................ B81B 7/00 |
| | | 257/737 |

(Continued)

FOREIGN PATENT DOCUMENTS

| JP | 2007-208845 A | 8/2007 |
| WO | WO-2011/129855 A2 | 10/2011 |
| WO | WO-2021/224284 A1 | 11/2021 |

OTHER PUBLICATIONS

Cok, R. S. et al., Inorganic light-emitting diode displays using micro-transfer printing, Journal of the SID, 25(10):589-609, (2017).
(Continued)

*Primary Examiner* — Benjamin P Sandvik
(74) *Attorney, Agent, or Firm* — Choate, Hall & Stewart LLP; Michael D. Schmitt

(57) ABSTRACT

An example of a cavity structure comprises a cavity substrate comprising a substrate surface, a cavity extending into the cavity substrate, the cavity having a cavity bottom and cavity walls, and a cap disposed on a side of the cavity opposite the cavity bottom. The cavity substrate, the cap, and the one or more cavity walls form a cavity enclosing a volume. A component can be disposed in the cavity and can extend above the substrate surface. The component can be a piezoelectric or a MEMS device. The cap can have a tophat configuration. The cavity structure can be micro-transfer printed from a source wafer to a destination substrate.

16 Claims, 80 Drawing Sheets

Related U.S. Application Data application No. 16/842,591, filed on Apr. 7, 2020, now Pat. No. 11,274,035, and a continuation-in-part of application No. 16/207,804, filed on Dec. 3, 2018, now Pat. No. 10,804,880.

(60) Provisional application No. 63/020,514, filed on May 5, 2020, provisional application No. 62/838,262, filed on Apr. 24, 2019.

(51) Int. Cl.
 H10N 30/02 (2023.01)
 H10N 30/88 (2023.01)

(52) U.S. Cl.
 CPC ...... *H10N 30/88* (2023.02); *B81B 2203/0315* (2013.01); *B81C 2203/0109* (2013.01); *B81C 2203/032* (2013.01)

(56) References Cited

U.S. PATENT DOCUMENTS

| | | | |
|---|---|---|---|
| 6,566,981 B2 | 5/2003 | Urabe et al. |
| 6,635,519 B2 | 10/2003 | Barber et al. |
| 6,911,708 B2 | 6/2005 | Park |
| 7,161,233 B2 | 1/2007 | Delapierre |
| 7,307,369 B2 | 12/2007 | Yokota et al. |
| 7,312,675 B2 | 12/2007 | Ruby et al. |
| 7,423,501 B2 | 9/2008 | Kim et al. |
| 7,456,041 B2 | 11/2008 | Ha et al. |
| 7,463,117 B2 | 12/2008 | Ohara et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,662,545 B2 | 2/2010 | Nuzzo et al. |
| 7,704,684 B2 | 4/2010 | Rogers et al. |
| 7,799,699 B2 | 9/2010 | Nuzzo et al. |
| 7,927,976 B2 | 4/2011 | Menard |
| 7,943,491 B2 | 5/2011 | Nuzzo et al. |
| 7,984,648 B2 | 7/2011 | Horning et al. |
| 7,986,075 B2 | 7/2011 | Asai et al. |
| 7,990,233 B2 | 8/2011 | Suzuki |
| 8,261,660 B2 | 9/2012 | Menard |
| 8,506,867 B2 | 8/2013 | Menard |
| 8,618,721 B2 | 12/2013 | Ichikawa et al. |
| 8,722,458 B2 | 5/2014 | Rogers et al. |
| 8,827,550 B2 | 9/2014 | Abdelmoneum et al. |
| 8,835,940 B2 | 9/2014 | Hu et al. |
| 8,877,648 B2 | 11/2014 | Bower et al. |
| 8,889,485 B2 | 11/2014 | Bower |
| 8,941,215 B2 | 1/2015 | Hu et al. |
| 9,049,797 B2 | 6/2015 | Menard et al. |
| 9,087,764 B2 | 7/2015 | Chan et al. |
| 9,105,714 B2 | 8/2015 | Hu et al. |
| 9,139,425 B2 | 9/2015 | Vestyck |
| 9,165,989 B2 | 10/2015 | Bower et al. |
| 9,166,114 B2 | 10/2015 | Hu et al. |
| 9,178,123 B2 | 11/2015 | Sakariya et al. |
| 9,217,541 B2 | 12/2015 | Bathurst et al. |
| 9,444,428 B2 | 9/2016 | Ruby et al. |
| 9,478,583 B2 | 10/2016 | Hu et al. |
| 9,583,533 B2 | 2/2017 | Hu et al. |
| 9,667,220 B2 | 5/2017 | Sridaran et al. |
| 9,929,053 B2 | 3/2018 | Bower et al. |
| 10,103,069 B2 | 10/2018 | Bower et al. |
| 10,153,256 B2 | 12/2018 | Cok et al. |
| 10,200,013 B2 | 2/2019 | Bower et al. |
| 10,224,460 B2 | 3/2019 | Bower et al. |
| 10,790,173 B2 | 9/2020 | Gomez et al. |
| 10,804,880 B2 | 10/2020 | Cok |
| 11,088,007 B1 * | 8/2021 | Fecioru ............... H01L 21/6835 |
| 2002/0114053 A1 * | 8/2002 | Yasuda ................. B81B 3/0067 |
| | | 359/224.1 |
| 2002/0140533 A1 | 10/2002 | Miyazaki et al. |
| 2003/0117369 A1 | 6/2003 | Spitzer et al. |
| 2003/0141570 A1 | 7/2003 | Chen et al. |
| 2004/0029356 A1 | 2/2004 | Timme et al. |
| 2004/0188782 A1 | 9/2004 | Fujii |
| 2006/0063462 A1 | 3/2006 | Ding et al. |
| 2006/0197173 A1 | 9/2006 | Mase |
| 2007/0004175 A1 | 1/2007 | Harris, Jr. |
| 2007/0228880 A1 | 10/2007 | Higuchi et al. |
| 2009/0090531 A1 | 4/2009 | Schmitz et al. |
| 2009/0127978 A1 | 5/2009 | Asai et al. |
| 2010/0189444 A1 | 7/2010 | Vernooy et al. |
| 2010/0301431 A1 | 12/2010 | Ding et al. |
| 2012/0038019 A1 * | 2/2012 | Stevenson ........... B81C 99/0045 |
| | | 257/E21.525 |
| 2012/0043859 A1 | 2/2012 | Ichikawa et al. |
| 2013/0316487 A1 | 11/2013 | de Graff et al. |
| 2015/0028362 A1 | 1/2015 | Chan et al. |
| 2015/0372187 A1 | 12/2015 | Bower et al. |
| 2016/0086855 A1 * | 3/2016 | Bower ................ H01L 21/7806 |
| | | 257/798 |
| 2016/0093600 A1 | 3/2016 | Bower et al. |
| 2017/0048976 A1 | 2/2017 | Prevatte et al. |
| 2017/0247249 A1 | 8/2017 | Duqi et al. |
| 2017/0310299 A1 | 10/2017 | Bower et al. |
| 2017/0336435 A1 | 11/2017 | Tseng et al. |
| 2018/0031822 A1 * | 2/2018 | Duqi ......................... B81B 7/02 |
| 2018/0174910 A1 | 6/2018 | Bower et al. |
| 2018/0273375 A1 | 9/2018 | Tanaka |
| 2019/0049717 A1 * | 2/2019 | Man ..................... B81B 7/0058 |
| 2019/0051552 A1 | 2/2019 | Bower et al. |
| 2019/0107397 A1 | 4/2019 | Ito |
| 2020/0176286 A1 | 6/2020 | Rotzoll et al. |
| 2020/0176670 A1 | 6/2020 | Gomez et al. |
| 2020/0176671 A1 | 6/2020 | Cok et al. |
| 2020/0177149 A1 | 6/2020 | Trindade et al. |
| 2020/0177163 A1 | 6/2020 | Cok |
| 2020/0339414 A1 | 10/2020 | Gul et al. |

OTHER PUBLICATIONS

International Search Report for PCT/EP2021/061762 filed Apr. 5, 2021, 3 pages, dated Jul. 27, 2021.

Written Opinion for PCT/EP2021/061762 filed Apr. 5, 2021, 9 pages, dated Jul. 27, 2021.

Wu, Q. et al., Hermetic joining of micro-devices using a glass frit intermediate layer and a scanning laser beam, 2nd Electronics System Integration Technology Conference, 10 pages (2008).

* cited by examiner

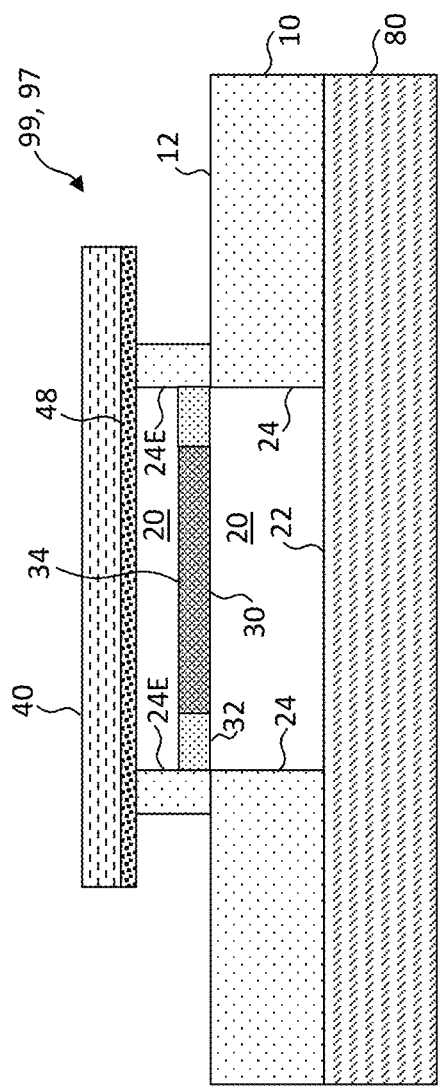
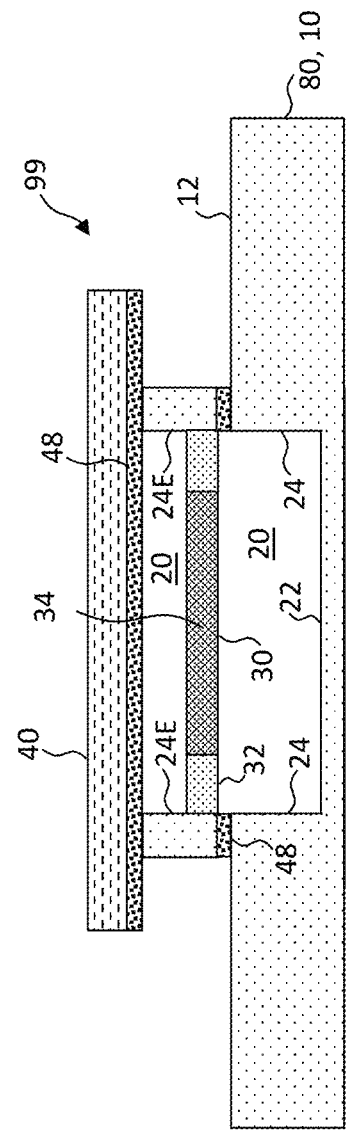
FIG. 3A
FIG. 3B

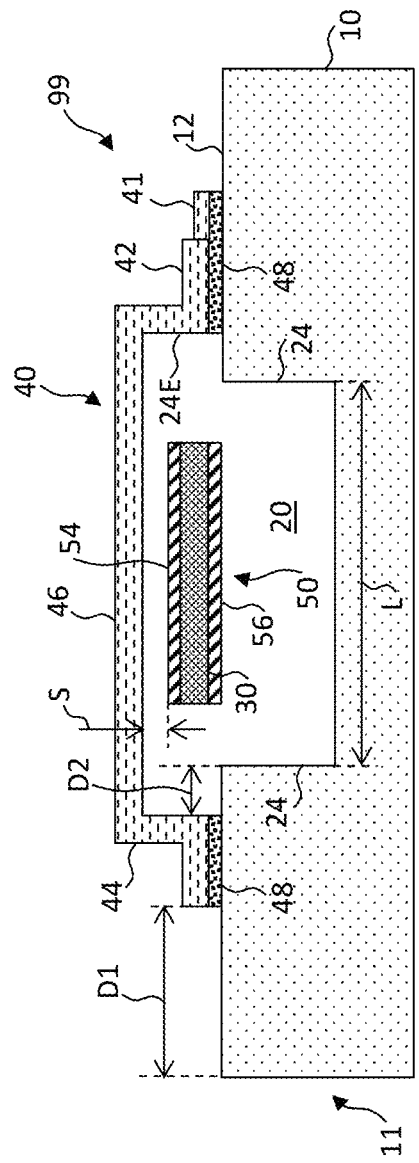
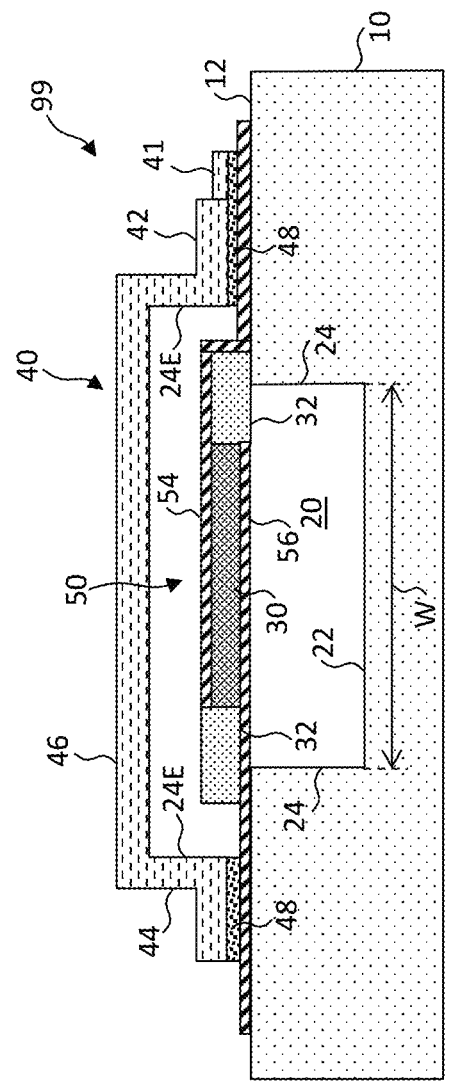

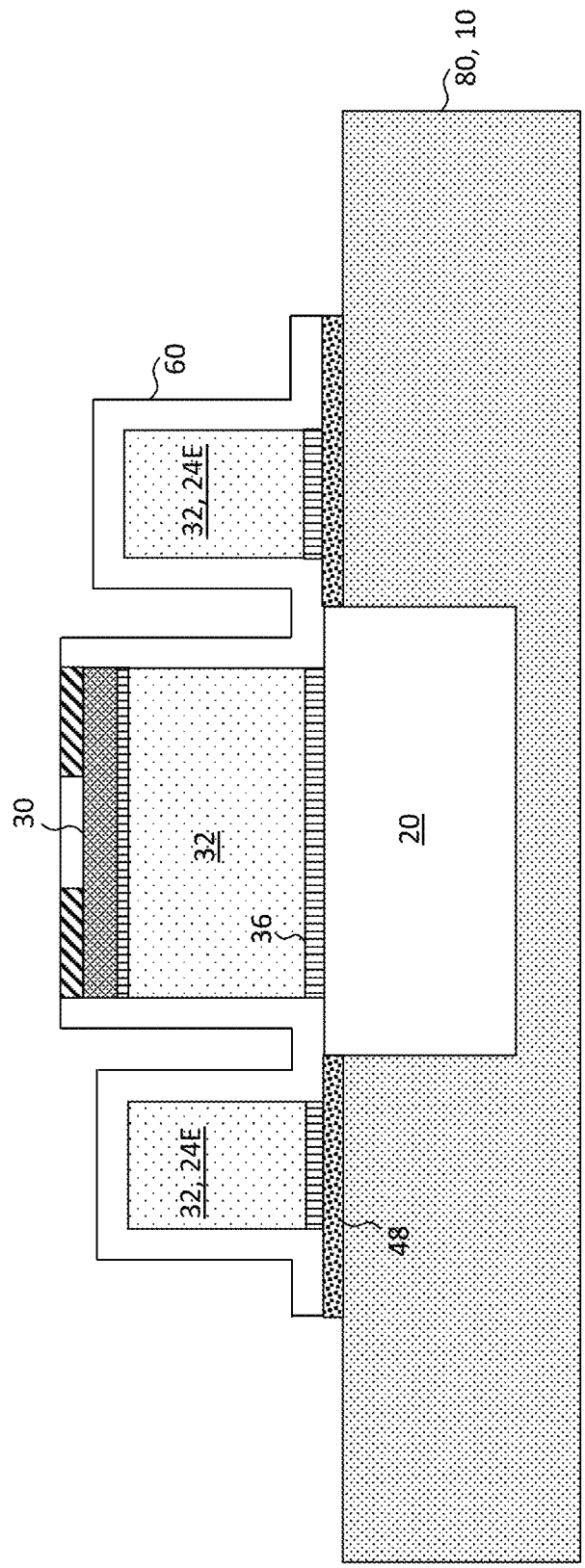
FIG. 7I1

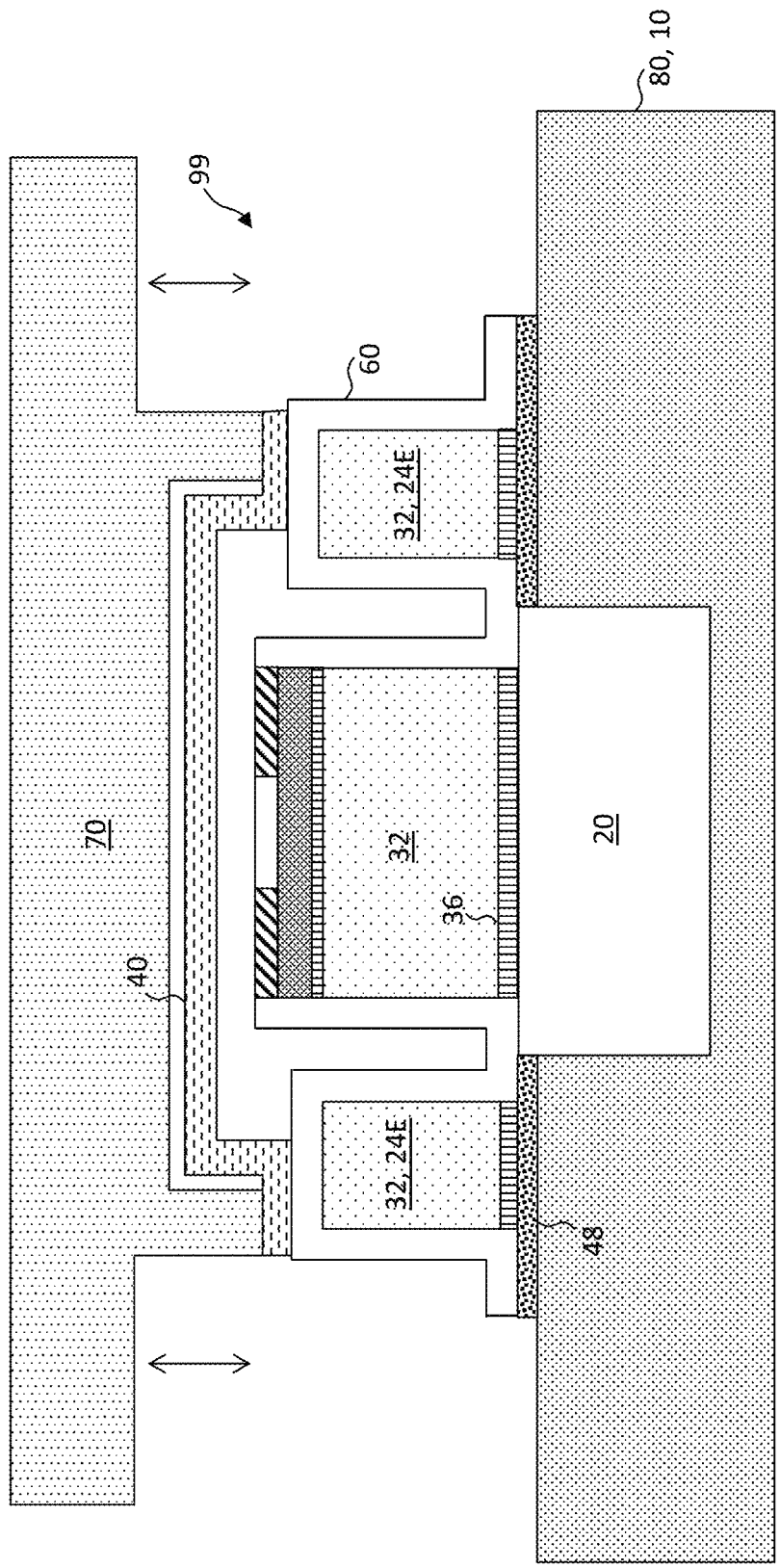
FIG. 7J1

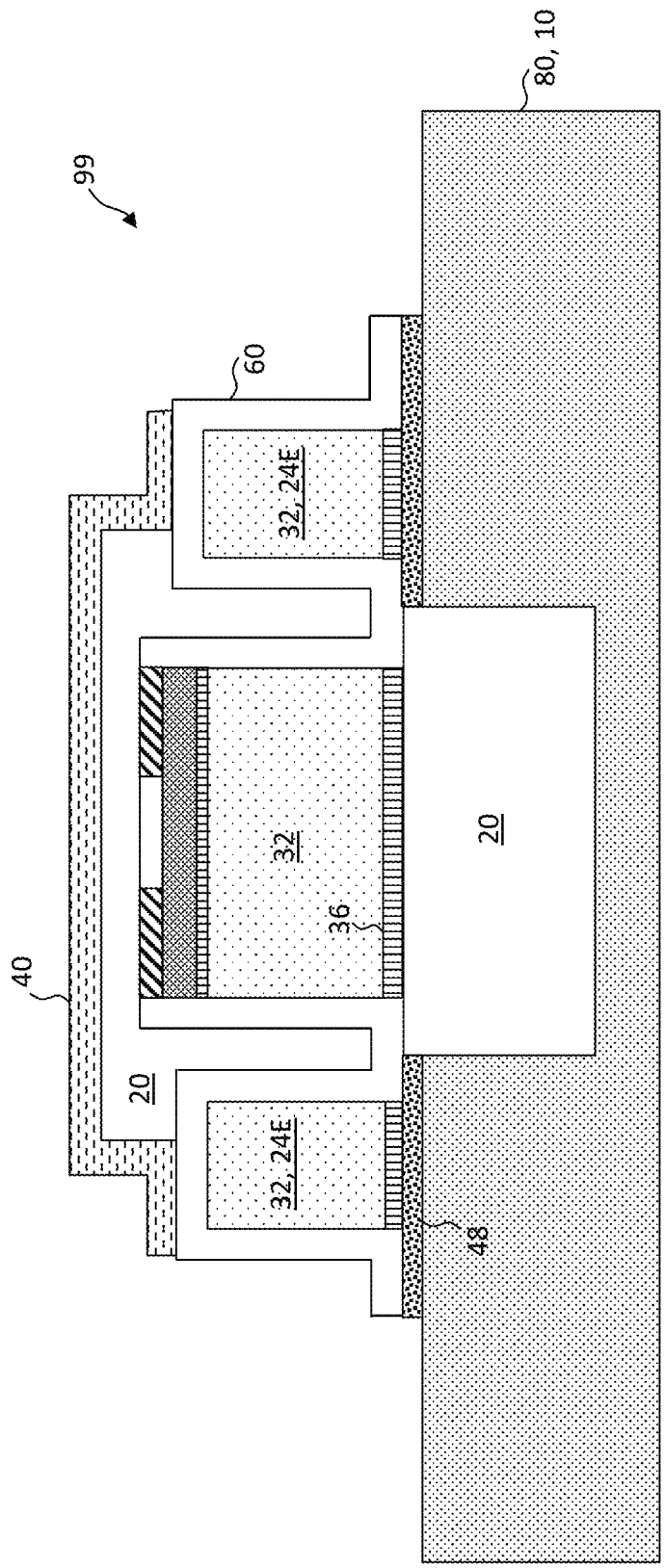
FIG. 7K1

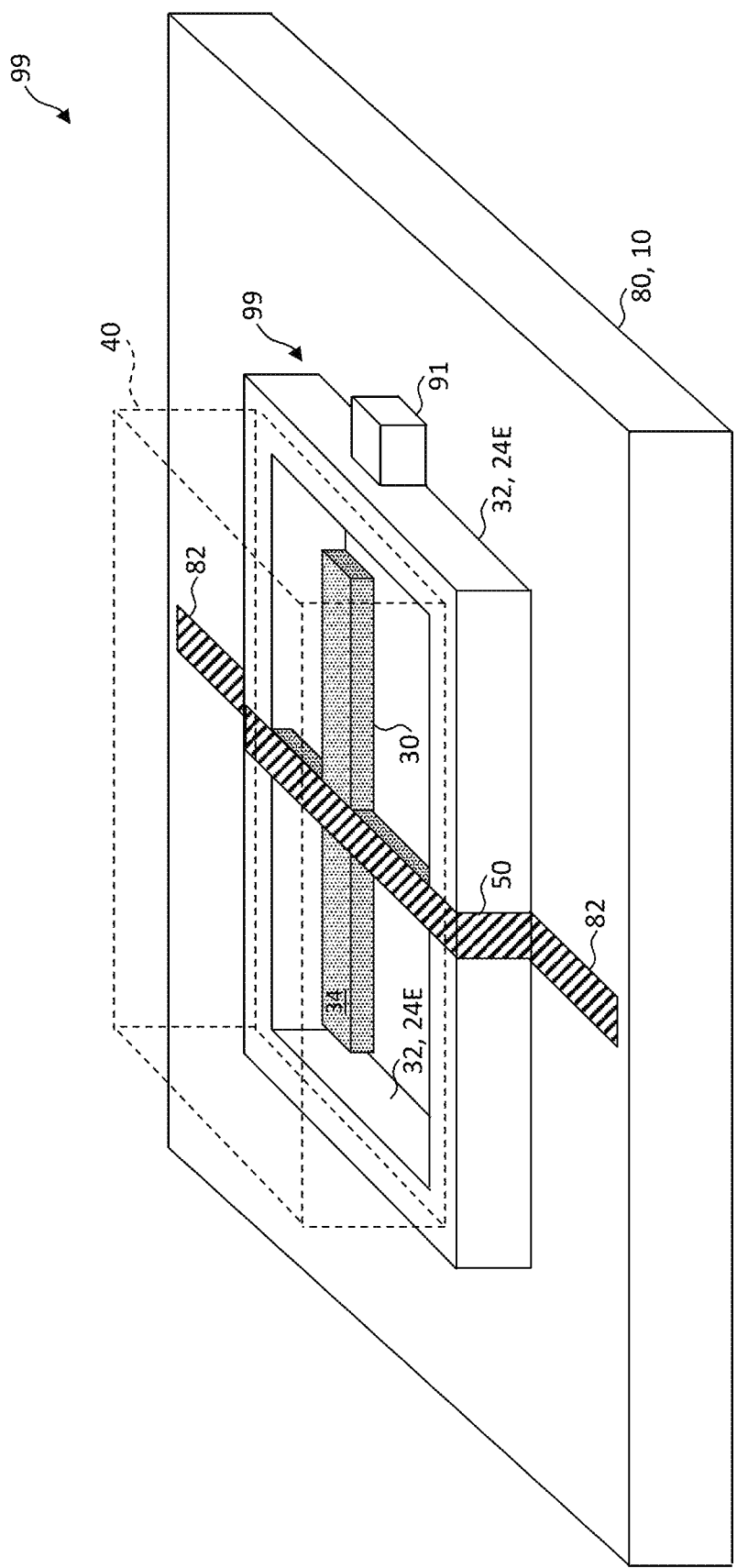
FIG. 7L1

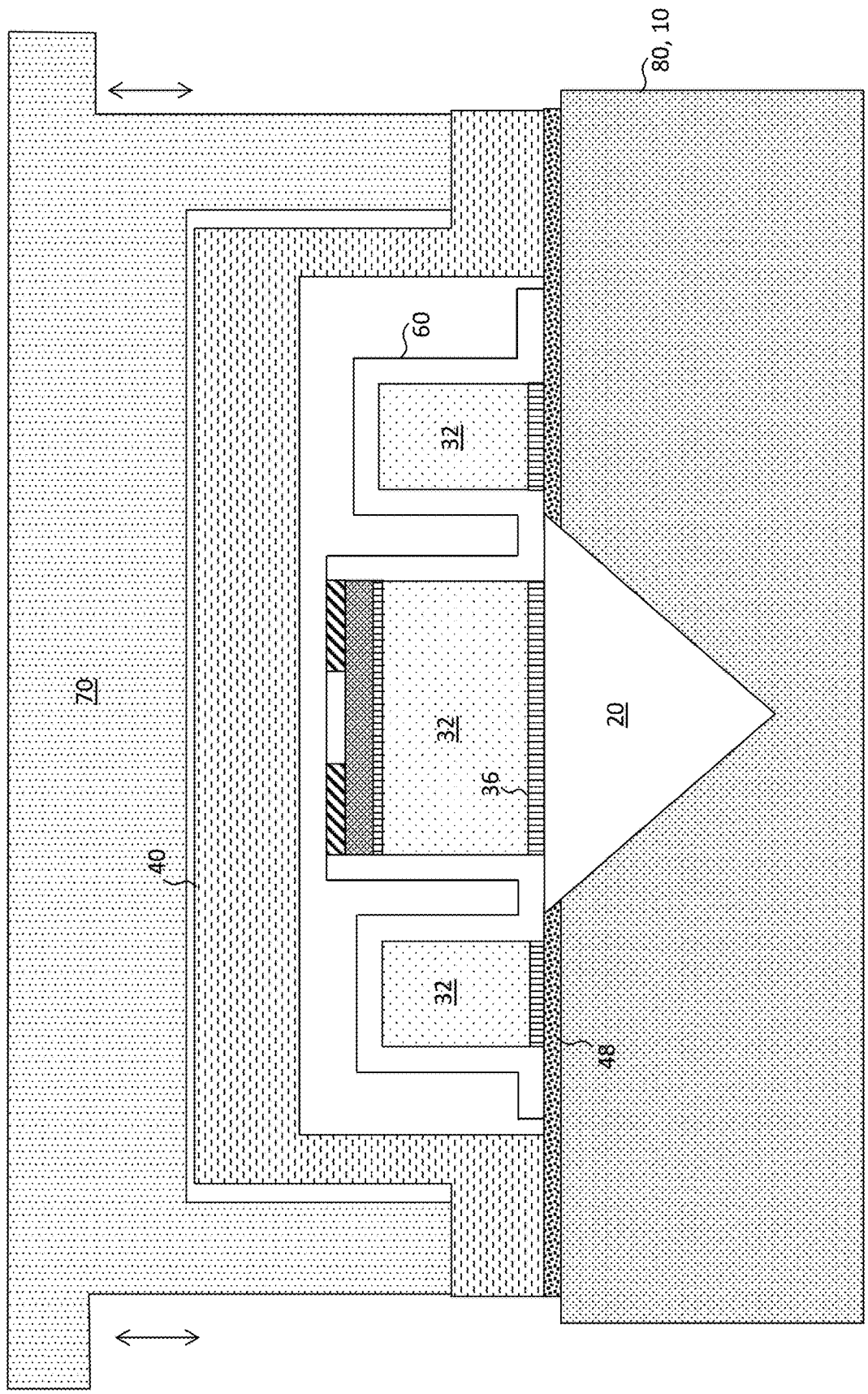
FIG. 7J2

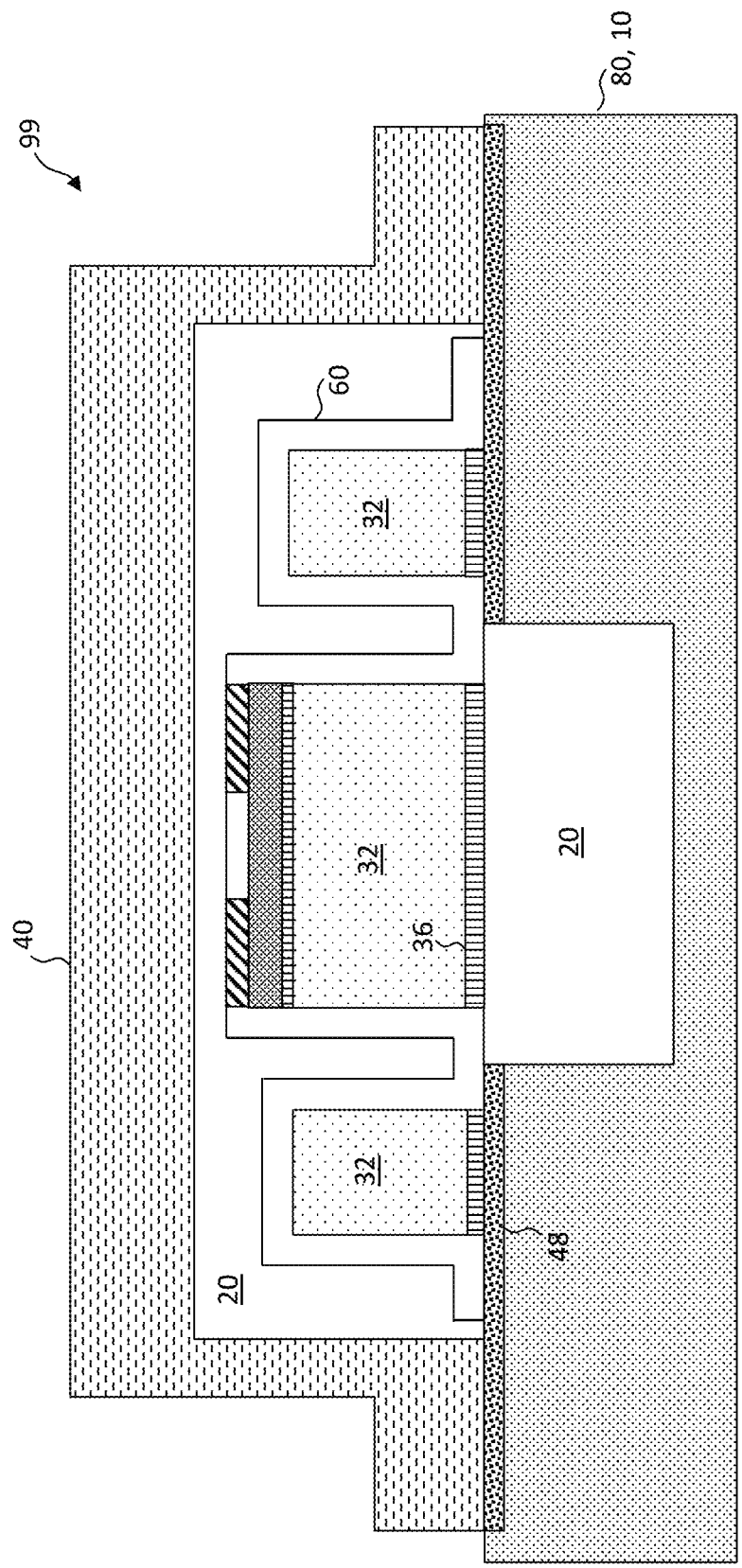
FIG. 7K2

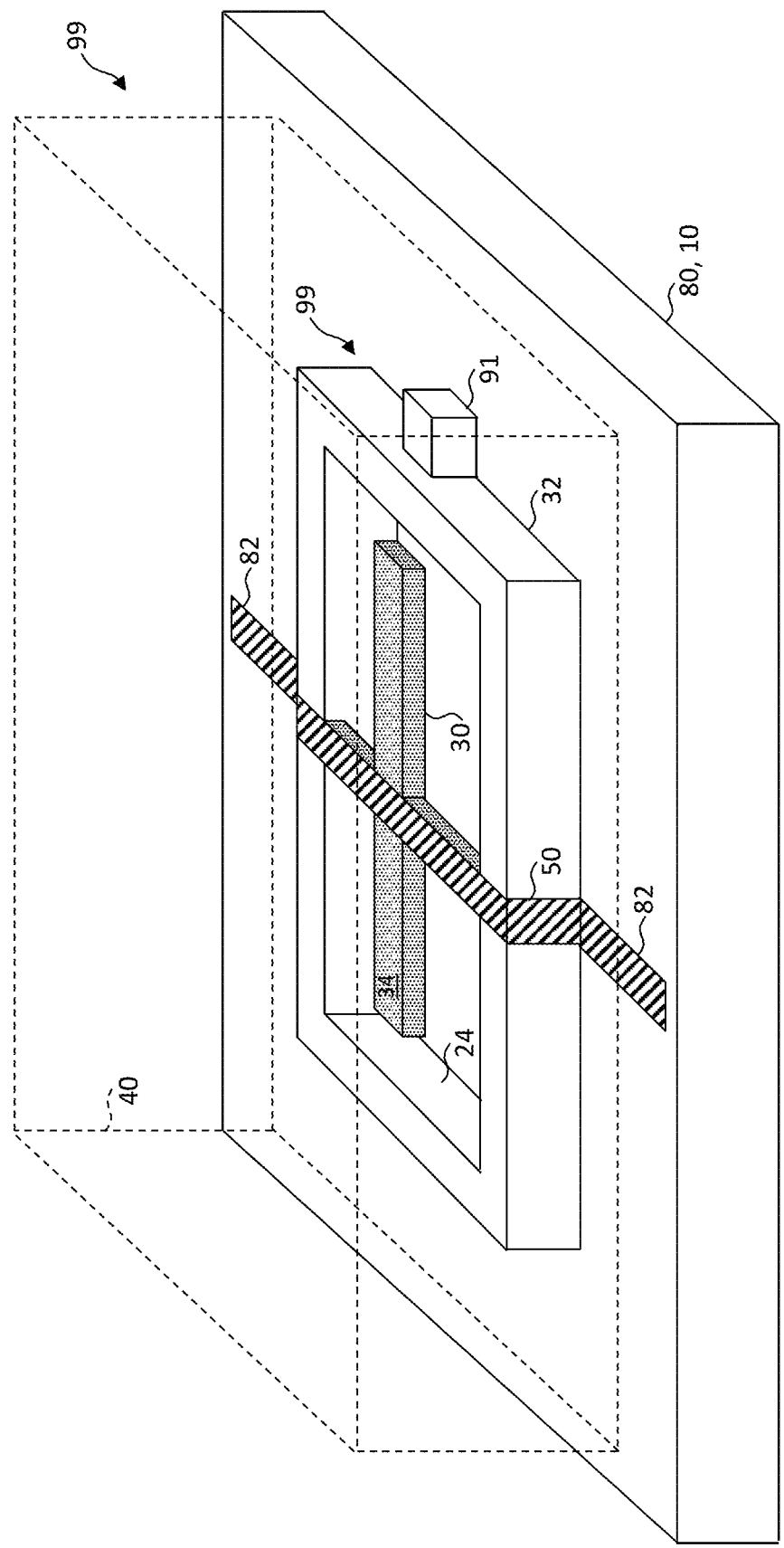
FIG. 7L2

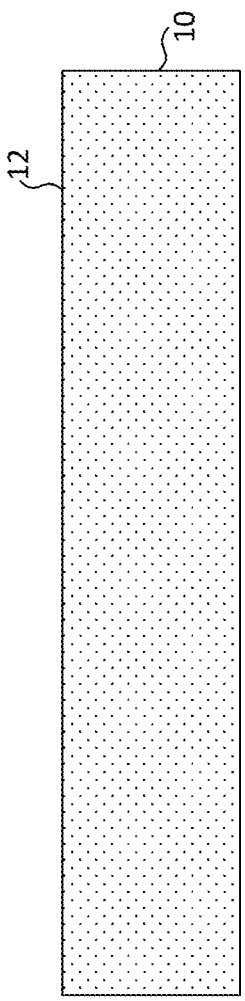
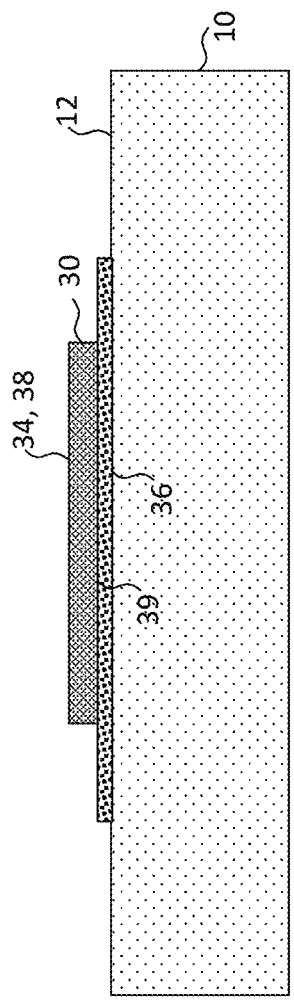
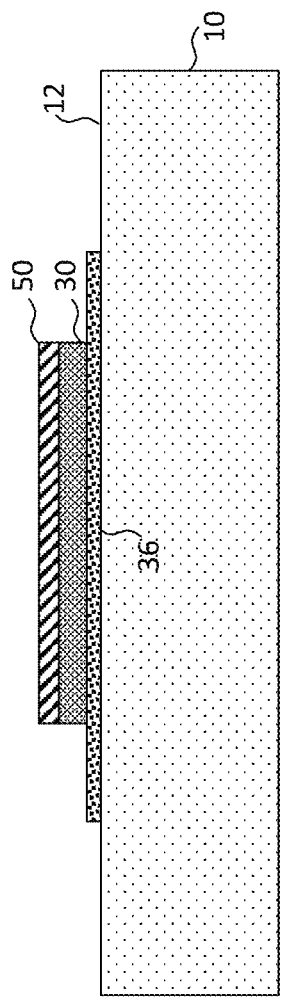
FIG. 9A
FIG. 9B
FIG. 9C

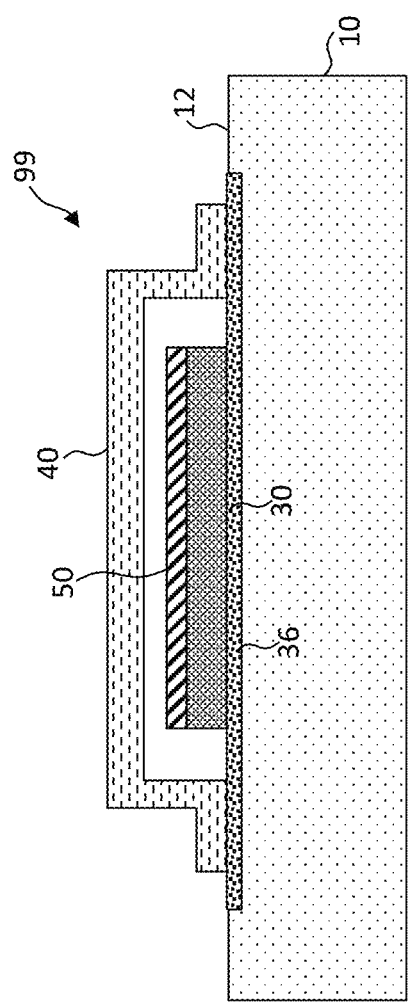
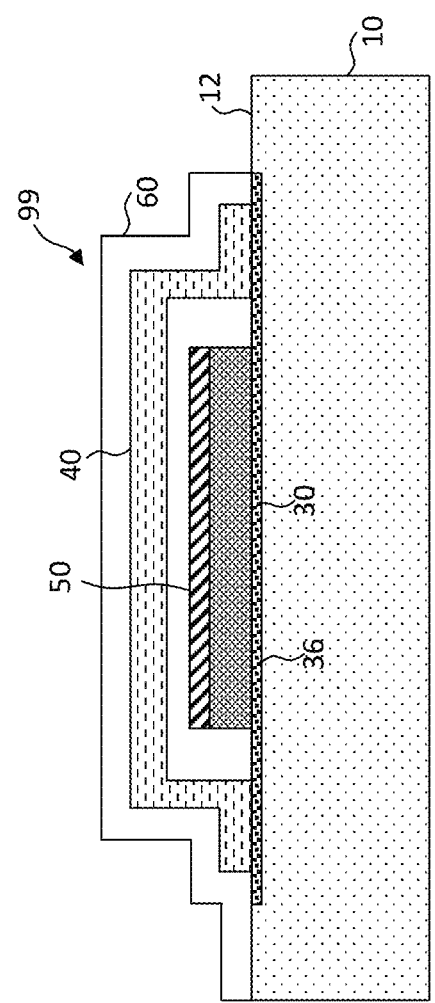

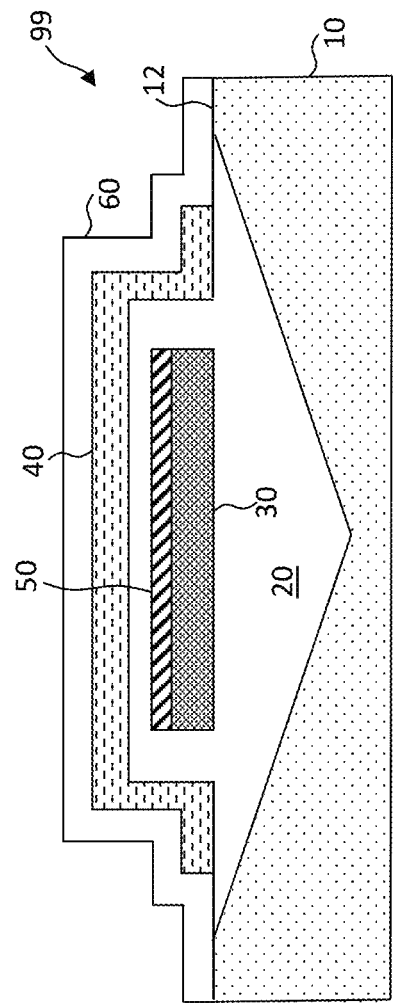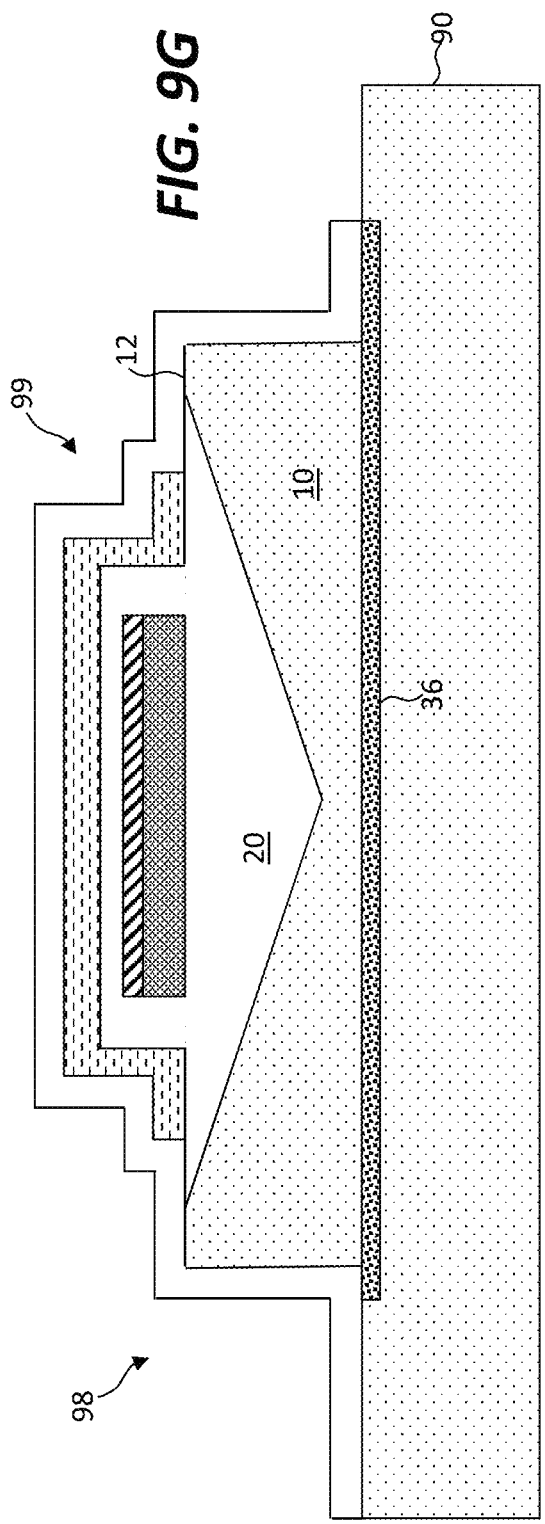

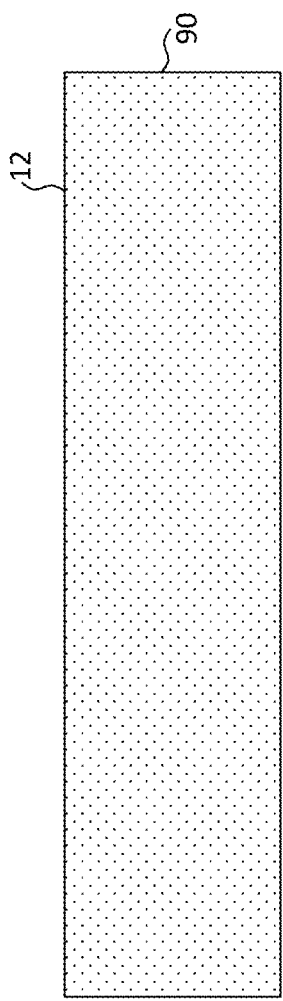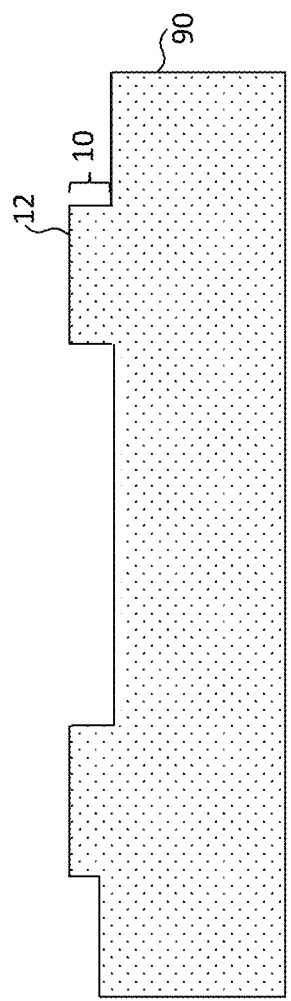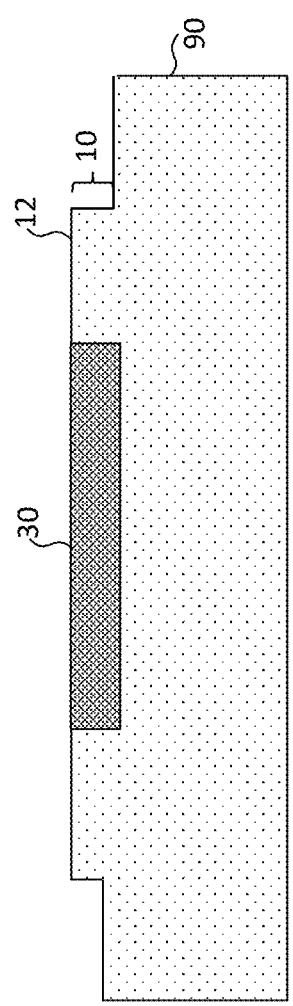

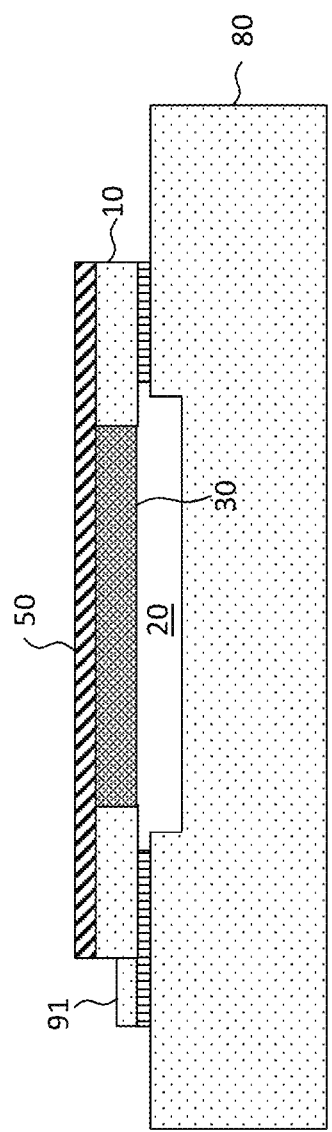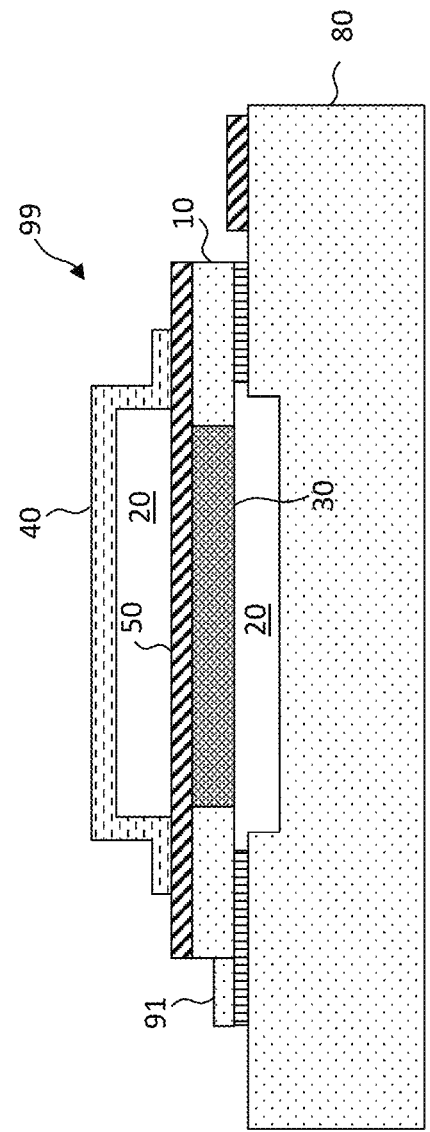

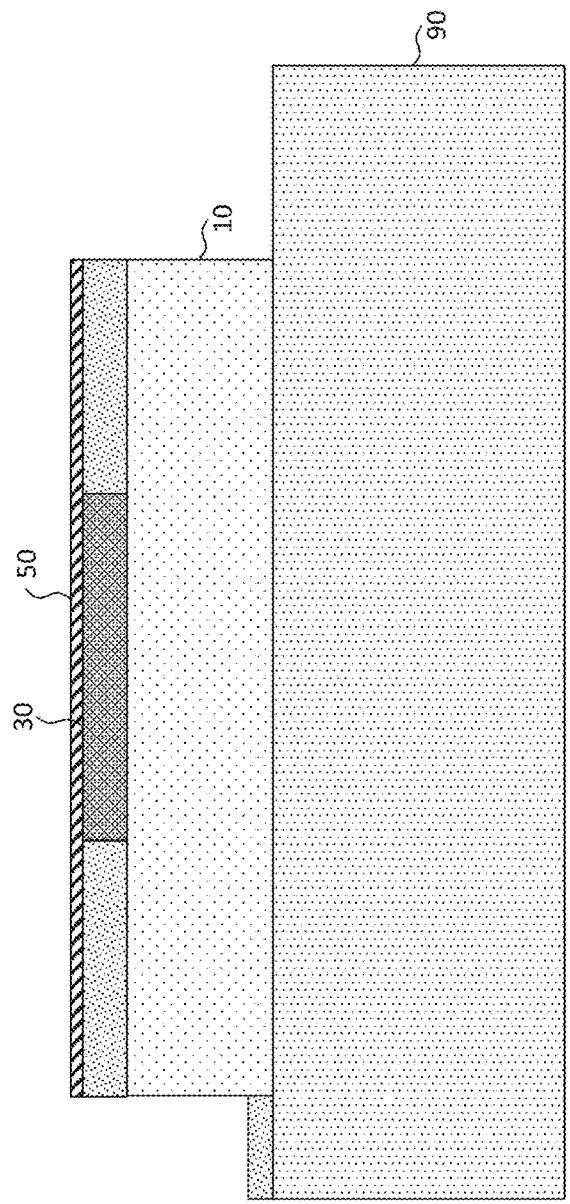
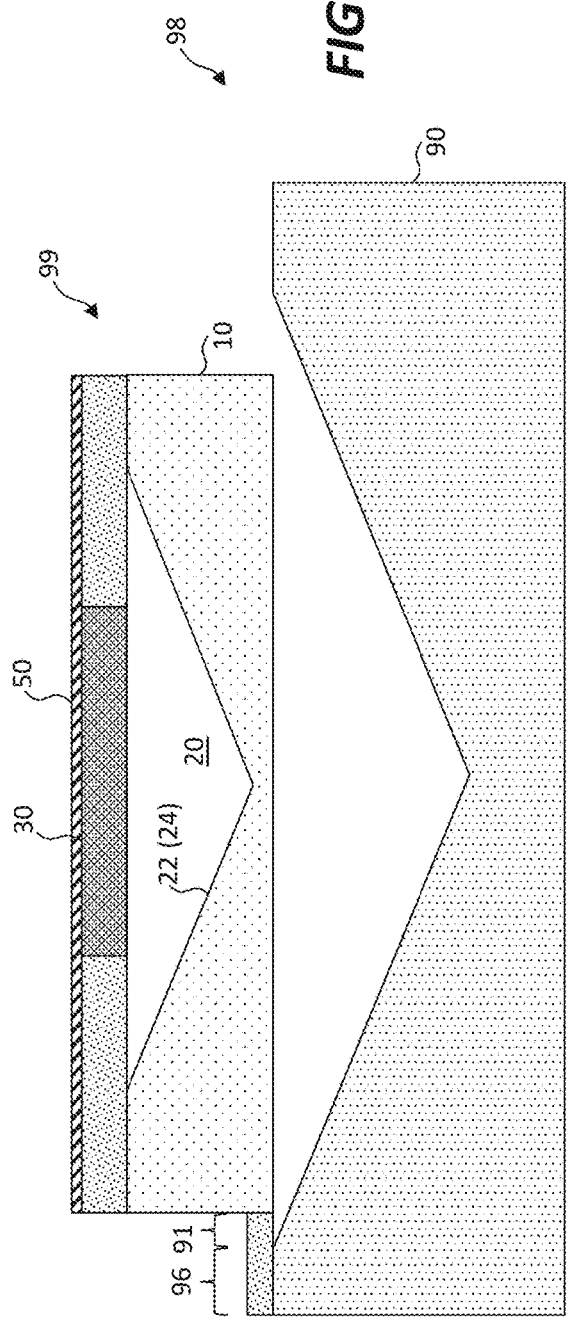

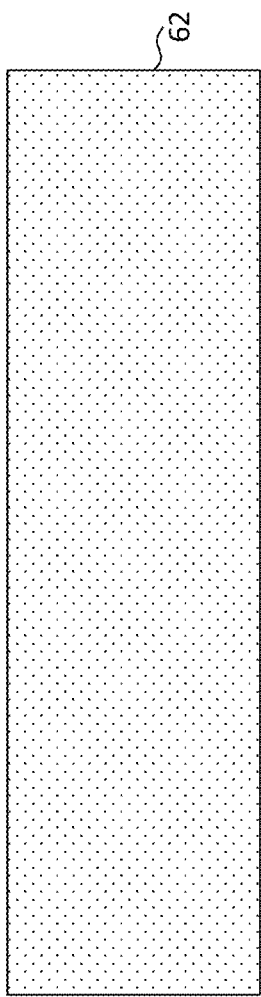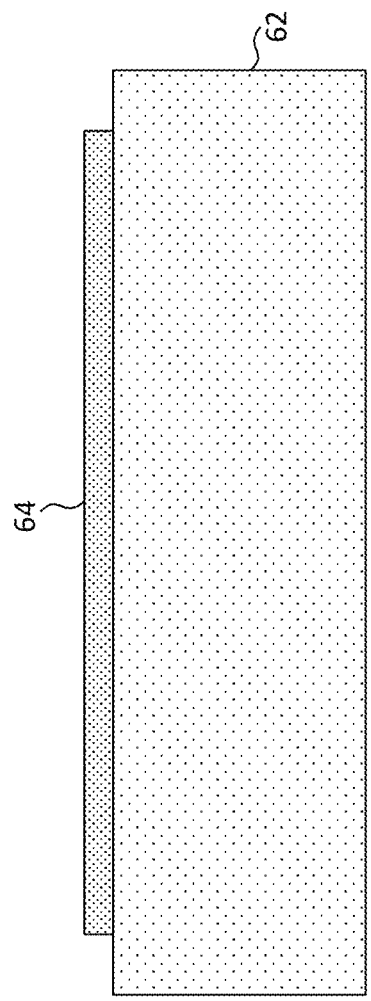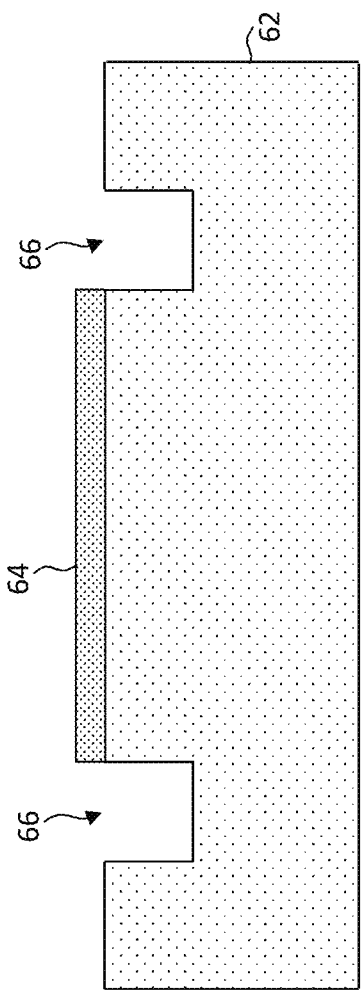

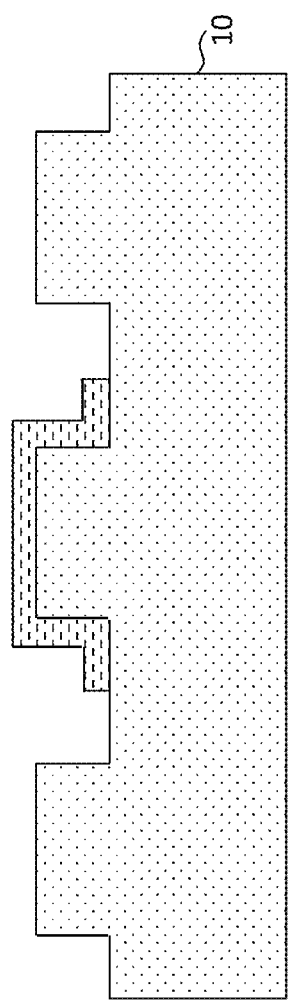
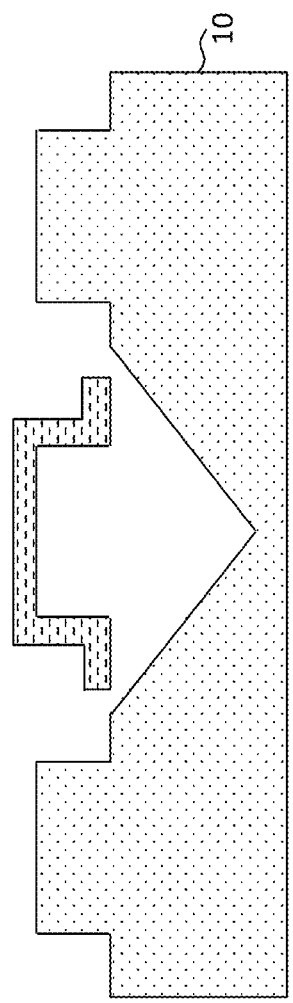

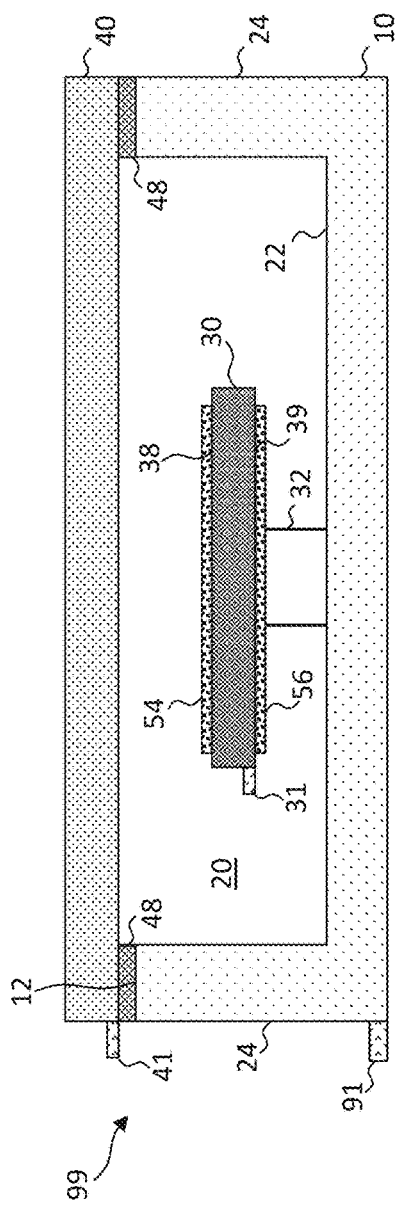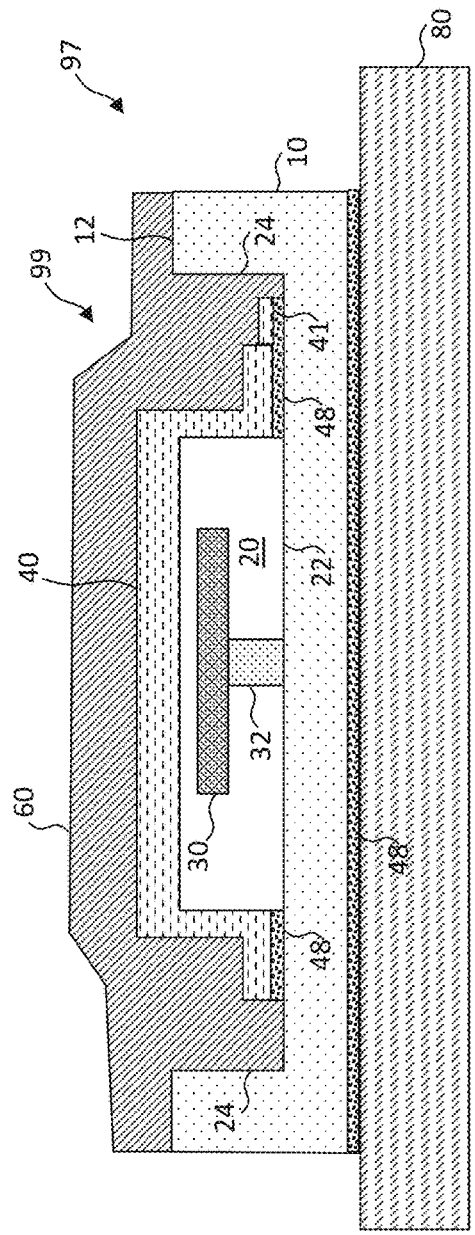
FIG. 20A
FIG. 20B

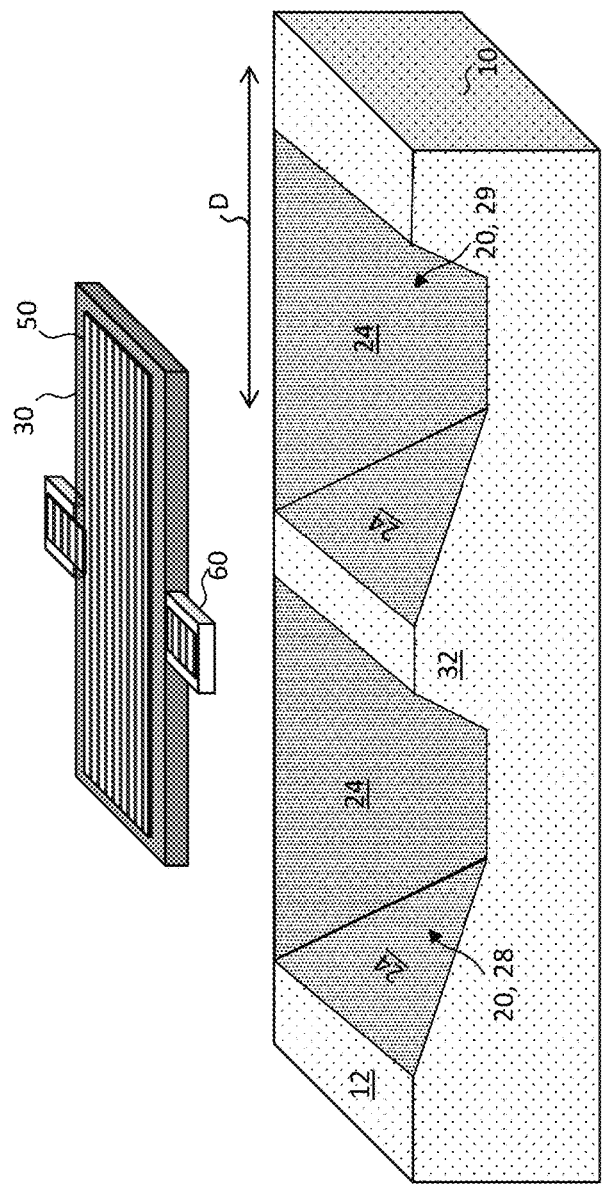
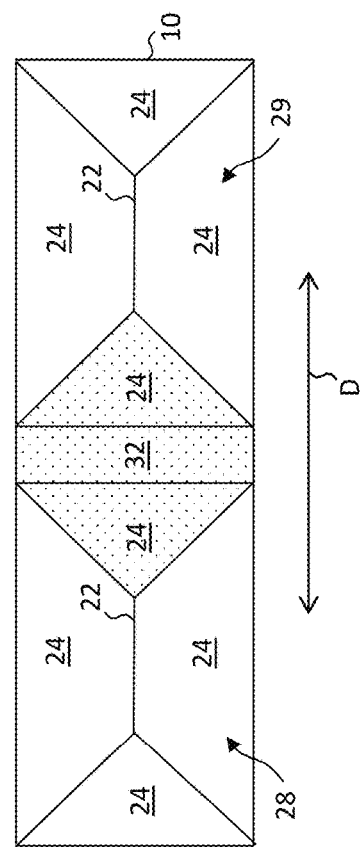
FIG. 27A
FIG. 27B

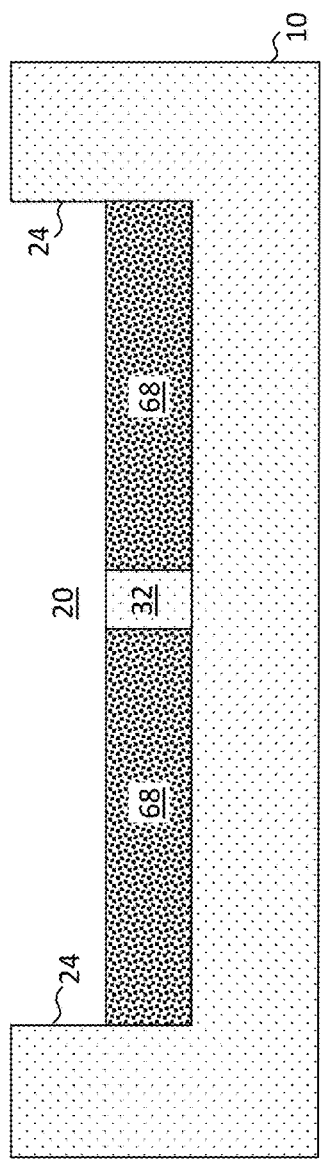
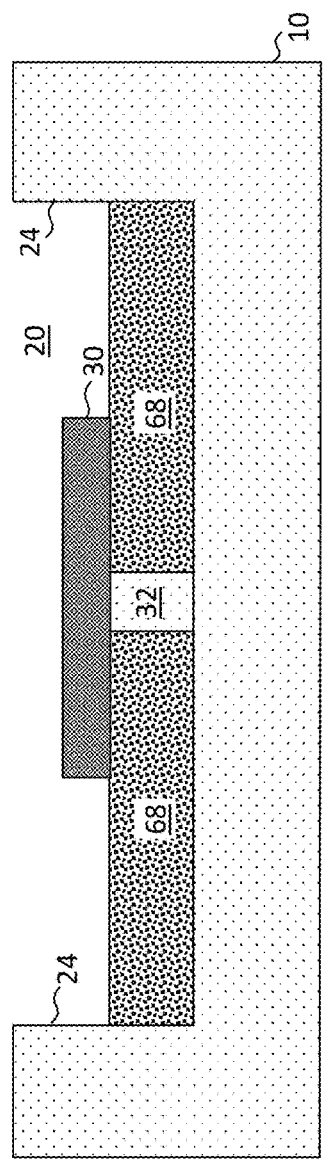
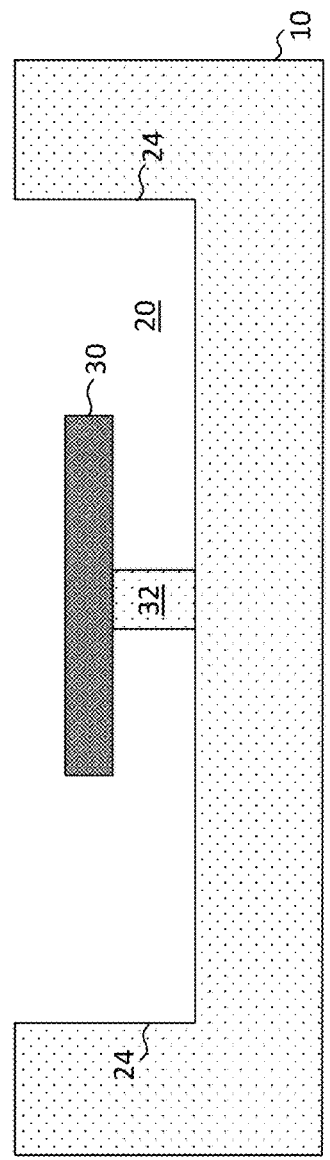
FIG. 38D
FIG. 38E
FIG. 38F

ENCLOSED CAVITY STRUCTURES

PRIORITY APPLICATIONS

This application is a continuation of U.S. patent application Ser. No. 17/027,621, filed Sep. 21, 2020, entitled Enclosed Cavity Structures, by Cok et al., which is a continuation-in-part of U.S. patent application Ser. No. 16/207,804, filed Dec. 3, 2018, entitled Device Structures with Acoustic Wave Transducers and Connection Posts, by Cok, and a continuation-in-part of U.S. patent application Ser. No. 16/842,591, filed Apr. 7, 2020, entitled Overhanging Device Structures and Related Methods of Manufacture, by Gul et al., which claims the benefit of U.S. Provisional Patent Application No. 62/838,262, filed Apr. 24, 2019, and claims the benefit of U.S. Provisional Application 63/020,514, filed May 5, 2020, entitled Cavity Structures, by Cok et al., the disclosure of each of which is hereby incorporated by reference herein in its entirety.

CROSS REFERENCE TO RELATED APPLICATIONS

Reference is made to U.S. patent application Ser. No. 16/207,665, filed Dec. 3, 2018, entitled Printing Components to Substrate Posts, by Gomez et al., to U.S. patent application Ser. No. 16/207,690 filed Dec. 3, 2018, entitled Printed Components on Substrate Posts, by Gomez et al., to U.S. patent application Ser. No. 16/207,738, filed Dec. 3, 2018, entitled Module Structures with Component on Substrate Post, by Rotzoll et al., to U.S. patent application Ser. No. 16/297,427, filed Mar. 8, 2019, entitled Cavity Structures, by Cok et al., to U.S. patent application Ser. No. 16/207,774, filed Dec. 3, 2018, entitled Printing Components Over Substrate Post Edges, by Trindade et al., to U.S. patent application Ser. No. 15/047,250, filed Feb. 18, 2016, entitled Micro-Transfer-Printed Acoustic Wave Filter Device, by Bower et al., and to U.S. patent application Ser. No. 15/639,495, filed Jun. 30, 2017, entitled Transverse Bulk Acoustic Wave Filter, by Bower et al., the contents of each of which are incorporated by reference herein in their entirety.

TECHNICAL FIELD

The present disclosure relates generally to enclosed cavities disposed on or in substrates. In some embodiments, a component, such as a MEMS component, is disposed in the enclosed cavity.

BACKGROUND

Substrates with electronically active components distributed over the extent of the substrate may be used in a variety of electronic systems, for example, in flat-panel display devices such as flat-panel liquid crystal or organic light emitting diode (OLED) displays, in imaging sensors, and in flat-panel solar cells. The electronically active components are typically either assembled on the substrate, for example using individually packaged surface-mount integrated-circuit devices and pick-and-place tools, or by sputtering or spin coating a layer of semiconductor material on the substrate and then photolithographically processing the semiconductor material to form thin-film circuits on the substrate. Individually packaged integrated-circuit devices typically have smaller transistors with higher performance than thin-film circuits but the packages are larger than can be desired for highly integrated micro-systems.

Other methods for transferring active components from one substrate to another are described in U.S. Pat. No. 7,943,491. In an example of these approaches, small integrated circuits are formed on a native semiconductor source wafer. The small unpackaged integrated circuits, or chiplets, are released from the native source wafer by etching a layer formed beneath the circuits. A viscoelastic stamp is pressed against the native source wafer and the process side of the chiplets is adhered to individual stamp posts. The chiplets on the stamp are then pressed against a destination substrate or backplane with the stamp and adhered to the destination substrate. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

Micro-electro-mechanical systems (MEMS) are used for many applications, including processing and controlling electronic and optical signals. Such systems incorporate small mechanical structures made using photolithographic methods and materials and can be integrated into electronic, optical, or electro-optic systems. For example, accelerometers, interferometric modulators, scanners, gyroscopes, piezoelectric energy harvesting, and pressure sensors can be constructed using such techniques. Resonant MEMS devices with electrodes can be used to process signals and produce energy from mechanical manipulation, for example as in acoustic wave filters. Typical designs can have solidly mounted beams or beams that are anchored on one or both ends or sides, for example as discussed in U.S. Pat. Nos. 7,984,648, 8,827,550, 7,990,233, U.S. Patent Application Publication No. 2010/0189444, and PCT Publication No. WO 2011/129855.

There remains an on-going need for structures that are readily constructed with improved performance that are or can be integrated into electronic and micro-electro-mechanical systems.

SUMMARY

The present disclosure provides, inter alia, structures, materials, and methods for providing enclosed cavities in a cavity substrate. One or more functional components can be disposed wholly within the cavity, over the cavity, or partially within the cavity. A cap disposed over the cavity can enclose the cavity. The cap can adhere to a substrate surface of the cavity substrate, to a floor of the cavity in the cavity substrate, or to a destination (target) substrate on which the cavity substrate is disposed. The cap can be planar or can have a non-planar structure such as a tophat structure. The cavity can have substantially planar and relatively orthogonal floor and walls, or the cavity can have a floor or walls at other, non-perpendicular angles, for example constructed by anisotropic etching of etch planes in a crystalline substrate, such as a silicon substrate. A floor of the cavity is the point, line, or area farthest from a substrate surface of the cavity substrate. In some embodiments, components can be disposed on or supported by component supports such as posts or walls extending from the bottom of the cavity (the cavity floor) or supported by component supports attached to cavity walls (cavity sides) of the cavity. Component supports can provide a frame around the components to which the components are attached. Components can be, but are not limited to, integrated circuits, electro-optical devices, or micro-electro-mechanical devices.

In accordance with some embodiments, a component (a device) is formed or disposed on a cavity substrate and a cavity is formed within the cavity substrate and beneath the component (e.g., under the component and between the component and the cavity substrate). A cap can be disposed over the component (e.g., above or on the cavity substrate and at least partially on an opposite side of the component from the cavity substrate). According to some embodiments, the cavity substrate can have a substrate surface and one or more cavity walls, for example first and second cavity walls on opposite sides of the cavity, extending to a cavity floor (e.g., a bottom of the cavity) to form the cavity in the cavity substrate. According to some embodiments, the cavity substrate has a substrate surface, an extended portion of the cavity walls project away from the substrate surface and away from the cavity substrate (e.g., above the substrate surface and away from the cavity floor), and the cavity is at least partially formed above, over, or on the substrate surface. The cavity floor can be rectangular and planar, can be a line, or can be a point. According to some embodiments of the present disclosure, the cavity substrate has a substrate surface and any or all of the cavity walls are non-orthogonal to the substrate surface. In some embodiments, the cavity has a cavity end walls at opposing ends of the cavity and cavity side walls at opposing sides of the cavity and the cavity end walls. In some embodiments, the substrate surface is not parallel to a bottom of the cavity. The cavity floor (cavity bottom), cavity end walls, or cavity side walls are non-orthogonal to the substrate surface and can comprise one or more surfaces corresponding to one or more etch planes of an anisotropically etchable crystals in a crystalline substrate, such as a silicon substrate The component can be supported by a component support attached to the cavity floor, by a component support attached to a wall of the cavity, or by a component support attached to a substrate surface of the cavity substrate. In some embodiments, a component is on or in contact with the component support and extends from the component support into the cavity and at least a portion of the component is separated by a gap from a bottom of the cavity. In some embodiments, a component support extends from the first cavity wall to the second cavity wall to at least partially divide the cavity into two cavity portions and can substantially bisect the cavity. In some embodiments, the component extends from the component support in different directions into both of the two cavity portions. In some embodiments, a component support extends from sides of the component and attach to cavity walls to suspend the component over the cavity.

In accordance with certain embodiments, a method of printing (e.g., micro-transfer printing) comprises providing a component source wafer comprising components, a transfer device, and a cavity substrate. The cavity substrate can comprise a component support that extends from a substrate surface of the cavity substrate, extends from a cavity wall, or extends from a cavity floor of a cavity formed in the cavity substrate. The method can further comprise picking up the components from the component source wafer by adhering the components to the stamp, thereby forming picked-up components, and printing one or more of the picked-up components to the cavity substrate by disposing each of the one or more picked-up components onto a component support to form one or more printed components in a cavity. In some embodiments, each of the picked-up and printed components comprises a broken (e.g., fractured) component tether. The components can be adhered to the component support, for example with van der Waals forces or with an adhesive layer. In some embodiments, the components are affixed to the component support and the component support with the component is transfer printed from a component source wafer to a destination substrate. The destination substrate can comprise a cavity and the component support with the component can be disposed on or over the cavity.

In some embodiments, the transfer device is a stamp, for example comprising a viscoelastic material such as PDMS, a vacuum device, or an electro-static transfer device. According to some embodiments, the transfer device is a stamp comprising a stamp post, one of the picked-up components is disposed on the stamp after being picked up, and the stamp post has a dimension substantially the same as a corresponding dimension of at least one of the posts.

A component can have a component top side and a component bottom side opposite the component top side. The component bottom side can be disposed on the component support and extend over or beyond at least one edge of the component support. The component can comprise a component material different from a component support material.

In some embodiments, the component extends over or beyond an edge, multiple edges, opposing edges, or all of the edges of the component support. In some embodiments, the component is supported by a component support physically connected to an edge of the component, for example connected to an edge partially along a length of the component or connected to an edge partially along a width of the component. In some embodiments, the component is supported at multiple locations by a single component support. In some embodiments, the component is supported at multiple locations by multiple component supports. The multiple locations can be at opposite sides of the component and can be located symmetrically with respect to the component.

Each component can be adhered to a component support. In some embodiments, the component support forms a ridge that extends in one direction beyond one of the one or more components disposed on the component support. More than one component can be disposed (e.g., by transfer printing or by constructing in place) on a single ridge. In some embodiments, the component support is a ridge with a length greater than a width over the cavity substrate or cavity floor and the component support has a component support top side to which the component bottom side is adhered. A component can be disposed on more than one ridge or other component support, such as a post. For each of the components, the component support can be disposed between a center of the component and the substrate surface or cavity floor. In some embodiments, the component support on which a component is placed is not disposed between a center of the component and the substrate surface or cavity floor. In some embodiments, the component extends over at least two, three, or four sides of the component support. The component can extend over opposing sides of the component support. The component can be rectangular, can be plus sign shaped, or can be disc shaped. The component can be adhered or attached to the cavity substrate only by the component bottom side or by structures (e.g., extended cavity walls) physically connected to edges or sides of the component.

A cavity structure can comprise a cavity formed or disposed in or on the cavity substrate. The cavity can have a cavity floor and one or more cavity walls and can contain, enclose, or surround one or more components. In some embodiments, a cavity structure is a printable device, module, or structure (e.g., a micro-transfer printable device, module, or structure) and comprises at least a portion of a structure tether connected to the cavity substrate. A component can be supported by a component support disposed on or in contact with the cavity floor, cavity walls, or substrate surface. In some embodiments, the cavity structure comprises two or more component supports disposed within the cavity. Two or more components can be disposed within the cavity and each component can be supported by a different component support or each component can be supported by the same, common component support. One or more cavity walls can be formed on and extend from the substrate surface, cavity walls, or cavity floor. In some embodiments, a cap is disposed over the cavity. The cavity walls can be formed on the cavity substrate and adhered to the cap with adhesive. The cavity walls can be formed on or as part of the cap and adhered to the cavity substrate or cavity floor with adhesive. Thus, in some embodiments, a cap comprises cavity walls, the cap is adhered to the cavity floor with adhesive, and the cap partially defines a cavity around, enclosing, or surrounding the component. The cap can comprise a broken (e.g., fractured) or separated cap tether. A cap can have, but is not limited to, a substantially planar configuration or a tophat configuration.

The component can have a component top side (or component surface) and a component bottom side (or component surface) and the component support can have a component support top side (or support surface) and a component support bottom side (or support surface). The top sides are opposite a bulk of the cavity substrate and the bottom sides are adjacent to the bulk of the cavity substrate. One or more component support electrodes can be disposed on the component support top side and the one or more component support electrodes can be electrically connected to the component. In some embodiments, the component support is electrically conductive and can be electrically connected to the component. In some embodiments, a cavity structure comprises one or more component top electrodes disposed on the component top side. In some embodiments, a component bottom electrode is disposed on the component bottom side. The component support can have a first end in contact with the first cavity wall and a second end in contact with the second cavity wall. The top electrode can extend along the component support to the first end and the bottom electrode can extend along the component support to the second end. According to some embodiments of the present disclosure, the component top electrode or component bottom electrode is an interdigitated electrode. According to some embodiments of the present disclosure, the component comprises one or more pairs (for example two pairs) of interdigitated top electrodes disposed on the component top side. According to some embodiments of the present disclosure, the component comprises one or more pairs (for example two pairs) of interdigitated bottom electrodes disposed on the component bottom side. In some embodiments, the component is a first component and the cavity structure comprises a second component disposed on or connected to the component support. The one or more component electrodes of each of the two or more components disposed within the cavity can be electrically connected.

In some embodiments, a cavity structure comprises (i) a wire bond electrically connected to at least one of the one or more component top electrodes, (ii) a component support electrode disposed on the component support and comprising a wire bond electrically connected to the component support electrode, or (iii) both (i) and (ii). In some embodiments, electrical connections are made photolithographically and extend along and on a surface, for example a surface of the component support or component. The component support can be electrically conductive or can comprise one or more component support electrodes that are each electrically connected to at least one of the one or more component top electrodes. In some embodiments, a cavity structure comprises one or more component bottom electrodes disposed on the component bottom side. The component support can be a dielectric. The component support can be electrically conductive or can comprise one or more component support electrodes that are each electrically connected to at least one of the one or more component bottom electrodes.

In some embodiments, the component has at least one of a length and a width less than or equal to 200 microns (e.g., less than or equal to 100 microns, less than or equal to 50 microns, less than or equal to 20 microns, less than or equal to 10 microns, or less than or equal to 5 microns). The component material can be, but is not limited to, a semiconductor, an electrical conductor, a dielectric, a piezoelectric material, or any combination thereof. The component can be an electronic or an opto-electronic component and can comprise an electronic circuit. According to some embodiments of the present disclosure, the component comprises a piezoelectric material and is a piezoelectric device. The device can comprise one or more of aluminum nitride, zinc oxide, bismuth ferrite, lead zirconate titanate, lanthanum-doped lead zirconate titanate, potassium niobate ($KNbO_3$), and $(K,Na)NbO_3$. The component can be responsive to or produce at least one of electrical energy, optical energy, electromagnetic energy, and mechanical energy. The component can comprise electrically conductive connection posts. In some embodiments, the cavity substrate is a semiconductor substrate comprising an electronic circuit that can be electrically connected to the component.

According to some embodiments, a cavity structure source wafer comprises a patterned sacrificial layer comprising one or more sacrificial portions each adjacent to one or more anchors, wherein the one or more sacrificial portions are differentially etchable from the cavity structure source wafer and the cavity substrate is disposed at least partially on or over one of the one or more sacrificial portions. The sacrificial portions can comprise a material different from a cavity structure source wafer material. The sacrificial portions can comprise an anisotropically etchable material or a differentially etchable material layer, such as a nitride layer or an oxide layer (e.g., a buried oxide layer). The sacrificial portions can be etched so that a gap exists between the cavity substrate and a surface of the cavity structure source wafer. The cavity structure can comprise a broken (e.g., fractured) or separated structure tether connected to the cavity substrate.

According to some embodiments of the present disclosure, the cavity substrate has a substrate surface and the component is disposed no higher than the substrate surface so that the component is wholly disposed within the cavity beneath the substrate surface and a component top surface of the component opposite the cavity substrate does not extend beyond the substrate surface. According to some embodiments of the present disclosure, the cavity substrate has a substrate surface and the component is disposed at least partially above the substrate surface and the component is not disposed completely within the cavity beneath the substrate surface so that a component top surface of the component opposite the cavity substrate can be disposed higher than the substrate surface and extends beyond the substrate surface. According to some embodiments of the present disclosure, the cavity substrate has a substrate surface the component is disposed in a volume wholly above the substrate surface, and the cavity extends from within the cavity substrate to the volume above the cavity substrate.

In some embodiments, the cavity substrate is patterned to form a patterned substrate and to form the component support, cavity, or both. In some embodiments, the component can be printed (e.g., micro-transfer printed) from a component source wafer to the component support. In some embodiments, the component is formed on the cavity substrate, component support, or both. In some embodiments, the cavity support, cavity, or both, are formed in or on the cavity substrate after the component is disposed on the cavity substrate.

According to some embodiments of the present disclosure, a method of making a cavity structure comprises providing a cavity substrate comprising a substrate surface, disposing a component on the substrate surface, etching the cavity substrate to undercut the component, and disposing a cap over the cavity. The cavity substrate can comprise a material that is anisotropically etchable or a material that is differentially etchable from a bulk of material forming the cavity substrate.

In some embodiments, methods of the present disclosure can comprise disposing a cap over the cavity, laminating a cap over the cavity, or printing (e.g., micro-transfer printing) a cap to dispose the cap over the cavity.

In some embodiments, methods of the present disclosure can comprise providing a cavity structure source wafer comprising a patterned sacrificial layer comprising one or more sacrificial portions each adjacent to one or more anchors, wherein the one or more sacrificial portions are differentially etchable from the cavity structure source wafer and the cavity substrate is disposed at least partially on one of the one or more sacrificial portions. In some embodiments, the sacrificial portions can be anisotropically etchable.

In some embodiments of the present invention, a cavity structure comprises an acoustic wave transducer comprising a component comprising a piezoelectric material, and component electrodes disposed on the component. The component can have a center and a length greater than a width. In some embodiments, the acoustic wave transducer is a surface acoustic wave transducer or filter, or the component is a bulk acoustic wave transducer or filter.

According to embodiments of the present disclosure, inter alia, a cavity structure comprises a cavity substrate comprising a substrate surface and a cavity extending into the cavity substrate. The cavity can have a cavity bottom and cavity walls. A cap is disposed on a side of the cavity opposite the cavity bottom. The cap can be disposed on or over the cavity substrate and the cap is (i) disposed on (e.g., adhered to) the substrate surface, (ii) disposed on (e.g., adhered to) a structure (e.g., extended cavity wall(s) or a component support) disposed on the substrate surface, or (iii) disposed on a destination substrate surface or a layer disposed on the destination substrate surface. The cavity substrate, the cap, and the one or more cavity walls form at least a portion of (e.g., form, as in all of) an enclosed cavity enclosing a volume. For example, if the cavity extends through the cavity substrate and the cavity substrate is disposed on a destination substrate that forms a cavity bottom, then the cavity substrate, the cap, and the one or more cavity walls form a portion of an enclosed cavity enclosing a volume with the destination substrate forming another portion of the enclosed cavity enclosing the volume. In some embodiments, the cavity substrate forms a cavity bottom and the cavity substrate, the cap, and the one or more cavity walls form an enclosed cavity enclosing a volume. In some embodiments, exclusively a cavity substrate, cap, and one or more cavity walls form an enclosed cavity enclosing a volume.

Extended cavity walls can extend from the substrate surface in a direction opposite the cavity bottom. The cap can comprise a portion of the cavity walls. The cap can be adhered to the cavity walls or to the substrate surface. The cavity can have a bottom that is planar, a line, or a point. The cavity walls can be substantially orthogonal to the substrate surface or can be at substantially non-orthogonal to the substrate surface.

The cavity structure can comprise at least a portion of a structure tether physically attached to the cavity substrate. The cap can comprise at least a portion of a cap tether physically attached to the cap.

According to some embodiments, the cavity has a cavity length and a cavity width. The cavity length can be longer than the cavity width. The cap is adhered to the cavity walls or substrate surface within a distance no greater than the cavity length or cavity width, no greater than two times the cavity length or cavity width, no greater than five times the cavity length or cavity width, or no greater than ten times the cavity length or cavity width, or wherein the cap is adhered to the substrate surface closer to the cavity than to a substrate edge of the cavity substrate.

The cap can be a separate structure from the cavity substrate. The cap can have a cap internal side facing the cavity. The cap internal side can be substantially planar or can be non-planar, for example the internal surfaces of a tophat structure.

According to some embodiments, a component is disposed in the cavity. According to some embodiments, a plurality of components is disposed within the cavity. At least a portion of a component tether can be attached to each component. The components can have a component surface on a side of the component opposite the cavity bottom, and the component surface can be substantially in a common plane with or extend above the substrate surface in a direction opposite the cavity bottom. The component can be a piezoelectric component or a micro-electronic-mechanical structure (MEMS) component. The component can be an electrical component or electrical transducer and the cavity structure can comprise one or more component electrodes disposed on one or more of the cavity substrate, the one or more cavity walls, and the cap. The one or more component electrodes can extend from inside the cavity to outside the cavity for example between the cap and substrate surface or on the substrate surface. The cap can comprise a contact portion in contact with the cavity walls, cavity bottom, or substrate surface, a cap wall portion extending away from the contact portion and substrate surface, and a top portion on and in contact with the cap wall portion.

According to embodiments, the cavity walls are at a non-perpendicular angle to the substrate surface. The cavity bottom can substantially form a line or a point. The cavity substrate can comprise silicon, for example silicon 100 or silicon 111.

In some embodiments, the cavity forms a volume and the volume is under a vacuum or partial vacuum, the volume comprises or contains an added gas, or the volume contains a liquid. The volume can contain air or an inert gas.

In some embodiments, the cavity structure comprises an adhesive layer disposed in contact with the cavity walls or the substrate surface. The adhesive layer can be patterned. The adhesive layer can be unpatterned. The adhesive layer can adhere a portion of the cap to the one or more cavity walls. The adhesive layer can adhere a portion of the cap to the cavity substrate.

In some embodiments, the cavity structure comprises an encapsulation layer disposed over the cap, the cavity walls, and at least a portion of the cavity substrate that encapsulates the cavity, the cap, and the cavity walls. The encapsulation layer can form a portion of a cavity structure tether. The cavity substrate can comprise an anisotropically etchable material or is a material that is differentially etchable from the component. The cavity substrate can have a substrate area, the cap can have a cap area, and the cap area can be less than the substrate area.

In some embodiments, the cavity structure comprises a destination substrate and at least one cavity structure is adhered to the destination substrate. The destination substrate can be a semiconductor substrate comprising a circuit electrically or optically connected to the component. The cavity structure can comprise a broken or separated tether.

According to some embodiments, a cavity structure source wafer comprises a source wafer comprising a sacrificial layer having sacrificial portions laterally spaced apart by anchors and a plurality of cavity structures each disposed entirely and directly over a corresponding one of the sacrificial portions. Each of the cavity substrates can be physically attached to the source wafer by a structure tether. The sacrificial portions comprise a sacrificial material that is an anisotropically etchable material or is a material that is differentially etchable from the cavity substrate. The sacrificial portions each can be a gap between the cavity structure and the source wafer.

According to some embodiments, a cavity structure comprises a cavity substrate comprising cavity walls enclosing the sides of a cavity, a component disposed in the cavity and physically connected to the cavity walls with component tethers, and at least a portion of a structure tether physically connected to the cavity substrate or a layer disposed on the cavity substrate. The cavity can have no top and no bottom in the cavity substrate. A destination substrate can provide a cavity bottom and a cap can provide a cavity top.

According to some embodiments, a cavity structure system comprises a destination substrate and one or more cavity structures disposed on the destination substrate. The cavity structure can comprise a component electrically connected to component electrodes. The destination substrate can comprise a destination substrate pit, hole, indentation, or cavity extending into the destination substrate. The cavity structure can be disposed over the destination substrate pit, hole, indentation, or cavity. The cavity can extend through the cavity substrate. In some embodiments, the destination substrate provides a portion of the cavity and the cavity is partially in the destination substrate. The cap can have a planar interior surface or can have a tophat configuration comprising (i) a cap contact portion in contact with the cavity wall, cavity substrate, substrate surface, or the destination substrate or a layer disposed on the destination substrate, (ii) a cap wall portion in contact with and extending away from cap contact portion and away from the cavity substrate, and (iii) a cap top portion on and in contact with the cap wall portion. The destination substrate can comprise destination substrate electrical connections disposed on the destination substrate electrically connected to the component electrodes.

According to embodiments of the present disclosure, a cavity structure comprises a substrate comprising a substrate surface and a cap disposed on the substrate surface. The cap comprises (i) a cap contact portion in contact with the substrate, (ii) a cap wall portion in contact with and extending away from cap contact portion and away from the substrate surface, and (iii) a cap top portion on and in contact with the cap wall portion, the cap enclosing a volume between the cap and the substrate. The substrate can comprise a cavity disposed between the cap and the substrate and forming a portion of the volume. A component can be disposed within the volume.

Certain embodiments of the present disclosure provide MEMS structures that are readily manufactured in widely available materials and directly integrated into electronics systems. Embodiments of the present disclosure comprise structures that are integrated into electronic and micro-electro-mechanical systems and that are readily constructed with improved performance. Certain embodiments of the present disclosure disclose methods, structures, and materials for a micro-transfer printable cavity structure. Such cavity structures can be very small, highly integrated, and provide mechanical isolation between cavity structures within the cavity, freedom for a component to move within the cavity without contacting a substrate above or below the component, and structures and materials external to the cavity.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 1, 2A-2D, and 3A-3B are cross sections according to illustrative embodiments of the present disclosure;

FIG. 5A is a cross section taken along cross section line A of FIG. 4A comprising a tophat cap according to illustrative embodiments of the present disclosure;

FIG. 5B is a cross section taken along cross section line B of FIG. 4A comprising a tophat cap according to illustrative embodiments of the present disclosure;

FIGS. 7A-7L2 are successive cross sections or perspectives of structures according to illustrative embodiments of the present disclosure;

FIGS. 9A-9K are successive cross sections of structures according to illustrative embodiments of the present disclosure;

FIGS. 11A-11H are successive cross sections of structures according to illustrative embodiments of the present disclosure;

FIGS. 13A-13F are successive cross sections of structures according to illustrative embodiments of the present disclosure;

FIGS. 15A-15G are successive cross sections of structures according to illustrative embodiments of the present disclosure;

FIGS. 17A-17E are successive cross sections of according to illustrative embodiments of the present disclosure;

FIG. 20A is a cross section of a component within a cavity with a planar cap according to illustrative embodiments of the present disclosure;

FIG. 20B is a cross section comprising a component and a tophat cap and including a destination substrate according to illustrative embodiments of the present disclosure;

FIG. 27A is an exploded cut-away perspective according to illustrative embodiments of the present disclosure;

FIG. 27B is a partial top view of the structure of FIG. 27A excluding the device and showing etch planes for an anisotropically etchable crystalline substrate according to illustrative embodiments of the present disclosure;

FIGS. 38A-38F are successive cross-sections of structures constructed according to illustrative embodiments of the present disclosure;

Figure 1:
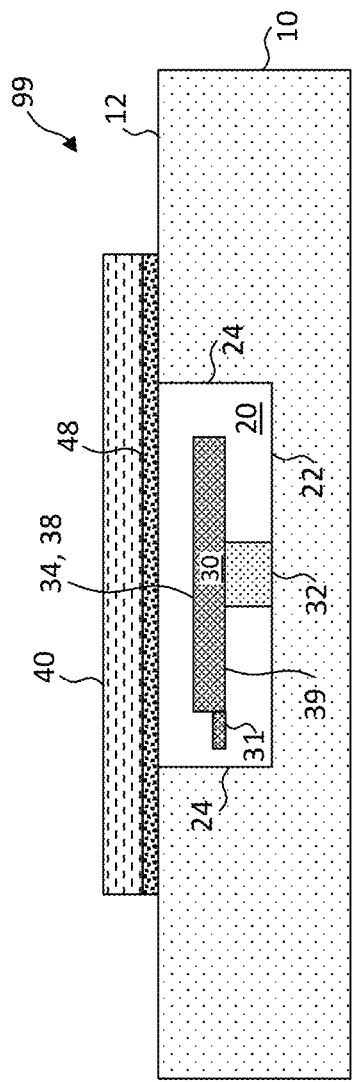

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not necessarily drawn to scale.

DETAILED DESCRIPTION OF CERTAIN EMBODIMENTS

Certain embodiments of the present disclosure are directed toward, inter alia, structures and methods of printing (e.g., micro-transfer printing) arrays of cavity structures (structures incorporating cavities) from a cavity structure source wafer (a cavity substrate) to a destination substrate (a target substrate) using a transfer device (e.g., a stamp). In some embodiments, a cavity is formed in a substrate (e.g., a destination or cavity substrate) and structures are provided (e.g., by micro-transfer printing) over the cavity to form a cavity structure. Cavity structures can comprise one or more components enclosed in a cavity and covered with a cap. In some embodiments, each cavity structure is transferred from the cavity substrate to the destination substrate or a cavity formed in the destination substrate and then enclosed with the cap on the destination substrate. In some embodiments, an entire enclosed cavity structure with the component enclosed by a cap can be micro-transfer printed to the destination substrate. Suitable enclosed components can be micro-electro-mechanical system (MEMS) components such as acoustic resonators or other (e.g., electrically operated) components that require or benefit from mechanical motion in an enclosed volume of space.

According to some embodiments of the present disclosure and as illustrated in FIG. 1, cavity structure 99 comprises a cavity substrate 10 comprising a substrate surface 12. A cavity 20 having a cavity floor 22 (a bottom of cavity 20) and one or more cavity walls 24 extends into cavity substrate 10 away from substrate surface 12 of cavity substrate 10. A cap 40 is disposed on a side of cavity 20 opposite cavity floor 22 into which cavity 20 extends (e.g., a top of cavity 20 or substrate surface 12). Cap 40 can be adhered to substrate surface 12 with a layer of adhesive 48, for example disposed on an interior surface of cap 40 or on substrate surface 12. An interior surface of cap 40 is that portion or side of cap 40 that faces toward cavity 20 or substrate surface 12. An exterior surface of cap 40 is that portion or side of cap 40 opposite the interior surface and that faces away from cavity 20 or substrate surface 12. Cavity floor 22, cap 40, and one or more cavity walls 24 form enclosed cavity 20 that encloses a volume. Cavity substrate 10 can be any suitable substrate, for example a dielectric or semiconductor substrate and can comprise one or more particular layers, for example oxide, nitride, or seed layer(s). Cap 40 can, for example, comprise dielectric materials or metals and can have coatings on either a top (exterior) side or a bottom (interior) side of cap 40. According to some embodiments, a component 30 (or multiple components 30) is disposed in cavity 20. In some embodiments, component 30 comprises a component tether 31 as a consequence of micro-transfer printing component 30 (e.g., into cavity 20 before enclosing with cap 40 and, optionally, cavity walls 24). In some embodiments, component 30 does not comprise a component tether 31 and can be constructed or formed in place.

According to some embodiments, an opening of cavity 20 in cavity substrate 10 has the same area as cavity floor 22, for example the opening in substrate surface 12 for cavity 20 has the same area as cavity floor 22.

Figure 2A:
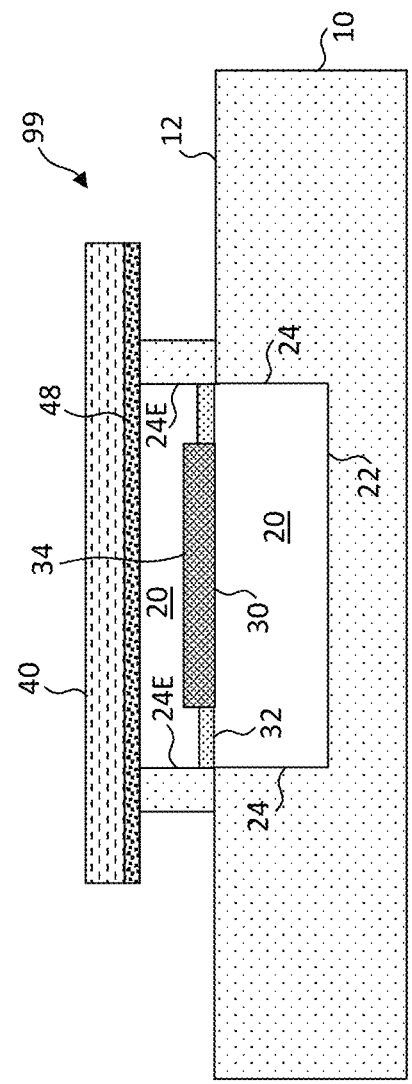

Component 30 can be supported by a component support 32 (e.g., post) in a variety of configurations, for example supported by component support 32 extending from cavity floor 22 (e.g., a post 32 extending from cavity bottom 22) as in FIG. 1 or supported by component support 32 extending from cavity wall 24 (a side or edge of cavity 20) as in FIG. 2A. According to some embodiments and as shown in FIG. 1, component surface 34 of component top side 38 of component 30 on a side of cavity 20 opposite cavity floor 22 and adjacent to cap 40 does not extend above substrate surface 12 but is rather disposed completely in cavity 20 within cavity substrate 10 between cavity floor 22 and substrate surface 12 (or a plane partially defined by substrate surface 12). Component bottom side 39 can be adjacent to component floor 22. According to some embodiments and as shown in FIG. 2A, component surface 34 of component 30 extends above substrate surface 12 in cavity 20.

Figure 2B:
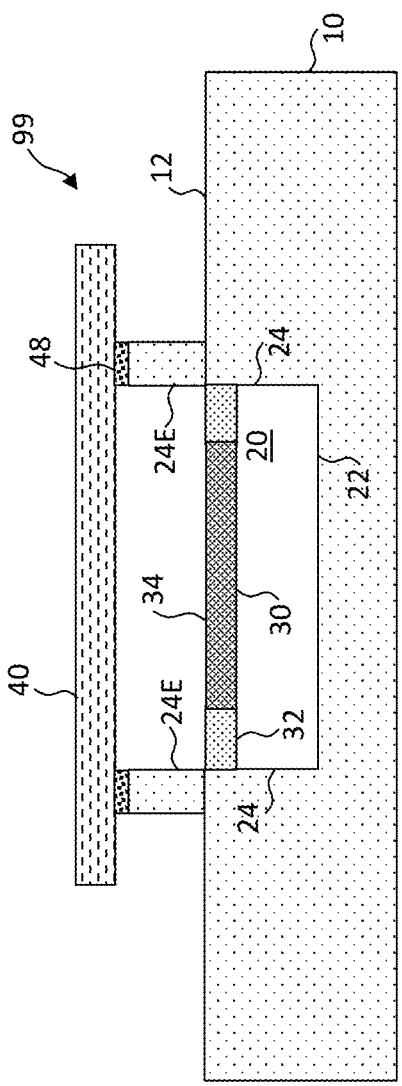
Figure 2C:
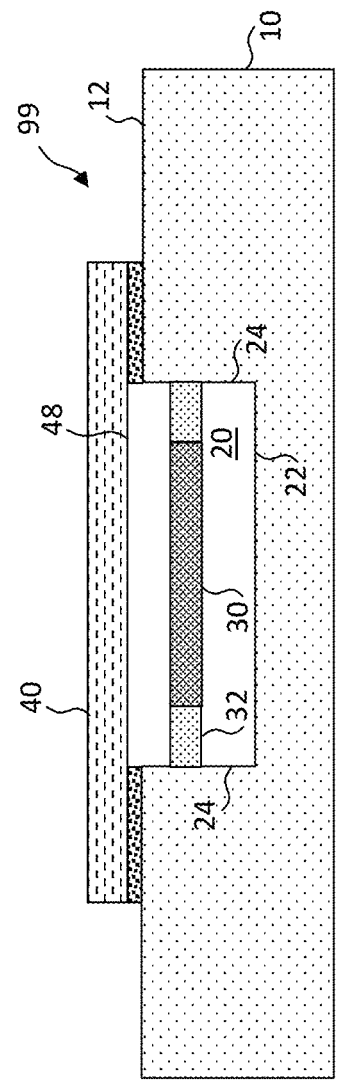

According to some embodiments of the present disclosure and as illustrated in FIGS. 2A and 2B, extended cavity walls 24E can extend from substrate surface 12 in a direction away from cavity substrate 10 and away from cavity floor 22. In some such embodiments, cavity 20 is partially defined by cavity wall(s) 24 in cavity substrate 10 and partially defined by extended cavity walls 24E that extend above substrate surface 12 of cavity substrate 10. (Cavity wall(s) 24 in cavity substrate 10 and extended cavity wall(s) 24E that extend above cavity substrate 10 are generically referred to collectively as cavity wall(s) 24.) Extended cavity walls 24E can be photolithographically constructed, for example constructed of patterned dielectric materials such as silicon dioxide or silicon nitride, or of patterned and cured organic materials such as resins, epoxies, or polyimides, or of semiconductor materials. At least a portion of cap 40 can be adhered to extended cavity walls 24E, for example with an adhesive 48, for example as shown in FIGS. 2A and 2B. Adhesive 48 can be unpatterned, for example disposed in a layer on cap 40 (e.g., as shown in FIG. 2A), or patterned, for example on extended cavity walls 24E (e.g., as shown in FIG. 2B), or patterned on substrate surface 12 or cap 40 (e.g., as shown in FIG. 2C). A suitable adhesive 48 can be a resin, an epoxy, or other polymer or a low-temperature metal composition, such as a solder, that can be cured or heated and cooled to adhere cap 40 to substrate surface 12 (or extended cavity walls 24E) and seal (for example hermetically seal) cavity 20. In some embodiments, cavity 20 is enclosed, but not completely environmentally sealed (e.g., having one or more small holes in one or more cavity walls 24 or cap 40).

Figure 2D:
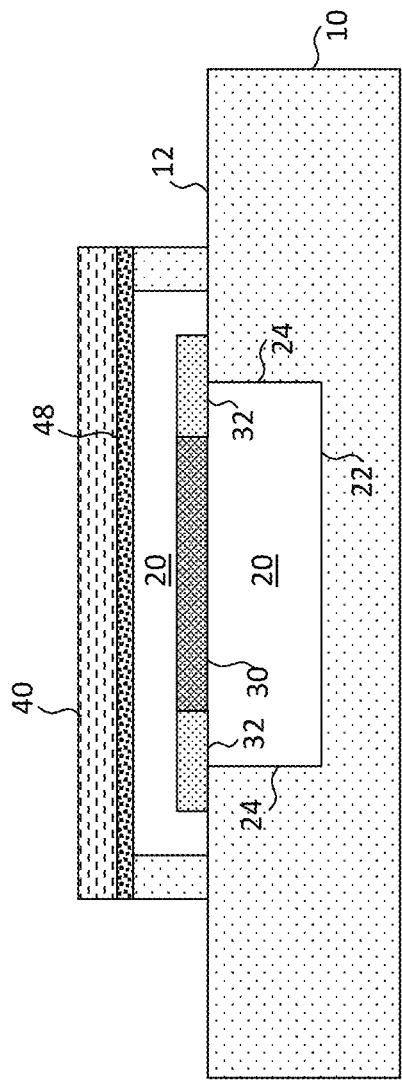

Component 30 can be disposed in cavity 20 with component support 32 in a variety of configurations. As shown in FIG. 1, component 30 having component top side 38 with component surface 34 and component bottom side 39 is disposed on component support 32 (e.g., post 32) entirely within cavity substrate 10 with component support 32 extending from cavity floor 22 to component 30. According to some embodiments and as shown in FIG. 2A, component support 32 extends from sides or edges of component 30 to attach component 30 to extended cavity walls 24E. In FIG. 2A, component surface 34 extends above substrate surface 12 (e.g., above a plane partially defined by substrate surface 12) and is not disposed completely within cavity substrate 10. In FIG. 2B, component surface 34 and component support 32 are in a common plane with substrate surface 12 and component support 32 can contact cavity walls 24. In FIG. 2C, component surface 34 and component support 32 are beneath substrate surface 12 and component support 32 contacts cavity walls 24. In FIG. 2D, component support 32 is adhered to substrate surface 12 and component 30 is disposed over substrate surface 12 in cavity 20. In the embodiments of FIGS. 2A and 2B, extended cavity walls 24E prevent component 30 from contacting cap 40. In FIGS. 1 and 2C, component surface 34 is below substrate surface 12 and component 30 is within cavity substrate 10 so extended cavity walls 24E are not necessary to prevent component 30 from contacting cap 40.

According to some embodiments of the present disclosure and as shown in FIGS. 2A-2D, component 30 is supported by component support 32 extending over substrate surface 12 or in contact with extended cavity walls 24E. As shown, component support 32 does not contact cavity floor 22 or component bottom side 39 so that the entire length of component 30 is suspended within enclosed cavity 20. In some embodiments, for example in accordance with FIG. 1, component support 32 does contact cavity floor 22 and component bottom side 39 so that some portions of component 30 are suspended within cavity 20 and at least one portion of component 30 is supported on but not suspended over cavity floor 22.

According to some embodiments of the present disclosure and as illustrated in FIGS. 3A and 3B, enclosed cavity 20 does not have a cavity floor 22 formed by cavity substrate 10, but rather a portion of destination substrate 80 forms cavity floor 22. In some embodiments and as shown in FIG. 3A, cavity walls 24E are disposed on a top surface of cavity substrate 10, which is itself disposed on destination substrate 80 that serves as cavity floor 22. In some such embodiments, cavity 20 extends all of the way through cavity substrate 10 and cavity substrate 10 forms a bottom-less frame around component 30. Accordingly, in some embodiments, cavity wall(s) 24 can include non-native cavity walls 24E disposed (e.g., deposited or printed) onto cavity substrate 10 that itself has cavity wall(s) 24 aligned with cavity wall(s) 24E. As shown in FIG. 3B, in some embodiments, destination substrate 80 can comprise at least a portion of cavity 20 with cavity floor 22.

Figure 4A:
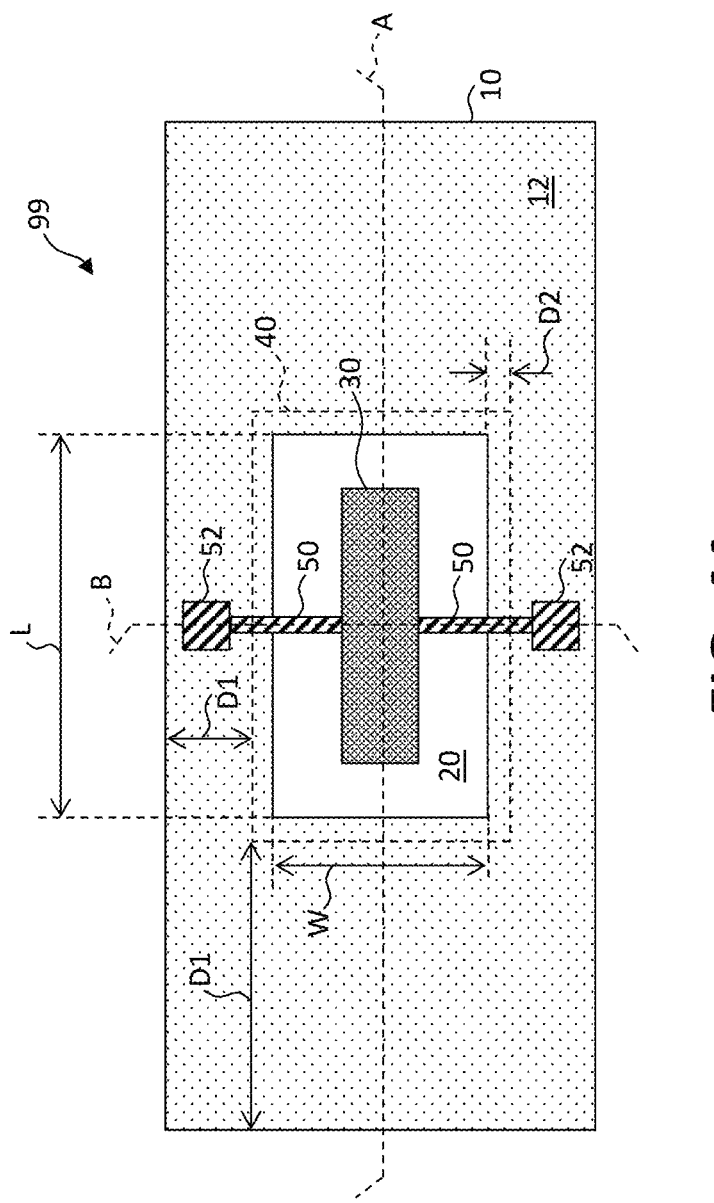
FIG. 4A is a plan view showing cross section lines A and B according to illustrative embodiments of the present disclosure.
Figure 4B:
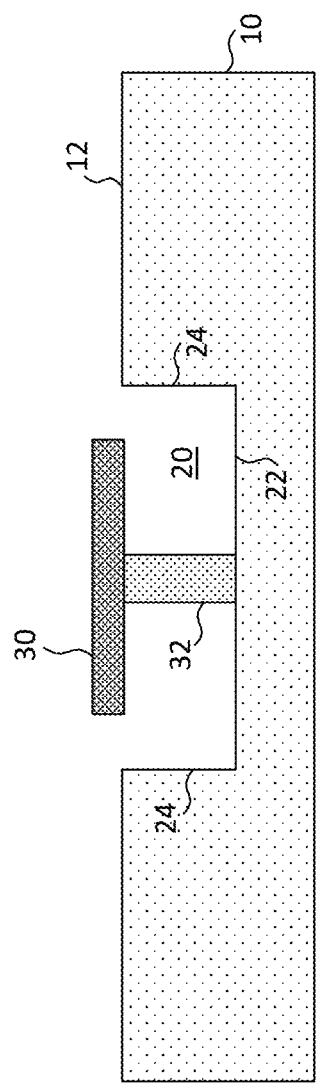
FIG. 4B is a cross section taken along cross section line A of FIG. 4A according to illustrative embodiments of the present disclosure.
Figure 4C:
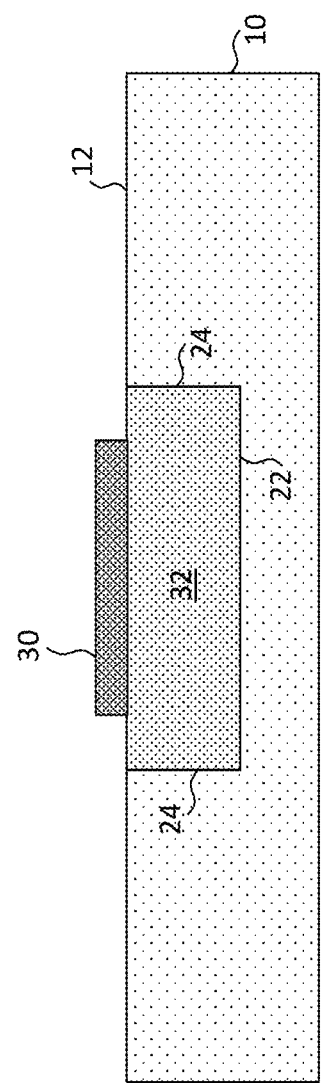
FIG. 4C is a cross section taken along cross section line B of FIG. 4A according to illustrative embodiments of the present disclosure.

As illustrated, for example, in FIGS. 2A-3B, component support 32 can extend from cavity walls 24 to component 30. FIGS. 4A, 4B, and 4C illustrate cavity structures 99 (with cap 40 indicated by dashed lines or omitted for clarity) disposed on a component support 32 that extends from cavity floor 22, as also shown in FIG. 1. FIG. 4A is a plan view of component 30 suspended over at least a portion of cavity 20. FIG. 4B is a cross section taken along cross section line A of FIG. 4A and illustrates component support 32 (e.g., post 32) extending from a central portion of component 30 to cavity floor 22. FIG. 4C is a cross section taken along cross section line B of FIG. 4A and illustrates component support 32 extending along the central portion of component 30 from opposing cavity walls 24 to cavity floor 22 so that the ends of component 30 are suspended over corresponding ends of cavity 20 and the central portion of component 30 is supported by component support 32 and cavity floor 22. In FIGS. 4A, 4B, and 4C, component 30 is illustrated as disposed above substrate surface 12 but could be disposed within cavity substrate 10 beneath substrate surface 12, as also shown in FIG. 1. Component 30 can be an electrical device (e.g., an integrated circuit) or an electrical transducer (e.g., an acoustic wave filter). Cavity structure 99 can comprise one or more component electrodes 50 electrically connected to or disposed on component 30, for example as illustrated in FIG. 4A but omitted elsewhere for clarity. Component electrodes 50 can be disposed on, over, or under one or more of component 30, cavity substrate 10, cavity walls 24, and cap 40 and can extend along component support 32 and outside cavity 20, for example beneath cap 40 or extended cavity walls 24E, to component contact pads 52 to provide external electrical access to component 30, for example to provide power to operate component 30 (e.g., that is transduced through component 30). For clarity, component electrodes 50 are omitted or shown only on component top side 38 of component 30, but generally can be on either or both sides of component 30, can substantially cover a side, or can be interdigitated on a same side, for example as discussed in U.S. patent application Ser. No. 16/842,591 referenced above.

Cavity Structures with "Tophat" Caps

In some embodiments and as illustrated in FIGS. 1-3B, cap 40 has a planar interior surface facing cavity 20, adhered to either substrate surface 12 (e.g., as in FIGS. 1 and 2C) or extended cavity walls 24E (e.g., as in FIGS. 2A, 2B, 2D, 3A, and 3B). In some embodiments of the present disclosure and as shown in the orthogonal cross sections of FIGS. 5A and 5B (corresponding to cross section lines A and B of FIG. 4A, respectively), the exterior perspective of FIG. 5C, the interior perspective of FIG. 5E, and the cross sections of FIGS. 5D and 5F, cap 40 is not planar and has a tophat configuration with (i) a cap contact portion 42 in contact with cavity walls 24, substrate surface 12, or a destination substrate 80, (ii) a cap wall portion 44 extending away from cap contact portion 42 (and away from substrate surface 12 and cavity substrate 10 when cap 40 is disposed (e.g., adhered to), for example, on cavity substrate 10) with cap wall portion 44 forming extended cavity walls 24E, and (iii) a cap top portion 46 on and in contact with cap wall portion 44. Cap contact portion 42 can extend away from call wall portion 44 in a direction orthogonal to a direction in which cap wall portion 44 extends, so that cap wall portion 44 and cap contact portion 42 together form an 1' shape (a right angle) for both the interior and the exterior of tophat cap 40. Likewise, cap contact portion 42 can extend away from cap top portion 46 in a direction orthogonal to a direction in which cap wall portion 44 extends, so that cap wall portion 44 and cap top portion 46 together form an 'L' shape (a right angle) for both the interior and the exterior of tophat cap 40. In some embodiments, both the interior and the exterior surfaces of a tophat cap 40 cross section has four right angles. Cap top portion 46 and cap contact portion 42 can have a common thickness. The descriptive term "tophat" is used because of the similarity between the non-planar cap 40 and a traditional top hat, but is not limiting as to, for example, particular angles between or dimension of portions of a tophat cap 40. For example, a tophat cap 40 can resemble a portion (e.g., multiple sides) of a trapezoidal or other quadrilateral perimeter.

Figure 5C:
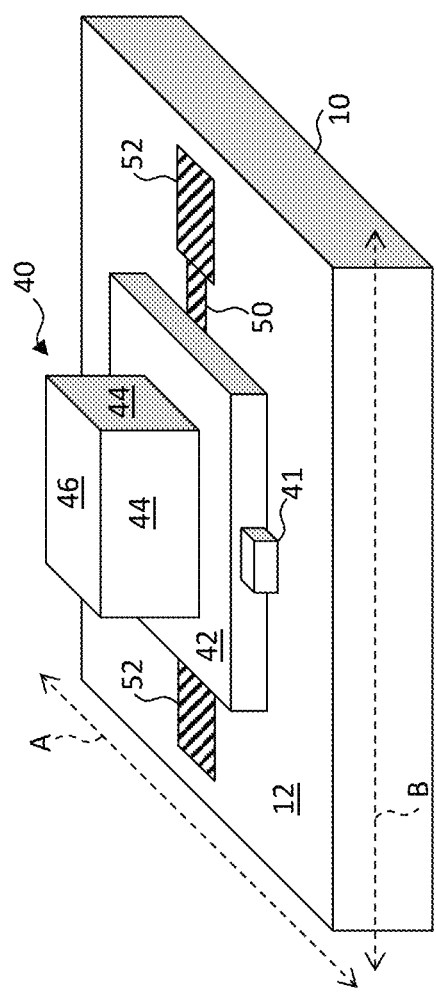
FIG. 5C is an exterior perspective comprising a tophat cap corresponding to FIGS. 5A-5B according to illustrative embodiments of the present disclosure.

Cap wall portion 44 can be equivalent to, provide, or comprise extended cavity wall 24E. Cap contact portion 42 can be adhered to substrate surface 12 (or a layer disposed on substrate surface 12), for example as shown in FIGS. 5A-5D, adhered to extended cap wall 24E (not shown), or adhered to destination substrate 80, for example as illustrated in FIG. 5F, for example with an organic adhesive 48 such as a curable resin or an inorganic adhesive 48, such as a solder. Destination substrate 80, if present, can comprise a cavity, pit, indentation, or hole defining cavity floor 22 below component 30 to further ensure that component 30 does not physically interact with cavity floor 22 (e.g., strike, e.g., while resonating), for example as shown in FIGS. 5F and 3B. FIGS. 5A-5D also illustrate component electrodes 50 on top and bottom sides of component 30 (component top electrode 54 and component bottom electrode 56, respectively, and collectively component electrodes 50) and disposed on cavity substrate 10 that extend from inside enclosed cavity 20 to outside cavity 20 to provide electrical access to component 30, as shown in FIG. 5B.

In some embodiments, component 30 has a component surface 34 on a side of component 30 opposite cavity floor 22 so that component 30 is between component surface 34 and cavity floor 22. Component surface 34 can be substantially in a common plane with substrate surface 12 (shown, for example in FIGS. 2B and 5E), extend above substrate surface 12 (illustrated in FIGS. 2A, 3A, 3B, and 4A-5D and 5F, for example), or disposed entirely below substrate surface 12 (for example, as shown in FIGS. 1 and 2C). Where component surface 34 is not disposed entirely below substrate surface 12, cap 40 can have a tophat configuration and cap top portion 46 can be disposed a separation distance S above component 30 (e.g., above component surface 34), so that component 30 does not strike cap 40. As shown in FIG. 5A, in some embodiments, component 30 or component surface 34 is not in contact with cap 40 by a separation distance S equal to or less than a height of cap wall portion 44 (which can be equivalent to a height of extended cavity wall 24E). For example, a MEMS component 30 originally constructed on or in substrate surface 12 (e.g., and subsequently released by an undercutting etch) can be free to move, is not adhered to, is not in contact with or strike, or does not experience stiction with a non-planar cap 40 disposed over component 30.

According to some embodiments of the present disclosure and as shown in FIGS. 4A, 5A, and 5B, cavity 20 has a cavity length L and a cavity width W, and cap 40 is adhered to extended cavity walls 24E, substrate surface 12, cavity substrate 10, or destination substrate 80 within a distance D2 of cavity 20 no greater than the cavity length L or cavity width W, no greater than two times the cavity length L or cavity width W, no greater than five times the cavity length L or cavity width W, or no greater than ten times the cavity length L or cavity width W. Cavity length L can be greater than cavity width W. As shown in FIG. 5A, in some embodiments, cap 40 is adhered to substrate surface 12 or destination substrate 80 a distance D2 closer to cavity walls 24 in substrate 10 than a distance D1 to a substrate edge 11 of cavity substrate 10 or destination substrate 80. Thus, cap 40 can be adhered closer to cavity 20 than a cover, lid, or top would be if mounted on a perimeter of cavity substrate 10 or destination substrate 80 and can be a separate structure from cavity substrate 10 or a mounted cover, lid, or top. A cap 40 with a smaller area over cavity 20 than a cover, lid, or top mounted over the edges of cavity substrate 10 or destination substrate 80 has a smaller adhesion area and is therefore less likely to fail, as well as reducing the overall size of cavity structure 99. In some embodiments, cavity substrate 10 has a substrate area, cap 40 has a cap area over cavity substrate 10 (e.g., the area encompassed by a perimeter of cap 40 or cap contact portion 42 over cavity substrate 10), and the cap area is less than the substrate area.

According to some embodiments, component 30 is a transfer printed (e.g., micro-transfer printed or printable) component 30 with a component tether 31, for example as shown in FIG. 1. Component 30 can be transfer printed from a component source wafer onto or into substrate surface 12, component support 32, or cavity substrate 10. Component 30 can include component tether 31 that is broken (e.g., fractured) or separated as a consequence of micro-transfer printing. Similarly, cap 40 can have a cap tether 41 and can be transfer printed (e.g., micro-transfer printed) from a cap source wafer to substrate surface 12, for example as shown in FIGS. 5A-5D and 5F. Cap tether 41 can be broken (e.g., fractured) or separated from a cap source wafer as a consequence of micro-transfer printing. In such embodiments, cap 40 is non-native to cavity substrate 10. In some embodiments, component 30 is formed or constructed in place and is therefore not transfer printed; in such embodiments, no component tether 31 is present.

In some embodiments of the present disclosure, cavity 20 has a planar cavity floor 22 that meets cavity walls 24 at substantially ninety degrees (e.g., within 10, 5, 3 or 1 degree or within the limitations of the materials and manufacturing processes used.) Such cavities 20 can be constructed by disposing a patterned sacrificial layer (for example an oxide layer such as a buried oxide ("BO$_x$") layer, for example comprising silicon dioxide, or a silicon nitride layer) on cavity substrate 10, constructing cavity walls 24 on cavity substrate 10 adjacent to and in contact with (but not on) the patterned sacrificial layer, forming (with or without a seed layer) or disposing component 30 on the sacrificial layer, and then etching the patterned sacrificial layer to release component 30 from cavity substrate 10, leaving component 30 attached to an anchor by a component tether 31. In some embodiments, component 30 and cavity walls 24 are differentially etchable from the patterned sacrificial layer so that releasing component 30 by etching does not unduly deleteriously impact component 30 or cavity walls 24.

Figure 6A:
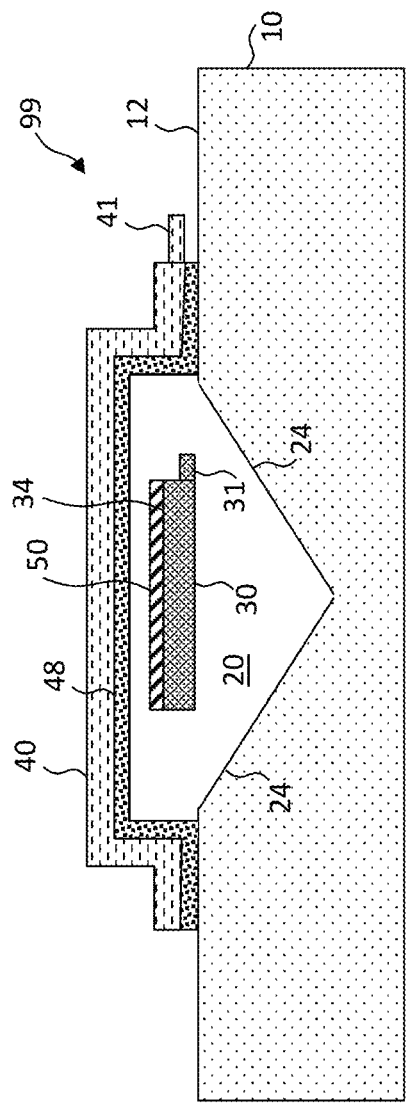
FIG. 6A is a cross section of a cavity structure with angled cavity walls or cavity floor according to illustrative embodiments of the present disclosure.
Figure 6B:
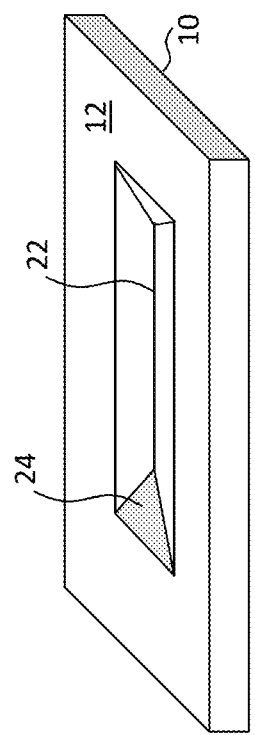
FIG. 6B is a perspective of a cavity substrate with angled cavity walls or cavity floor according to illustrative embodiments of the present disclosure.

According to some embodiments of the present disclosure, a protective layer is disposed on cavity substrate 10 and component 30 is disposed on the protective layer. The protective layer can be differentially etchable from cavity substrate 10 or a patterned sacrificial layer disposed on cavity substrate 10. For example, where cavity substrate 10 comprises a semiconductor material such as silicon or a compound semiconductor material, a protective layer can comprise a silicon oxide or silicon nitride. When the sacrificial layer is etched to release component 30, the protective layer and component 30 are not. In some embodiments, cavity substrate 10 is anisotropically etchable, for example comprising crystalline silicon, with slow and fast etch planes. Such planes are typically not parallel to substrate surface 12, and can be intentionally made so by selecting a silicon substrate with appropriate crystallographic orientation, and are therefore, at a non-perpendicular angle to cavity walls 24. Such a cavity 20 (e.g., as shown in FIGS. 6A and 6B) can be constructed using a silicon cavity substrate 10 and anisotropically etching cavity 20 in cavity substrate 10 where cavity substrate 10 is differentially etchable from component 30, differentially etchable from a bottom layer of component 30, differentially etchable from a protective layer between component 30 and the sacrificial layer (not shown in FIG. 6A), or differentially etchable from a combination thereof. In some such embodiments, cavity floor 22 can form a point or a line and cavity walls 24 can form angled edges that meet at the point, for example as an inverted pyramid, or line, for example as an inverted pyramid with an extended peak and forming cavity floor 22 as shown in FIG. 6B. For example, a line can be formed by coincident nonparallel etch planes.

In some embodiments in which cavity walls 24 are not orthogonal to substrate surface 12, the opening of cavity 20 in cavity substrate 10 (e.g., the area of cavity 20 coincident with the plane of substrate surface 12) can be equal to the area of cavity floor 22 in combination with the area of cavity walls 24 (e.g., in cavity substrate 10) parallel to substrate surface 12.

Figure 7A:
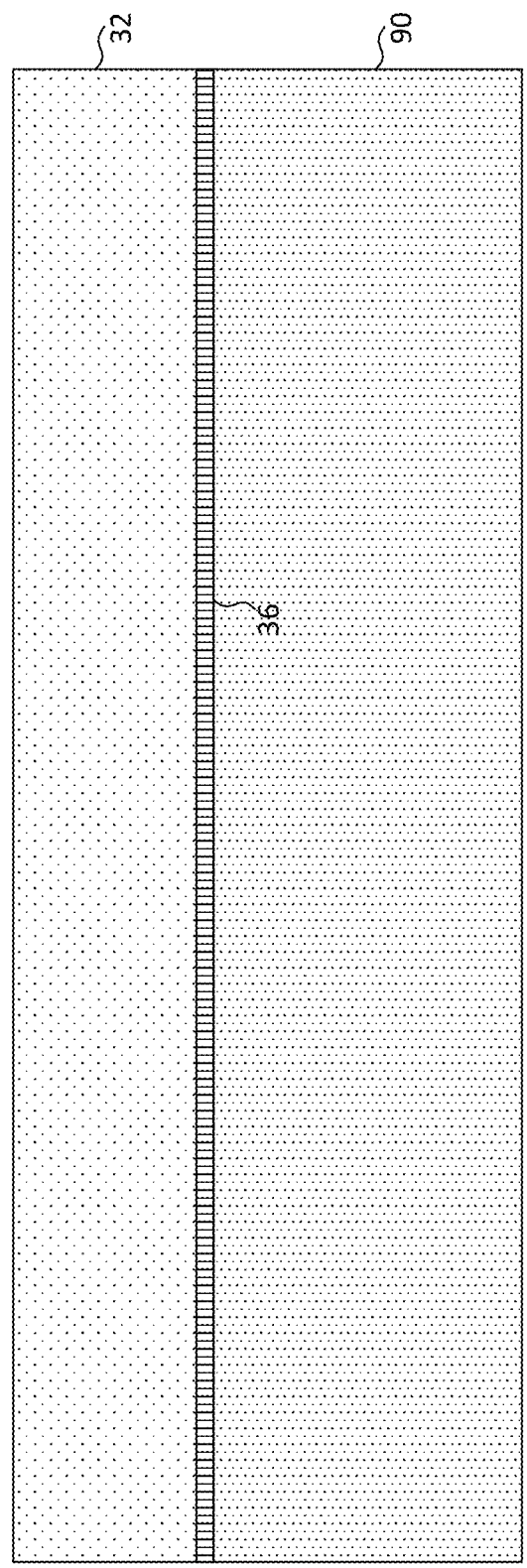
Figure 7B:
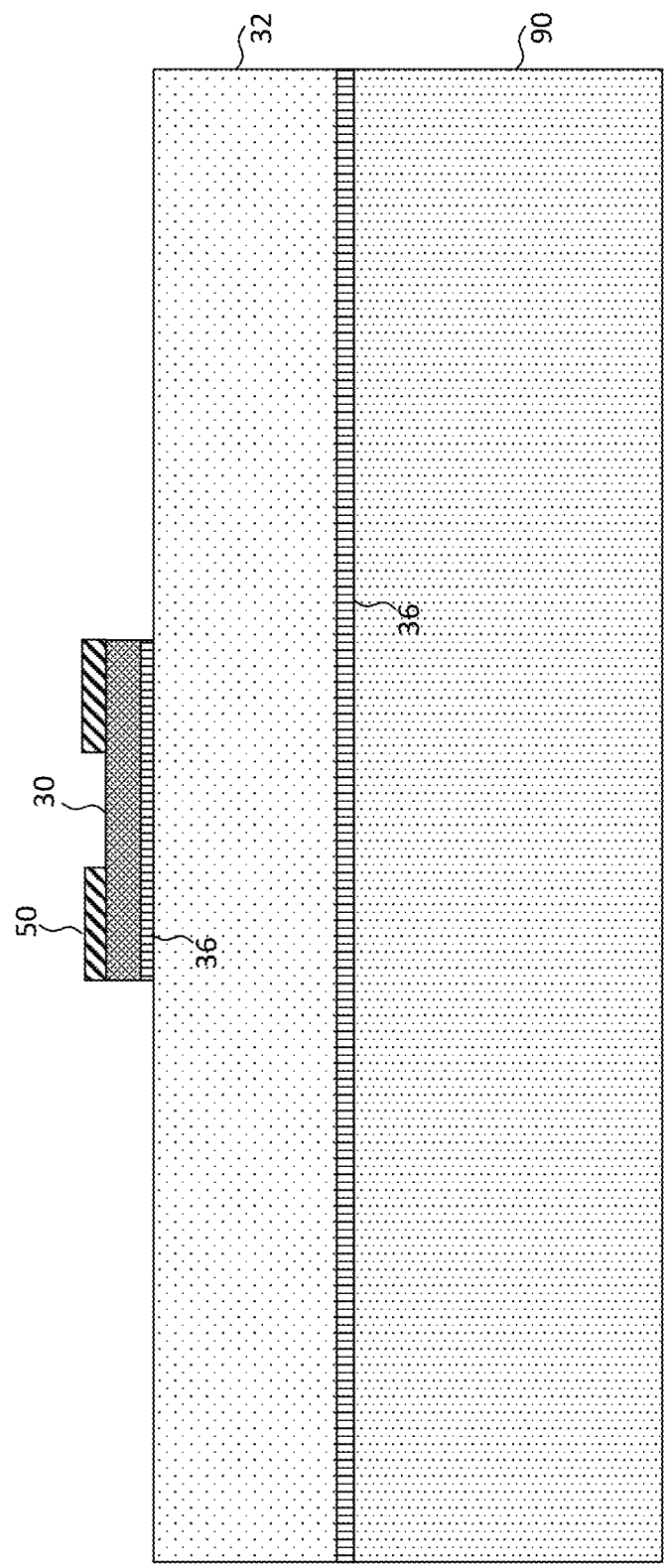
Figure 7C:
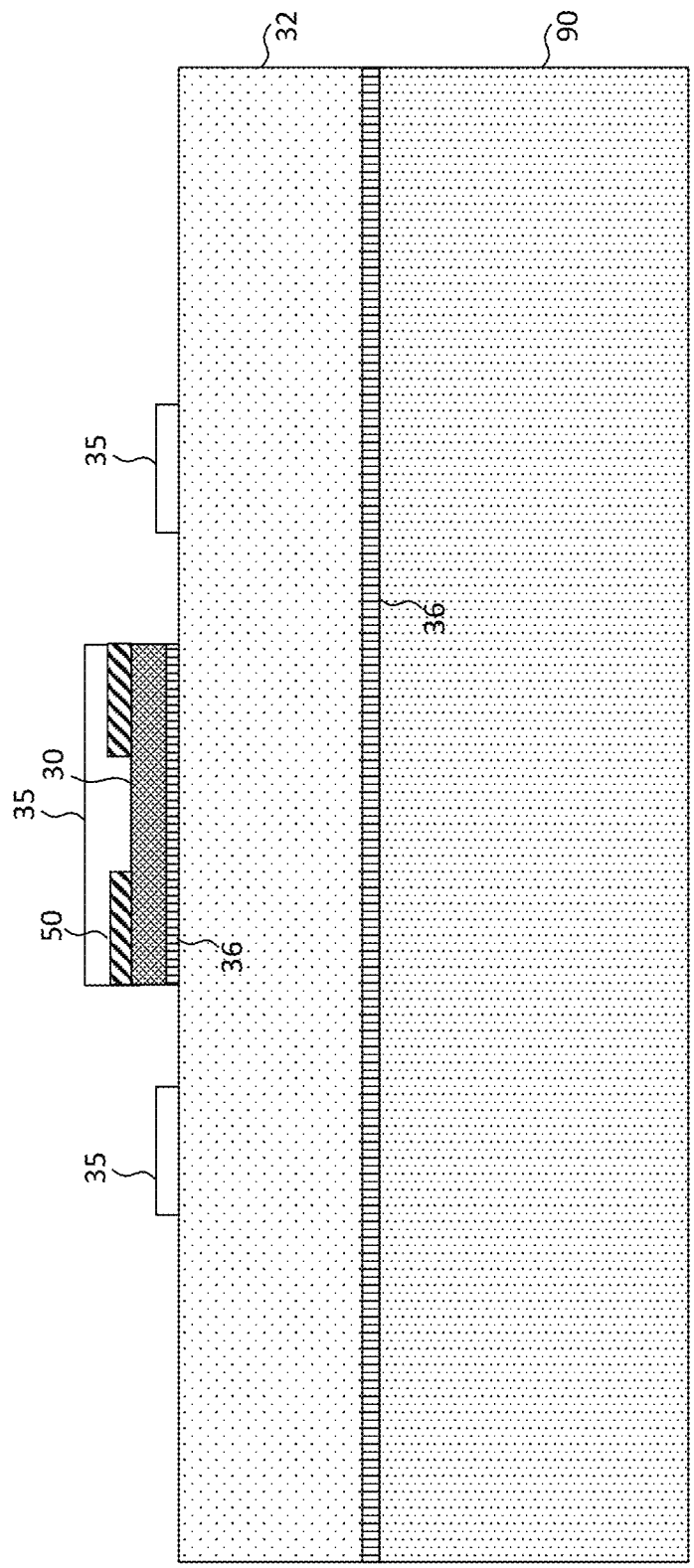
Figure 7D:
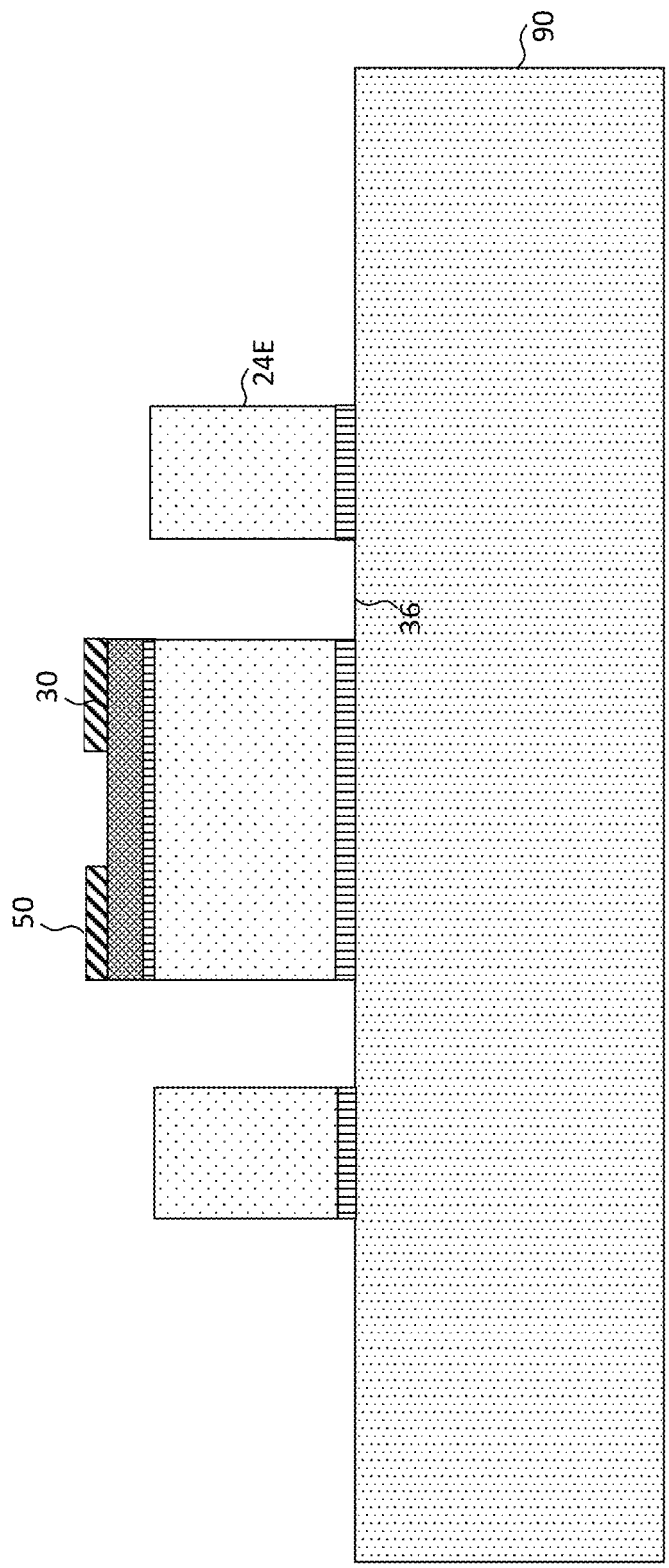
Figure 7E:
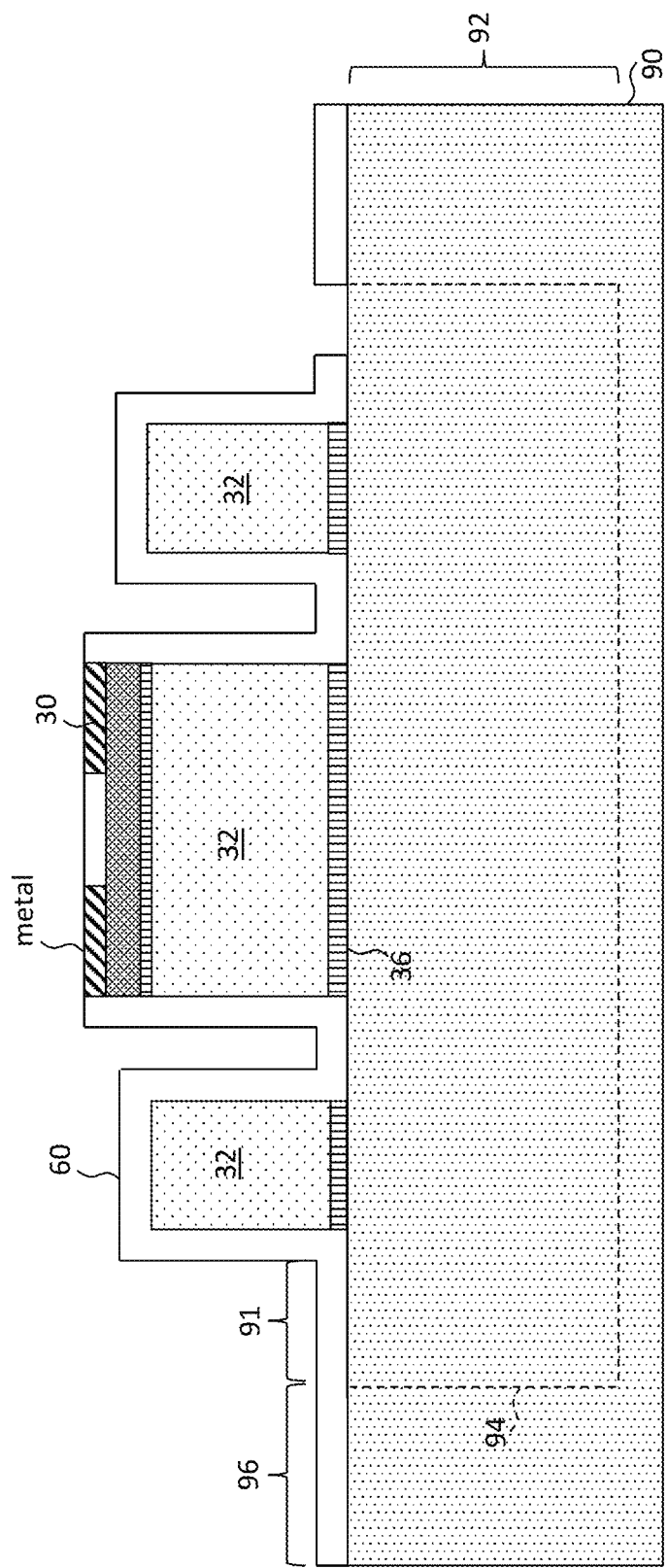
Figure 19:
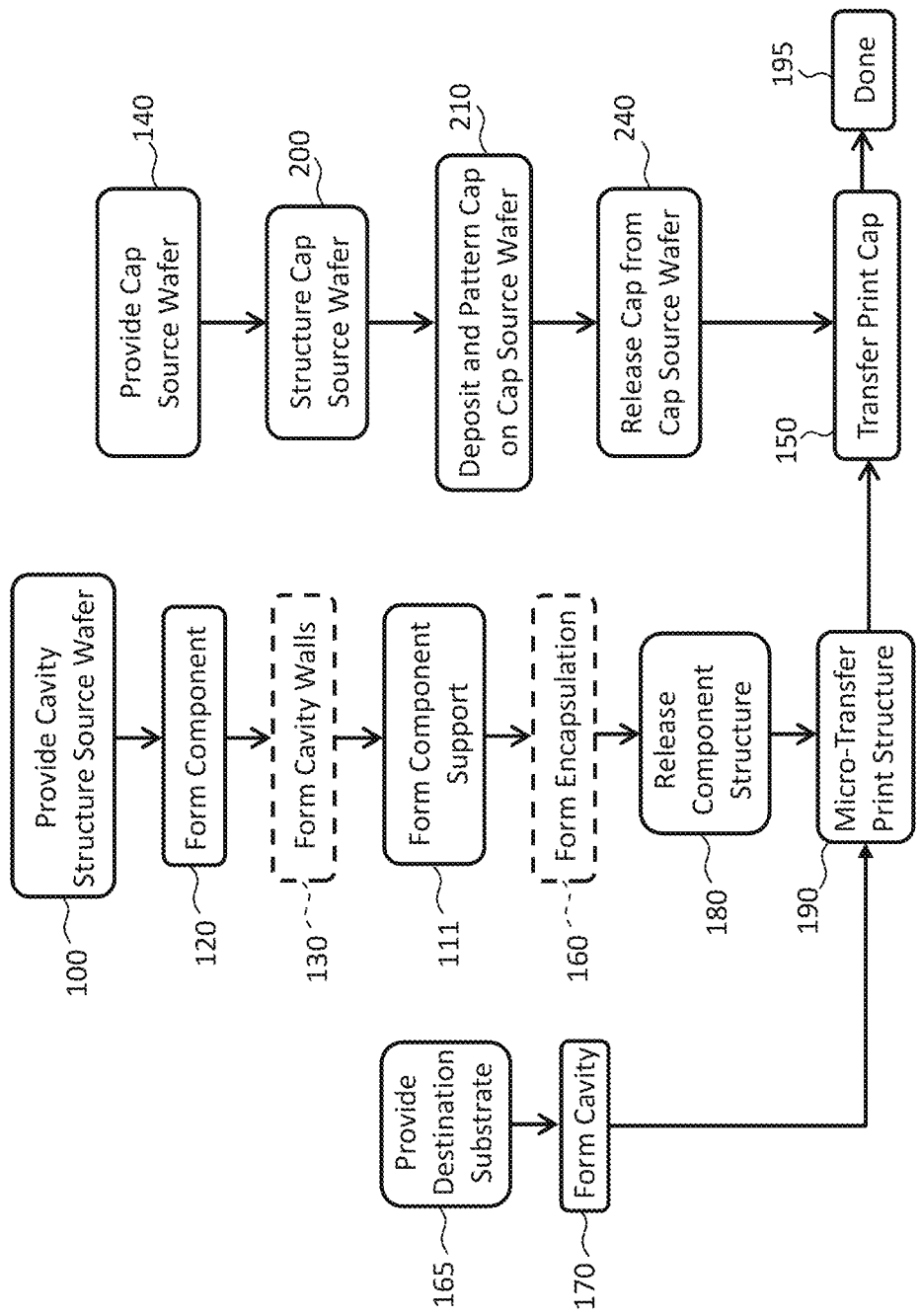
FIG. 19 is a flow diagram of micro-transfer printing and construction processes corresponding to FIGS. 7A to 7L2 according to illustrative methods of the present disclosure.

FIGS. 7A-7L2 illustrate successive structures made according to the flow diagram of FIG. 19 and embodiments of the present disclosure corresponding to cross section A of FIG. 3B and FIG. 4A, and the cross section of FIG. 5F, with a cavity 20 formed at least partially in a destination substrate 80. As shown in FIG. 7A a silicon-on-insulator (SOI) wafer can be provided in step 100, for example with a cavity structure source wafer 90, a protection layer 36 (e.g., a dielectric layer) and a component support 32 layer. Such SOI wafers are commercially available, for example those used in the integrated circuit industry. In step 120 and as shown in FIG. 7B, an optional protection layer 36 can be disposed on component support 32 and component 30 and patterned component electrodes 50 on component 30 can be disposed on component support 32 or optional protection layer 36, for example by disposing and patterning materials on component support 32 using photolithographic methods and materials. Optional protection layer 36 can be, for example a 100 nm layer of silicon dioxide. Component 30 can comprise one or more semiconductor, piezoelectric, dielectric, or conductive materials or structures or a combination of such materials or structures and can have sizes for example from 1 micron to 1 mm. Component electrodes 50 can comprise, for example, evaporated or sputtered metal (such as aluminum) patterned using photolithographic methods. In step 111 and as shown in FIG. 7C, component support 32 is patterned with a patterned mask 35 (e.g., a patterned photoresist layer), exposed component support 32 etched, for example with a dry etch, and the mask stripped, as shown in FIG. 7D. Patterned component support 32 can be patterned such that portions of component support 32 form extended cavity walls 24E (e.g., as shown in FIGS. 7J1-7L1, where cap 40 ultimately is disposed on such portions, and in contrast to FIGS. 7J2-7L2, where cap 40 surrounds such portions and thus do not necessarily act as extended cavity walls 24E). Optionally, additional extended cavity walls 24E can be constructed on component support 32 (not shown) in step 130. Optionally, component 30 is encapsulated with patterned encapsulation layer 60, as shown in FIG. 7E. Patterned encapsulation layer 60 can be, for example, silicon dioxide or silicon nitride. FIG. 7E illustrates a sacrificial layer 92 with laterally spaced apart sacrificial portions 94, structure tethers 91, and structure anchors 96.

Figure 7F:
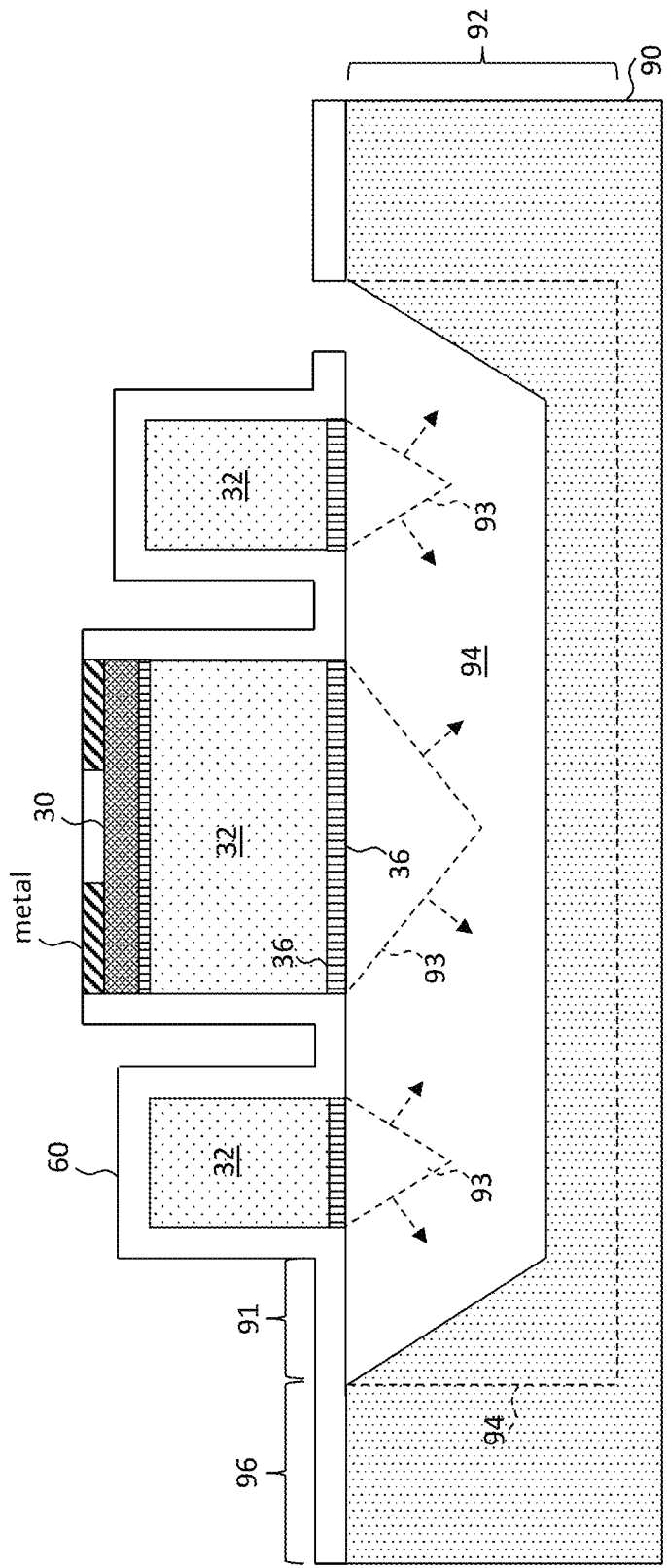

As shown in FIG. 7F and in step 180, component 30 structure can be released from cavity structure source wafer 90 by etching sacrificial portion 94 such that structure tether 91 physically connects released cavity structure 99 over etched gap 94 to structure anchor 96. The etching progression is shown with etch fronts 93. FIG. 7F is a cross section but, as can be seen in the openings of FIG. 5E, a wet etchant can attack sacrificial portion 94 around component 30, forming the different etch fronts 93 shown with dashed lines (e.g., where cavity structure source wafer 90 is an anisotropically etchable crystalline material such as silicon). As etch fronts 93 progress, they eventually meet and form a triangular or trapezoidal (as shown, in three dimensions, a truncated pyramid) cavity in cavity structure source wafer 90. (The etch angle shown in FIG. 7F and the following figures is shown at a reduced angle for clarity and to reduce the size of the figures.)

In step 165 a destination substrate 80 or cavity substrate 10 is provided and a cavity 20 formed in the substrate (step 170). In some embodiments, as also shown in FIG. 5F, cavity 20 is disposed in destination substrate 80 rather than in a separate and independent cavity substrate 10 disposed on destination substrate 80 (e.g., as shown in FIGS. 1-5D). Thus, in the embodiments of FIGS. 7A-7L2, destination substrate 80 can be considered a cavity substrate 10. Cavity 20 can extend beyond destination substrate 80 and around component 30, as discussed further subsequently.

Figure 7G:
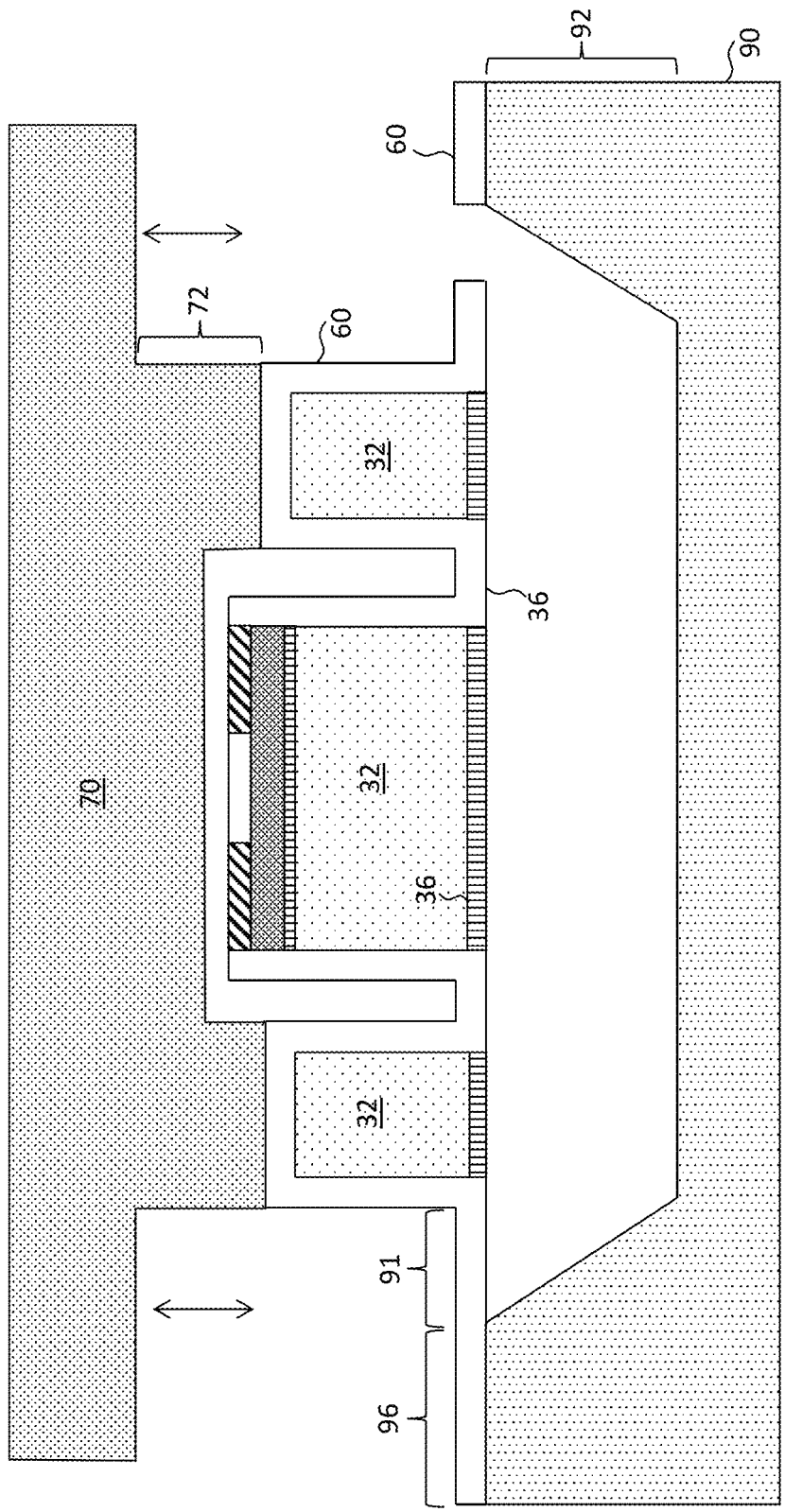

In step 190 and as shown in FIG. 7G, the released component 30 structure is transfer printed (e.g., micro-transfer printed) by a stamp 70 with structured post(s) 72 from cavity structure source wafer 90 that adheres cavity structure 99 to stamp post(s) 72 and removes component 30 structure from cavity structure source wafer 90, fracturing or separating structure tether 91. Stamp 70 can comprise structured stamp post(s) 72 with a structured surface that prevent(s) contact between stamp 70 and component 30, so as to avoid any potential damage to component 30.

Figure 7H:
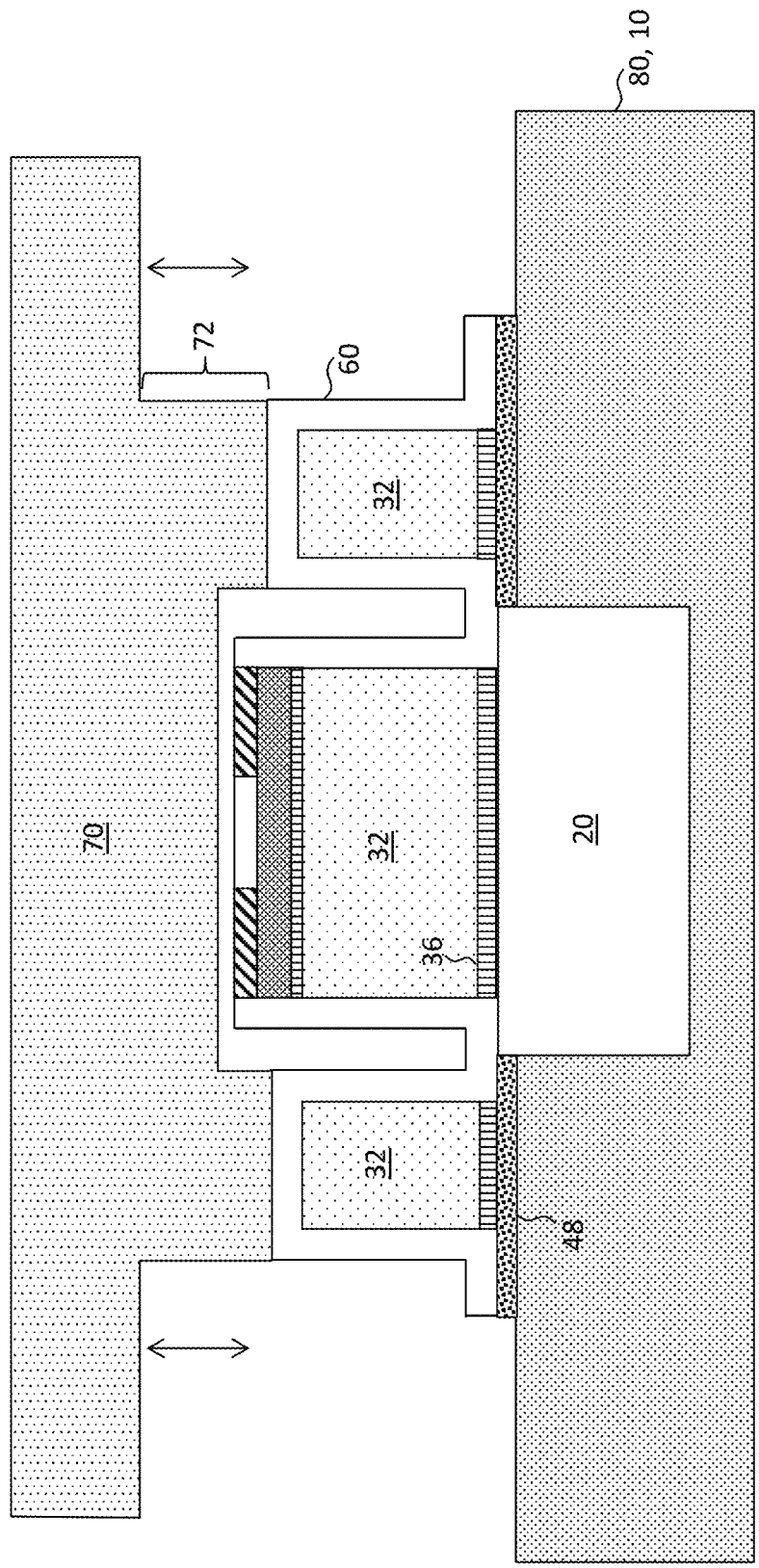
Figure 712:
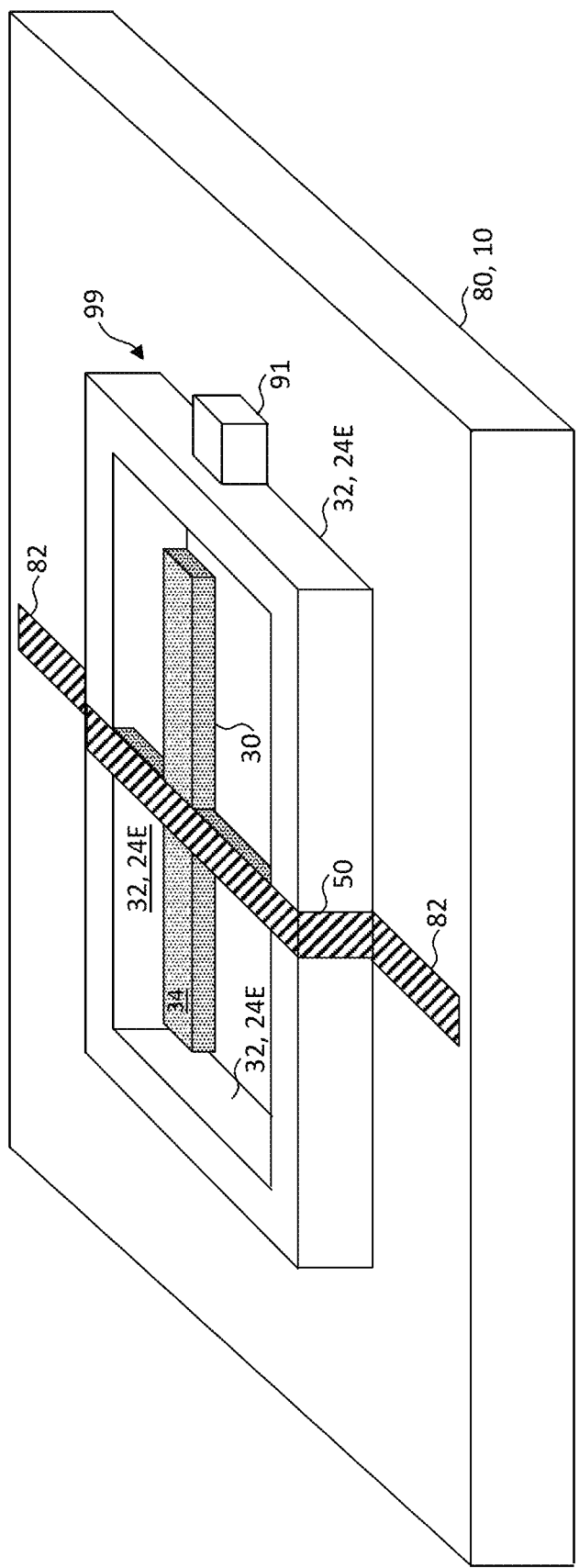

Component 30 structure is removed to a destination substrate 80 and contacted to destination substrate 80 over cavity 20 in destination substrate 80, as shown in FIG. 7H. Stamp 70 is removed, leaving component 30 structure (without cap 40) on destination substrate 80, as shown in FIG. 7I1. FIG. 7I2 is a perspective view corresponding to FIG. 7I1 including component electrode 50 and destination substrate electrical connections 82 (that can be formed on destination substrate 80 prior to transfer printing cavity structure 99).

In step 150 and as shown in FIG. 7J1, a released cap 40 is transfer printed (e.g., micro-transfer printed) from a cap source wafer (discussed further subsequently) onto component support 32 (such that portions of component support 32 act as extended cavity walls 24E) and stamp 70 removed, as shown in the cross section of FIG. 7K1 and corresponding perspective of FIG. 7L1, thereby forming enclosed cavity 20. In some embodiments, as shown in FIG. 7J2, in step 150 a released cap 40 is transfer printed (e.g., micro-transfer printed) from a cap source wafer (as discussed further subsequently) onto destination substrate 80 and stamp 70 removed, as shown in the cross section of FIG. 7K2 and the perspective of FIG. 7L2. The process is then done (step 195). Thus, component support 32 can be considered to form extended cavity walls 24E of an enclosed cavity 20 (e.g., when disposed in contact with cap 40 around a perimeter of cavity 20). As shown in FIGS. 7J1-7L2, cavity 20 in destination substrate 80, component support 32, and cap 40 together form enclosed cavity 20 that surrounds component 30 disposed on a separate portion of component support 32 that acts as a post 32 and does contribute towards forming enclosed cavity 20.

FIGS. 7J1-7L2 illustrate transfer printing component 30 to destination substrate 80 (step 190) before transfer printing cap 40 (step 150). In some embodiments of the present disclosure, cap 40 is transfer printed to component 30 structure to form cavity structure 99 (e.g., between steps 160 and 180) before transfer printing cavity structure 99 from cavity structure source wafer 90 to destination substrate 80. Cap 40 sits over component support 32 such that component support 32 does not act, in the illustrated embodiments of FIGS. 7J1-7L2, as extended cavity walls 24E.

In the embodiments illustrated in FIGS. 7A-7L2, cavity 20 is disposed at least partially in destination substrate 80 and extends around component 30 inside component support 32. In some embodiments and as illustrated in FIGS. 8A-8D, component 30 is disposed directly on cavity substrate 10 in which cavity 20 is disposed and cap 40 can be disposed over component 30 and cavity 20 before component 20 is transfer printed onto destination substrate 80, thus forming an enclosed cavity 20 around component 30 and in which component 30 is at least partially suspended (e.g., by lateral attachments or supported on a portion of component support 32). Thus, cavity structure 99 is separate and independent from destination substrate 80.

Figure 8A:
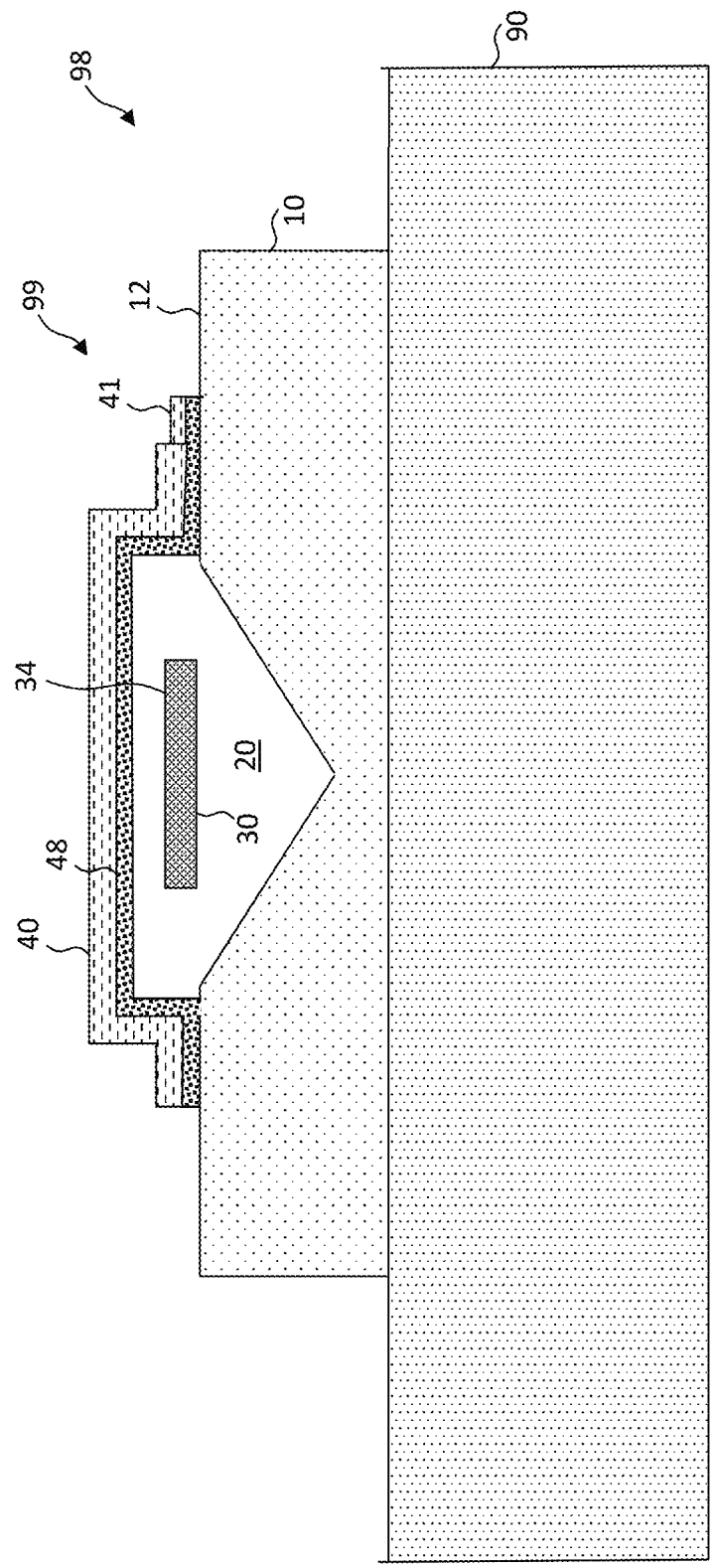
FIG. 8A is a cross section of a cavity structure with a tophat cap on a cavity source wafer according to illustrative embodiments of the present disclosure.
Figure 8B:
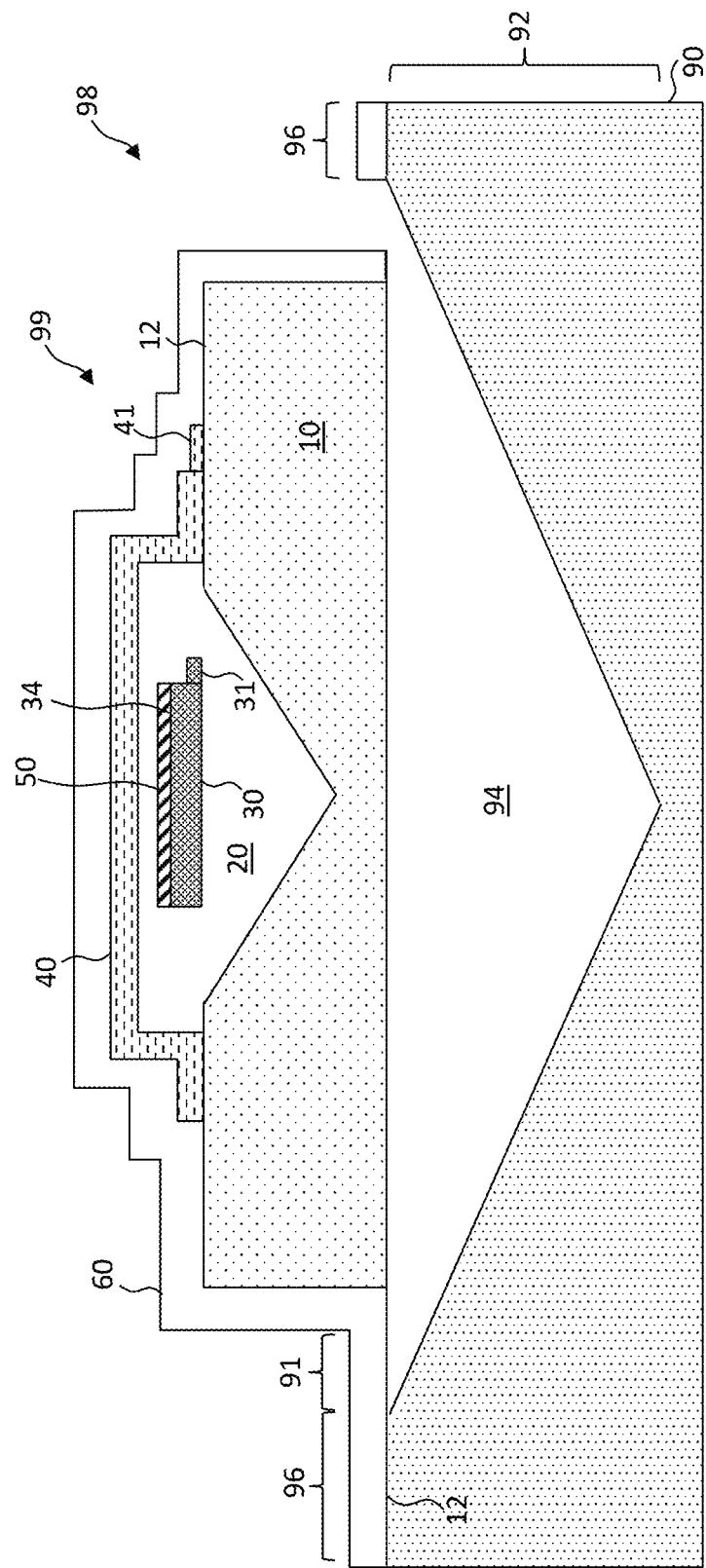
FIG. 8B is a cross section of a cavity structure with a tophat cap released from a cavity source wafer according to illustrative embodiments of the present disclosure.
Figure 8C:
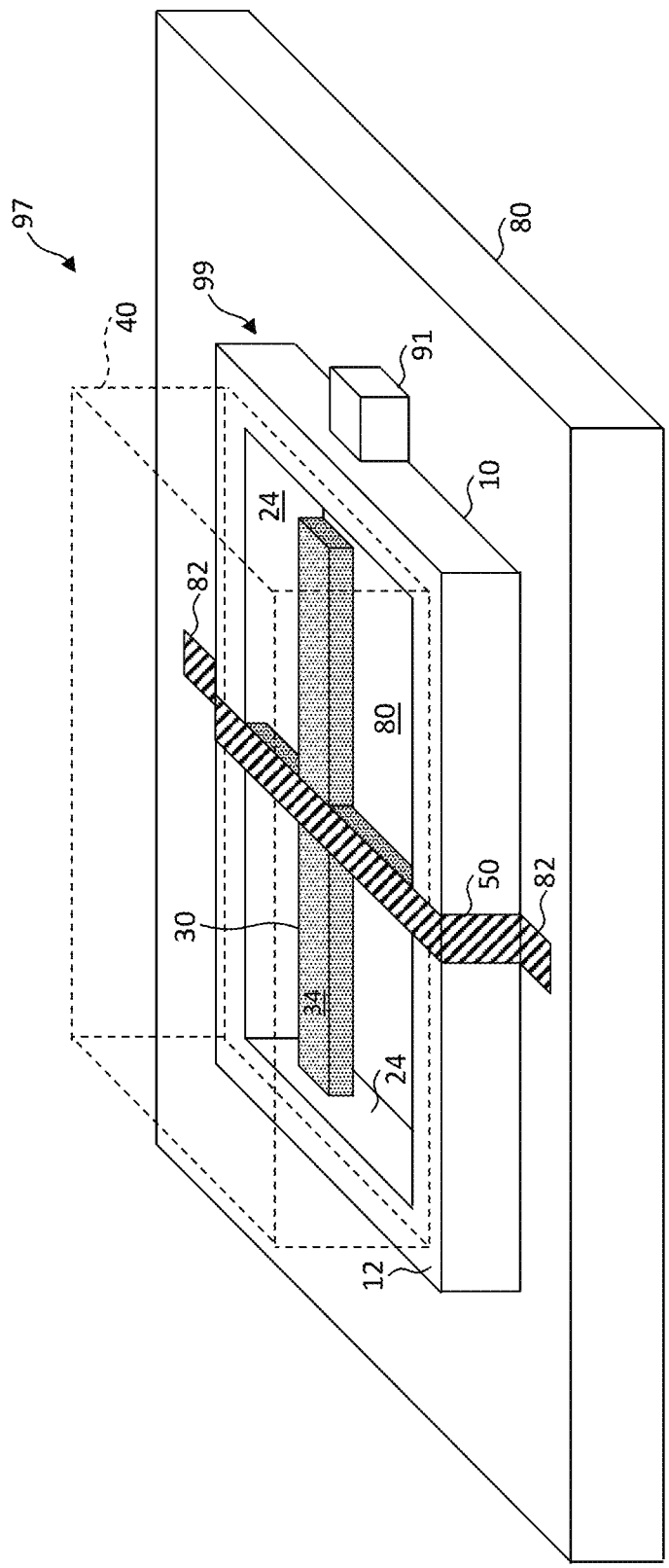
FIG. 8C is a perspective of a cavity structure with a tophat cap disposed on a destination substrate according to illustrative embodiments of the present disclosure.
Figure 8D:
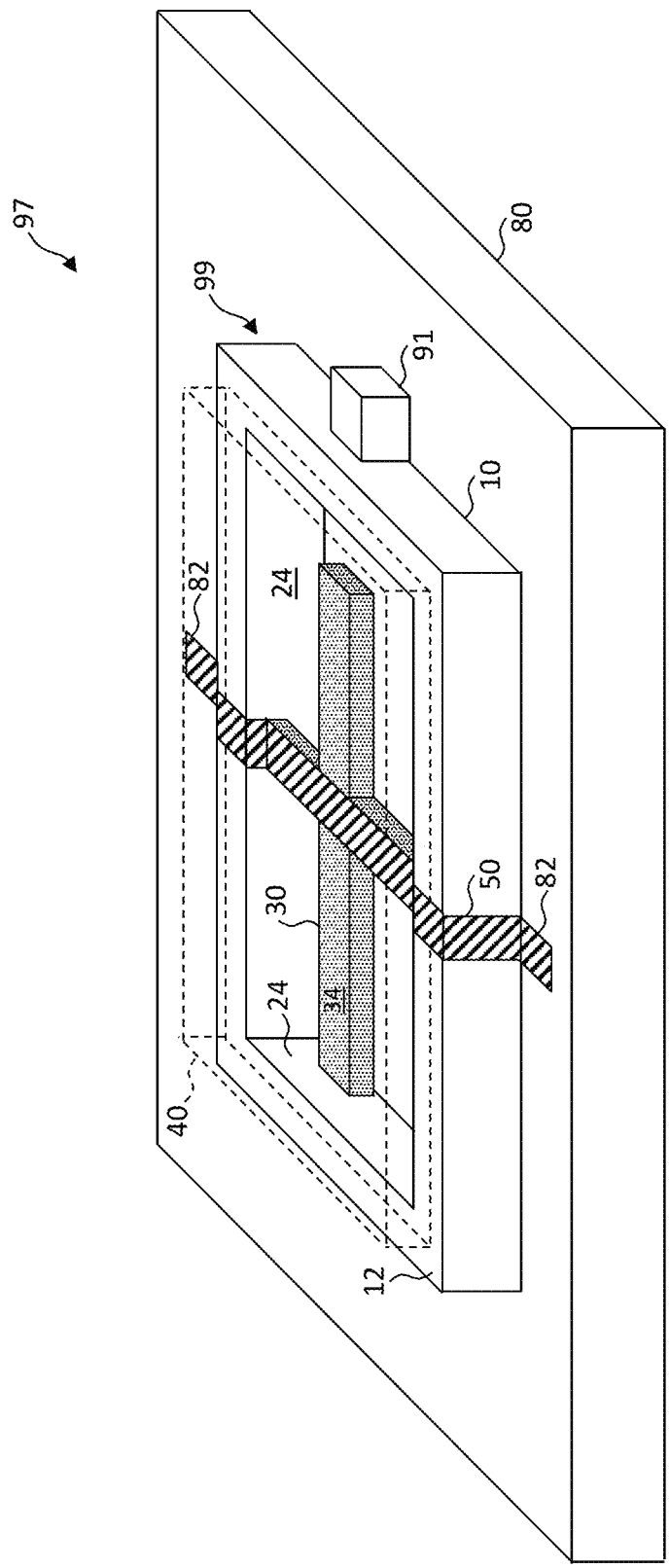
FIG. 8D is a perspective of a cavity structure with a planar cap disposed on a destination substrate according to illustrative embodiments of the present disclosure.

As shown in FIG. 8A, according to some embodiments of the present disclosure, cavity 20 is formed in cavity substrate 10 and cap 40 is disposed on cavity substrate 10, thereby forming enclosed cavity 20, before transfer printing cavity structure 99 with cap 40. Cavity structure 99 together with cavity structure source wafer 90 forms a cavity structure wafer 98. As illustrated in FIG. 8B (including cavity structure source wafer 90 and omitting any optional protection layer 36 between component 30 and cavity substrate 10 and between cavity structure source wafer 90 and cavity structure 99), cavity structure 99 can comprise an encapsulation layer 60 that can encapsulate or seal enclosed cavity 20 (e.g., from the outside environment) and can be disposed over cap 40, optional extended cavity wall(s) 24E (not shown), and at least a portion of cavity substrate 10. Structure tether 91 can comprise a portion of encapsulation layer 60, for example as shown in FIG. 8B. In some embodiments, structure tether 91 comprises a portion of cavity substrate 10 or other layer(s), such as dielectrics or resins (e.g., a portion of adhesive 48) used to construct cavity structure 99. Cavity structure 99 can be transfer printed (e.g., micro-transfer printed) from cavity structure source wafer 90 to a destination substrate 80, as shown in FIG. 8C, with either a stamp 70 with structured stamp post(s) 72 or a stamp post 72 with a planar distal end. Structured stamp post(s) 72 can be used if it is desirable to contact cap contact portion 42 and avoid contact with cap top portion 46, mitigating any damage to cap 40 from pressure to cap top portion 46. As shown in FIG. 8D, where component surface 34 of component 30 is below substrate surface 12, a planar cap 40 can be used to encapsulate and protect component 30 (e.g., as shown in FIG. 2C).

As shown in FIGS. 8A-8D, in some embodiments, cavity structure 99 can be transfer printed (e.g., micro-transfer printed) from cavity structure source wafer 90 and adhered to a destination substrate 80. Destination substrate 80 can comprise a hole (a cavity) over which cavity structure 99 is disposed, as illustrated in cross section in FIG. 5F. A cavity in destination substrate 80 can mitigate or prevent stiction between component 30 and destination substrate 80. The hole, pit, indentation, or cavity in destination substrate 80 can form a portion of cavity 20. Component electrodes 50 (partially shown in FIGS. 8C-8D) can be electrically connected to electrical circuits or other electrical conductors on destination substrate 80. Destination substrate 80 can be, for example, a semiconductor or dielectric substrate and can comprise integrated circuits electrically or optically connected to component 30 in one or more cavity structures 99 disposed on destination substrate 80.

Any one of cap tether 41, component tether 31, or structure tether 91 can be broken (e.g., fractured) or separated as a consequence of micro-transfer printing cap 40, component 30, or cavity structure 99, respectively.

In some embodiments of the present disclosure, cavity 20 comprises a volume (a space) that is under a vacuum or partial vacuum, comprises a volume filled with a gas, for example air, or an added gas such as dry air, nitrogen, helium, or inert gas, or comprises a volume containing a liquid. Cavity 20 can be hermetically sealed, e.g., with cap 40, cavity wall(s) 24 (e.g., including extended cavity wall(s) 24E), and cavity floor 22 (if present).

According to some embodiments of the present disclosure, a cavity structure 99 comprises a cavity substrate 10 comprising cavity walls 24 enclosing the sides of a cavity 20. A component 30 is disposed in cavity 20 and physically connected to cavity walls 24 with component tethers 31. At least a portion of a structure tether 91 is physically connected to cavity substrate 10 or a layer disposed on cavity substrate 10. In some embodiments, cavity 20 has no top and no bottom, for example as shown in FIGS. 5E (in perspective), 3A, 3B, and 5F (in cross section with destination substrate 80).

According to some embodiments of the present disclosure and as shown in FIG. 5F, a cavity structure system 97 comprises a cavity structure 99 disposed on a destination substrate 80. Cavity structure system 97 can comprise a plurality of cavity structures 99 disposed on destination substrate 80. Cavity structure 99 can comprise a component 30 electrically connected to component electrodes 50 and destination substrate 80 can comprise destination substrate electrical connections 82 disposed on destination substrate 80 and electrically connected to component electrodes 50 and component 30, for example as shown in FIGS. 8C-8D.

Figure 9H:
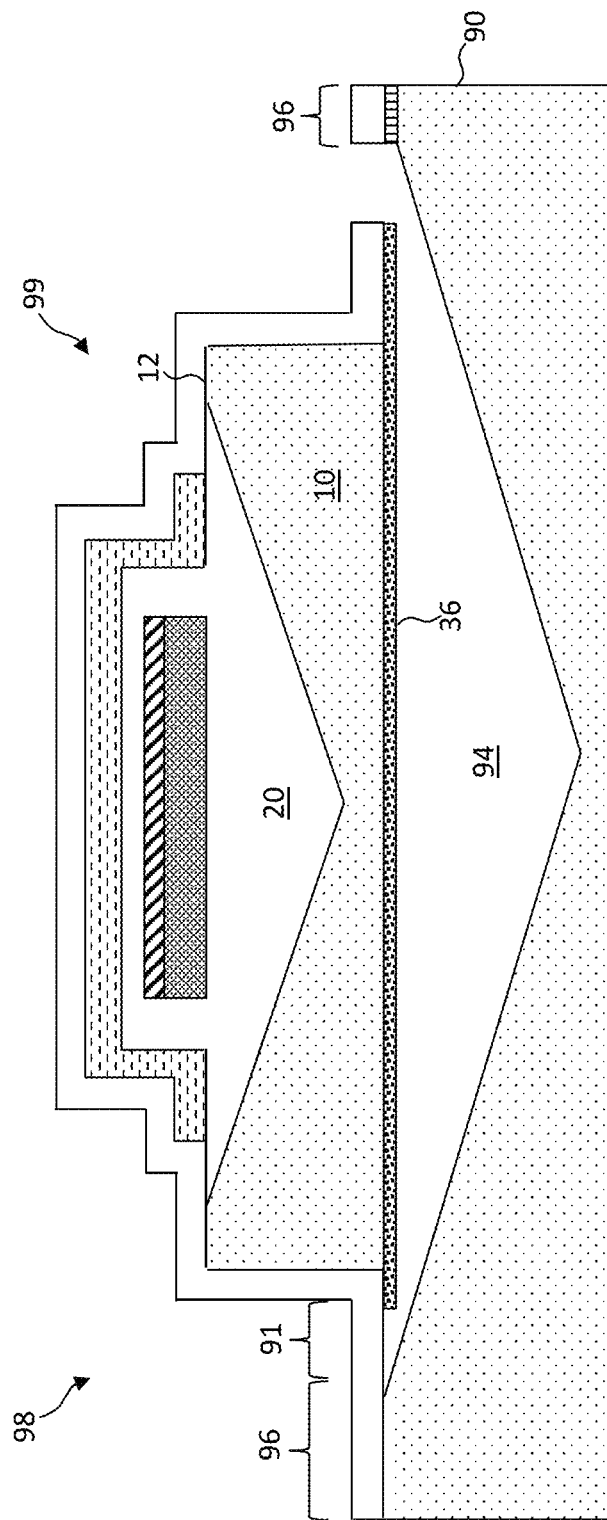
Figure 9I:
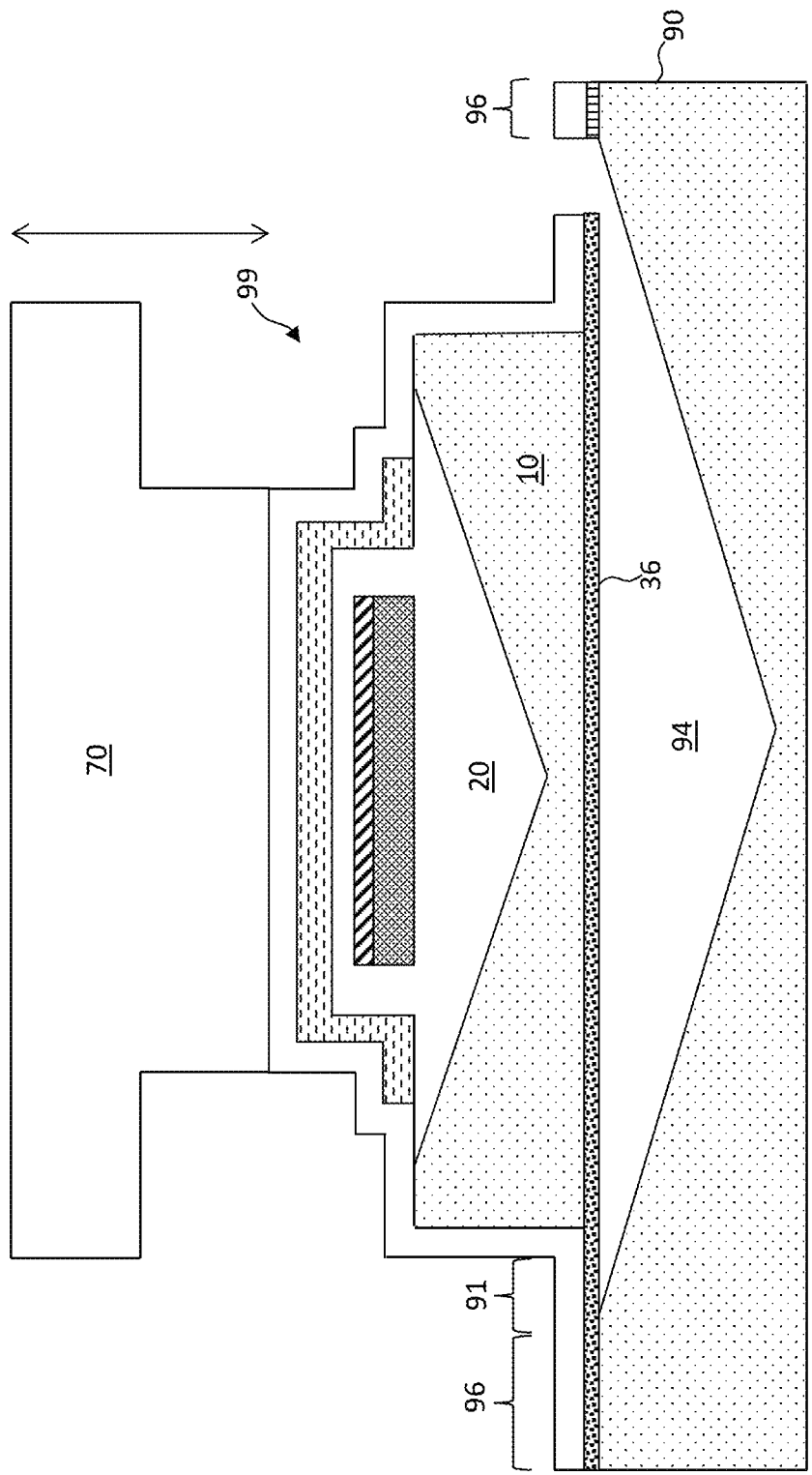
Figure 9J:
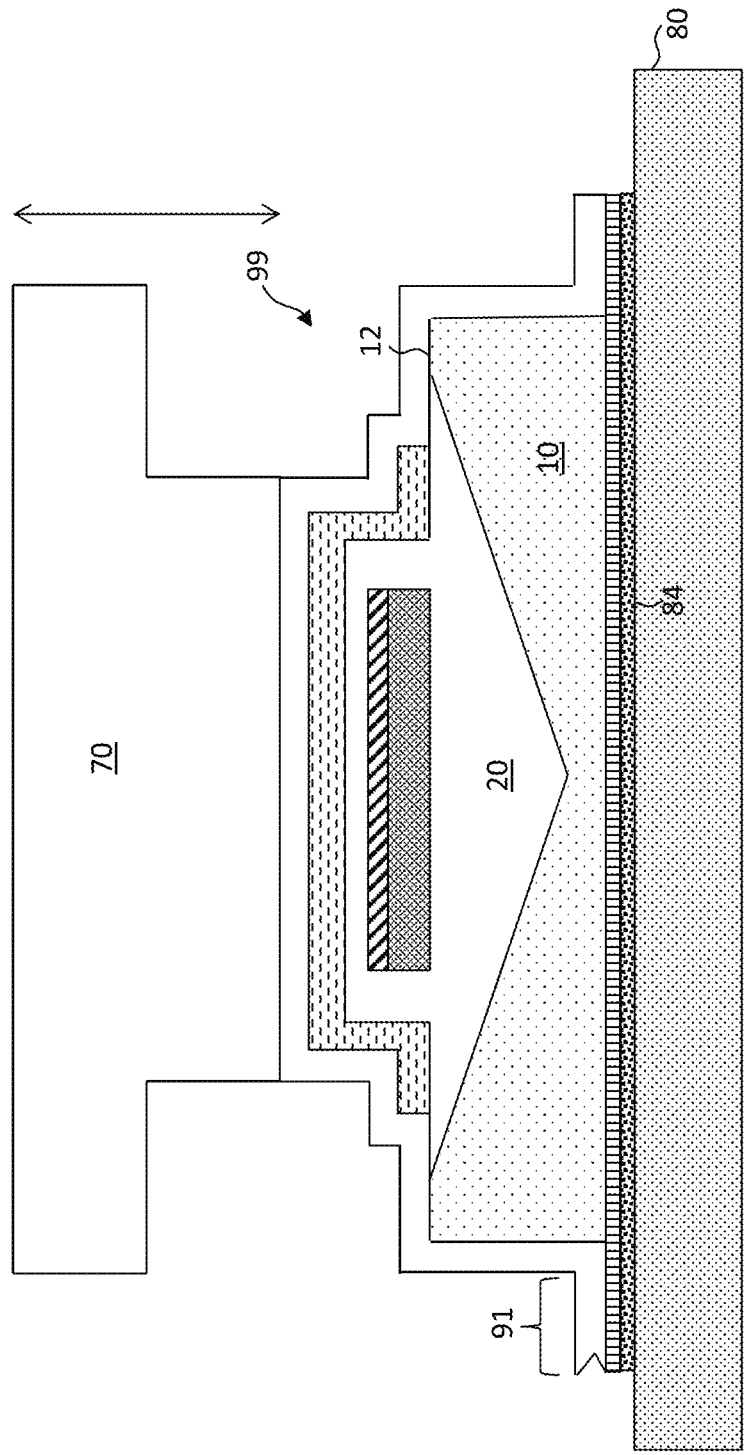
Figure 9K:
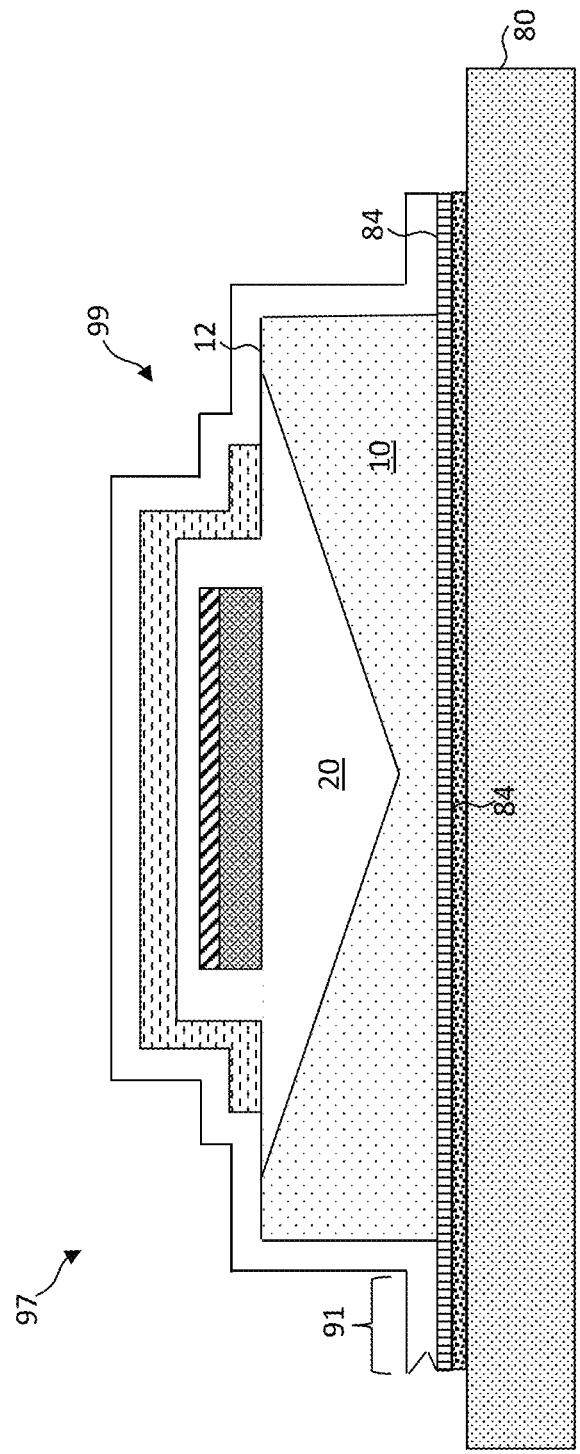
Figure 10:
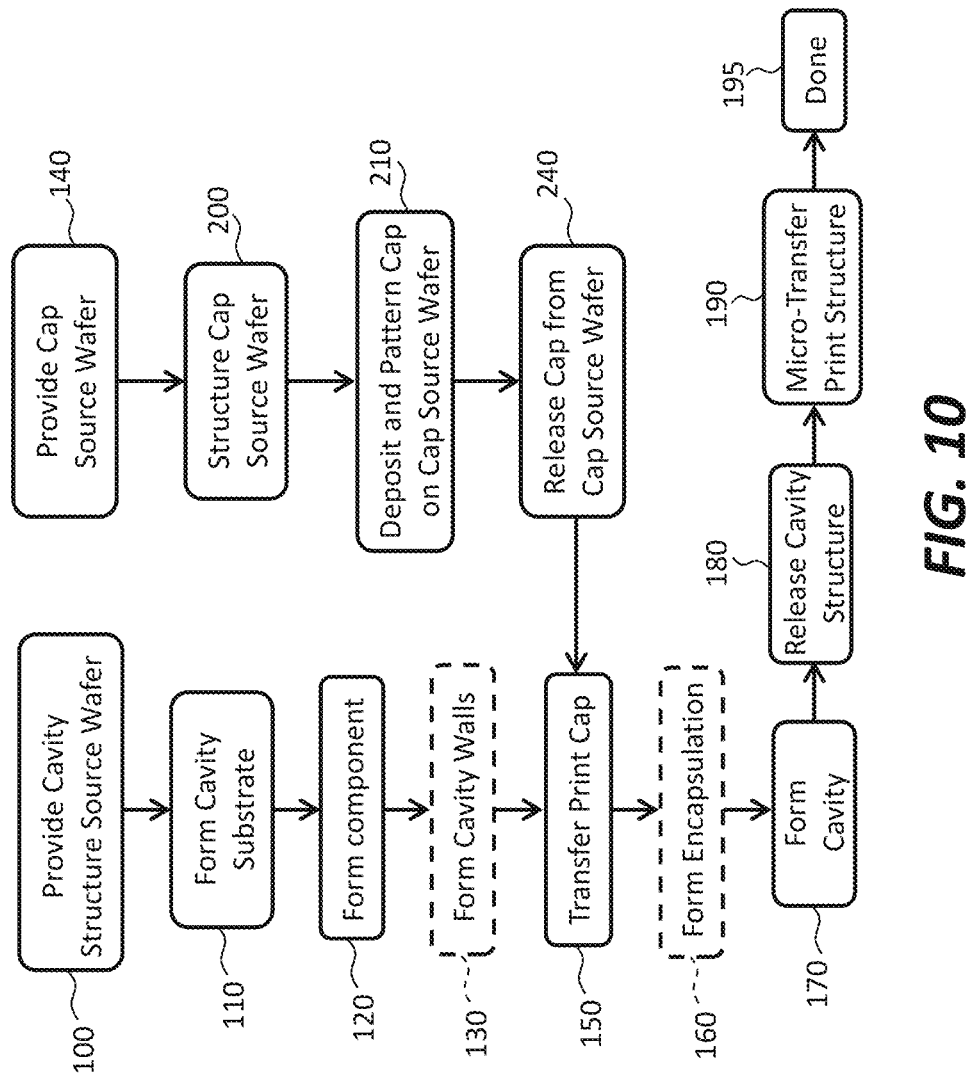
FIG. 10 is a flow diagram of micro-transfer printing and construction processes corresponding to FIGS. 9A to 9J according to illustrative methods of the present disclosure.

As described in the following paragraphs, illustrative methods according to some embodiments of the present disclosure are shown in the successive cross sections of FIGS. 9A-9K and the flow diagram of FIG. 10 illustrating methods of making cavity structures 99 independent and separate from destination substrate 80, as shown in FIGS. 8A-8D. The cross sections are taken in the direction illustrated by cross section line A (e.g., as shown in FIGS. 4A and 5E). In step 100, a cavity structure source wafer 90 is provided. Cavity substrate 10 is formed or otherwise disposed on cavity structure source wafer 90 in step 110. FIG. 9A illustrates cavity substrate 10 but for clarity and simplicity of illustration, FIGS. 9A-9F do not illustrate cavity structure source wafer 90. In step 120, component 30 is formed or disposed on cavity substrate 10, for example by depositing component electrodes 50 and component 30 materials (for example including semiconductors, piezoelectric materials, metals, and dielectrics in any order, combination, or structure). FIG. 9B illustrates component 30 disposed on cavity substrate 10 with a protection layer 36 and, in FIG. 9C, a component electrode 50 is disposed on component 30. However, embodiments of the present disclosure are not limited by the simplified structure illustrated in FIGS. 9A-9K. Optionally, extended cavity walls 24E are formed on cavity substrate 10 (not shown in FIGS. 9A-9K) in step 130.

In step 150 and as shown in FIG. 9D, a cap 40 is disposed, for example by micro-transfer printing from a cap source wafer 62 (discussed subsequently) provided in step 140, onto substrate surface 12 of cavity substrate 10. Cap 40 is constructed in steps 140, 200, 210, and 240 as discussed further with respect to the flow diagram of FIG. 14 subsequently. Optionally, in step 160 and as shown in FIG. 9E, an encapsulation layer 60 is formed over cap 40 and substrate surface 12. Encapsulation layer 60 surrounds and covers cap 40 but can leave a perimeter of exposed substrate surface 12 around cap 40. In step 170 and as shown in FIG. 9F without protection layer 36, cavity 20 is etched beneath component 30, leaving component 30 at least partially suspended over cavity 20, for example as shown in FIGS. 5A, and 6A. Cavity structure 99 is then complete and, together with cavity structure source wafer 90 illustrated in FIG. 9G, forms a cavity structure wafer 98.

FIG. 9G illustrates cavity structure source wafer 90 and a dielectric protection layer 36 disposed between cavity structure 99 and cavity structure source wafer 90. In step 180 and as shown in FIG. 9H, a sacrificial portion 94 of cavity structure source wafer 90 is etched to release cavity structure 99 from cavity structure source wafer 90, leaving cavity structure 99 suspended over cavity structure source wafer 90 and attached to a structure anchor 96 by structure tether 91. Cavity structure 99 can then be micro-transfer printed in step 190.

As shown in FIG. 9I, stamp 70 contacts cap 40 of cavity structure 99 and adheres cap 40 of cavity structure 99 to stamp 70, for example to a stamp post 72, in this illustration having a non-structured planar distal end. Stamp 70 is removed vertically, breaking (e.g., fracturing) or separating structure tether 91, cavity structure 99 is transported to destination substrate 80 (as shown in FIG. 9J), and pressed against destination substrate 80 (or an optional destination substrate adhesive layer 84 disposed on destination substrate 80) to adhere cavity structure 99 to destination substrate 80, to micro-transfer print cavity structure 99 to destination substrate 80 in step 190. Although stamp 70 is illustrated as contacting cap top portion 46, in some embodiments, stamp 70 comprises structured post(s) that contacts only cap contact portion 42, as discussed further subsequently and shown in FIG. 7G, thus avoiding mechanical stress applied to cap top portion 46 and possible damage to component 30. Stamp 70 is then removed as shown in FIG. 9K, any destination substrate electrical connections 82 are formed using, for example, photolithographic methods and materials, to connect component 30 to an external control (e.g., to component electrodes 50), and the construction of a cavity structure system 97 is complete in step 195. Destination substrate 80 can be provided with electrical wires and destination substrate contact pads (e.g., destination substrate electrical connections 82) formed before micro-transfer printing cavity structure 99 to destination substrate 80.

Some methods of the present disclosure, and as shown in FIGS. 8A-10, dispose cap 40 over component 30 (in step 150) before cavity structure 99 is transfer printed from cavity structure source wafer 90 to destination substrate 80. In some embodiments of the present disclosure, a component 30 structure is transfer printed from a source wafer to destination substrate 80 (e.g., corresponding to step 190) before transfer printing cap 40 (step 150) over component 30 to form cavity structure 99. According to some embodiments of the present disclosure and as illustrated in FIGS. 11A-11H and 12, a component 30 structure is transfer printed from cavity structure source wafer 90 to destination substrate 80 before cap 40 is disposed over component 30. Advantages of methods illustrated in FIG. 10 include transfer printing component 30 when component 30 is protected by cap 40. Advantages of methods illustrated in FIGS. 11A-11H and 12 include avoiding damage to cap 40 when transfer printing component 30. Furthermore, adhesive 48 disposed to adhere cap 40 to cavity substrate 10 can be deleteriously affected by etchants used to release cavity substrate 10 from cavity structure source wafer 90. Adhering cap 40 after transfer printing component 30 avoids this issue. Both types of methods are useful and are included in the present disclosure.

Figure 11D:
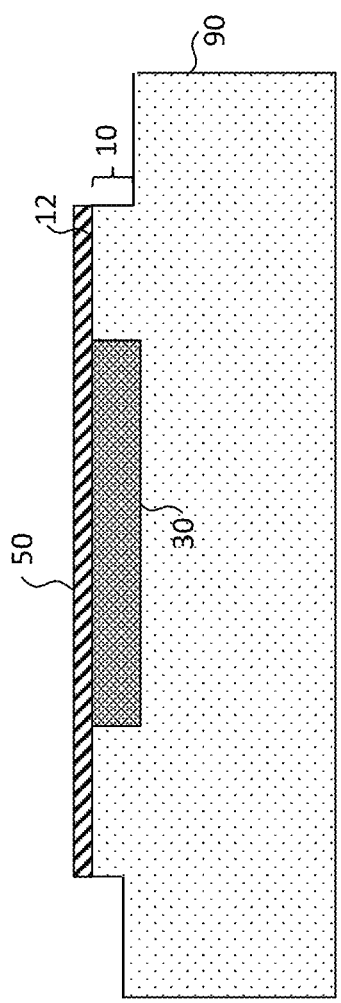
Figure 11E:
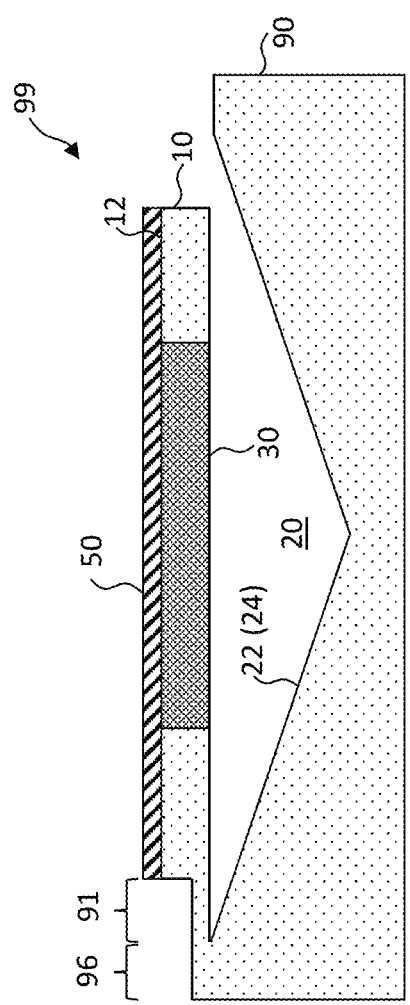
Figure 11H:
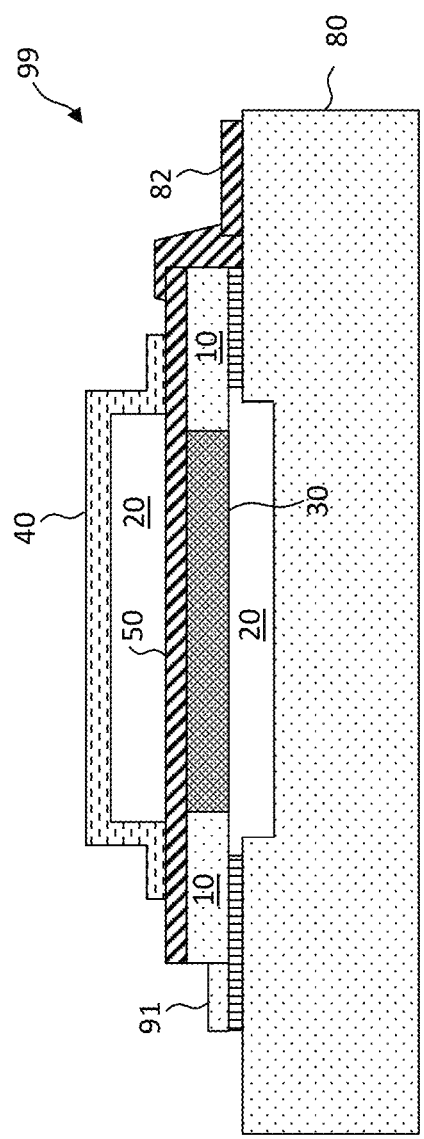
Figure 12:
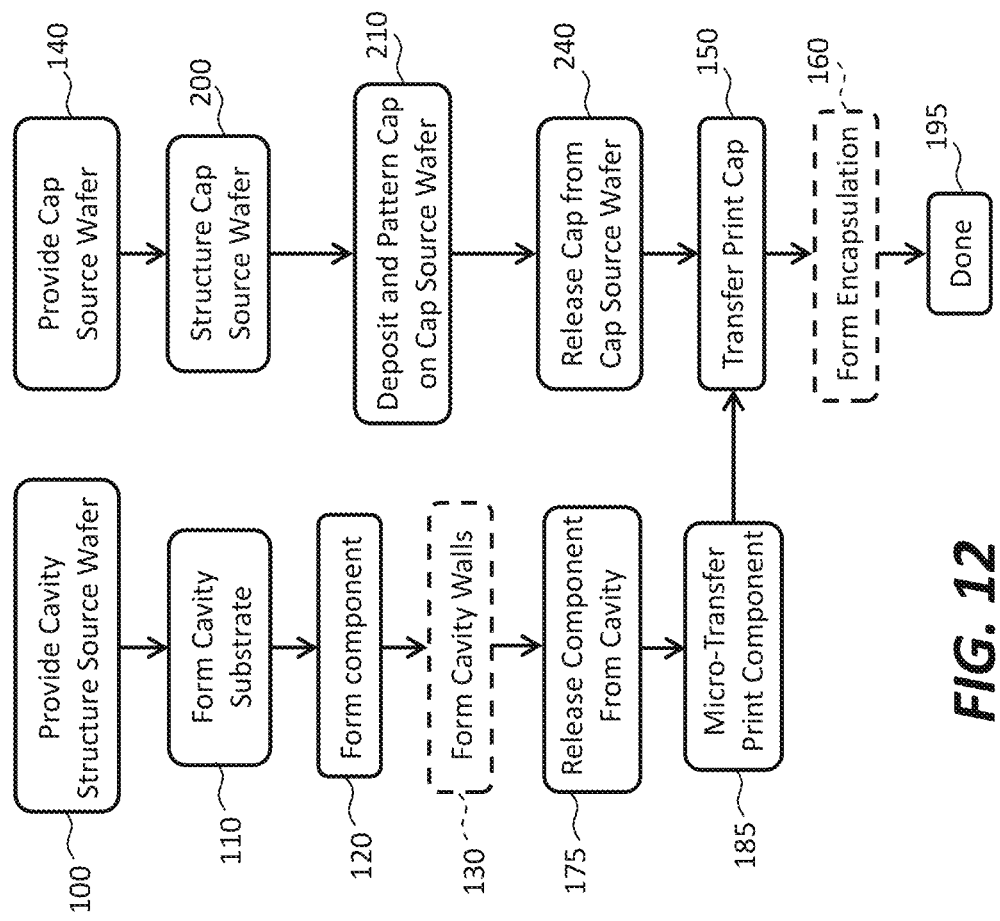
FIG. 12 is a flow diagram of micro-transfer printing and construction processes corresponding to FIGS. 11A to 11H according to illustrative methods of the present disclosure.

In some embodiments and as shown in the successive cross sections of FIGS. 11A-11H and flow diagram of FIG. 12, in step 100 and as shown in FIG. 11A a cavity structure source wafer 90 is provided. In step 110 and as shown in FIG. 11B, a cavity substrate 10 is formed. The cavity substrate 10 can be the same material as the cavity structure source wafer 90, can be formed by pattern-wise depositing cavity substrate 10 material on cavity structure source wafer 90, or can be formed by pattern-wise etching cavity structure source wafer 90 (as shown in FIG. 11B). A barrier protection layer 36 can be provided between cavity substrate 10 and cavity structure source wafer 90 or a seed layer deposited on or over cavity structure source wafer 90 to facilitate forming cavity substrate 10 (not shown). Cavity substrate 10 and any other structures and materials can be deposited, formed, or patterned using photolithographic processes and materials.

As shown in FIGS. 11C and 11D and in step 120, component 30 is formed or disposed on or in cavity substrate 10. Component 30 can comprise various materials and structures. For example, component 30 can be an integrated circuit, a piezoelectric structure, or any other desirable component 30, for example comprising one or more of patterned or unpatterned semiconductor(s), piezoelectric material(s) such as potassium niobate ($KNbO_3$), $(K,Na)NbO_3$ (KNN) or lead zirconate titanate (PZT, also referred to interchangeably as lead zirconium titanate), dielectric(s) such as silicon dioxide or silicon nitride, and conductive material(s) such as metals or transparent conductive oxides.

Optional extended cavity walls 24E can be disposed before, after, or during the construction or deposition of component 30 in optional step 130. In step 175 and as shown in FIG. 11E, cavity 20 is formed in cavity substrate 10 beneath component 30 and between component 30 and cavity structure source wafer 90 and component 30 and cavity substrate 10 are released from cavity structure source wafer 90. Cavity substrate 10 can be anisotropically etched, as shown with cavity floor 22 (or equivalently, cavity walls 24) non-orthogonal to substrate surface 12, and a protection layer 36 (not shown) between component 30 and cavity substrate 10 provided. In some embodiments, a patterned sacrificial layer 92 with sacrificial portions 94 is provided beneath component 30 that is differentially etchable from component 30 and cavity substrate 10 and etched to form cavity 20 with cavity floor 22 substantially orthogonal to cavity walls 24. Component 30 and cavity substrate 10 are transfer printed in step 185 from cavity structure source wafer 90 to destination substrate 80 using a stamp 70 (e.g., as demonstrated in FIGS. 9I and 9J), as shown in FIG. 11F. Optionally, destination substrate 80 has a pit, indentation, cavity, or hole disposed under component 30, as shown, that can form a portion of cavity 20 to prevent component 30 from interacting with destination substrate 80, e.g., mechanically or with stiction.

As shown in FIG. 11G and in step 150, cap 40 is transfer printed from a cap source wafer 62 onto or over cavity substrate 10. Cap 40 is provided in steps 140, 200, 210, and 240 as discussed further with respect to the flow diagram of FIG. 14 below. Component electrodes 50 can be electrically connected to destination substrate electrical connections 82 (e.g., electrical contact pads or electrical conductors) as shown in FIG. 11H. A subsequent encapsulation layer 60 (shown in FIG. 9F) can be disposed over cavity structure 99 in optional step 160 in step 195.

FIGS. 11A-11H and FIG. 12 illustrate methods of the present disclosure with cavities 20 in cavity substrates 10 that extend completely through cavity substrate 10 so that a hole, indentation, cavity, or pit in destination substrate 80 can (e.g., further) prevent component 30 from interacting with destination substrate 80. In some embodiments, and as shown in successive FIGS. 13A-13H and the flow diagram of FIG. 12 (and also in FIGS. 9A-9K), cavity 20 does not extend completely through cavity substrate 10 as described further in the following paragraphs referring to said figures.

Figure 13A:
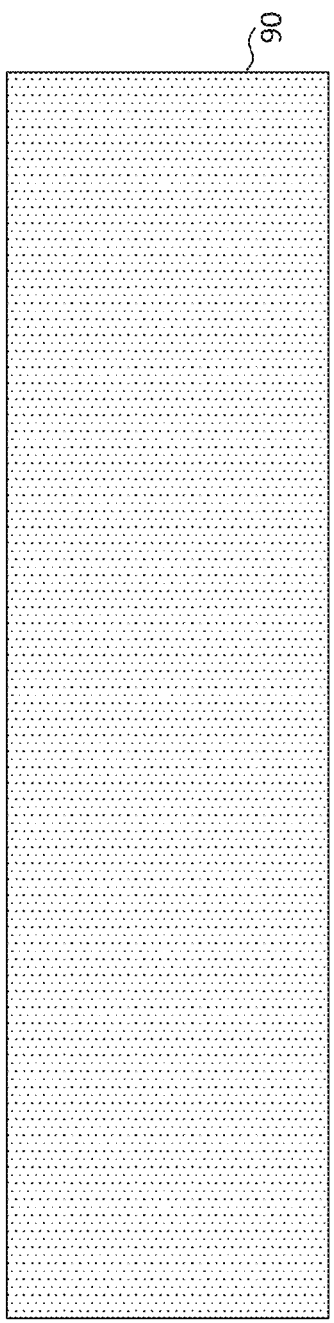
Figure 13B:
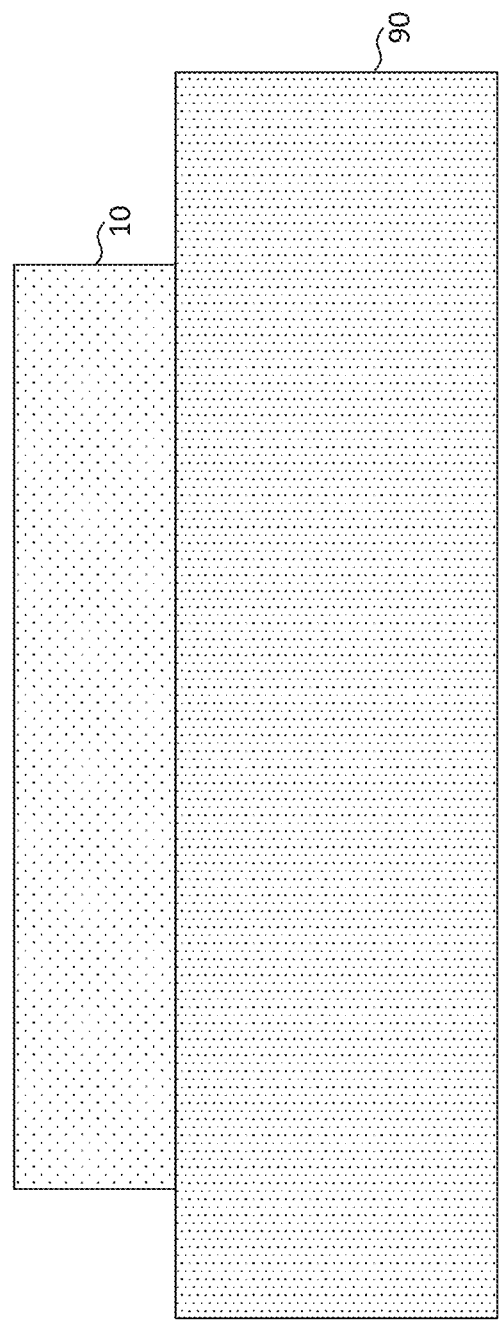

In step 100 and as shown in FIG. 13A a cavity structure source wafer 90 is provided. In step 110 and as shown in FIG. 13B, a cavity substrate 10 is formed. The cavity substrate 10 can be the same material as the cavity structure source wafer 90, can be formed by pattern-wise depositing cavity substrate 10 material on cavity structure source wafer 90 (as shown in FIG. 13B), or can be formed by pattern-wise etching cavity structure source wafer 90. A barrier protection layer 36 (not shown in FIG. 13B) can be provided between cavity substrate 10 and cavity structure source wafer 90 or seed layer(s) deposited on or over cavity structure source wafer 90 to facilitate forming cavity substrate 10. Cavity substrate 10 can comprise any other structures and materials can be deposited or patterned using photolithographic processes.

Figure 13E:
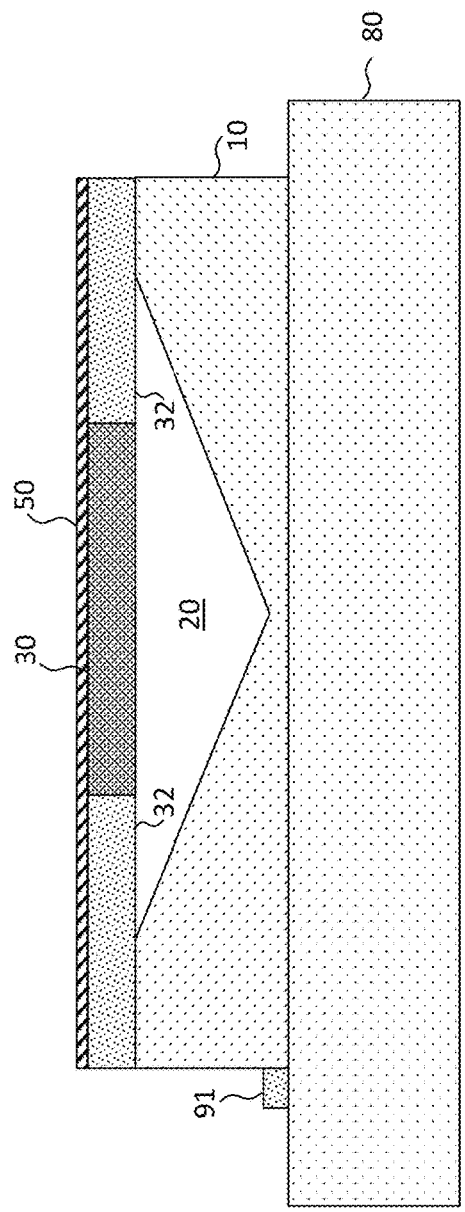
Figure 13F:
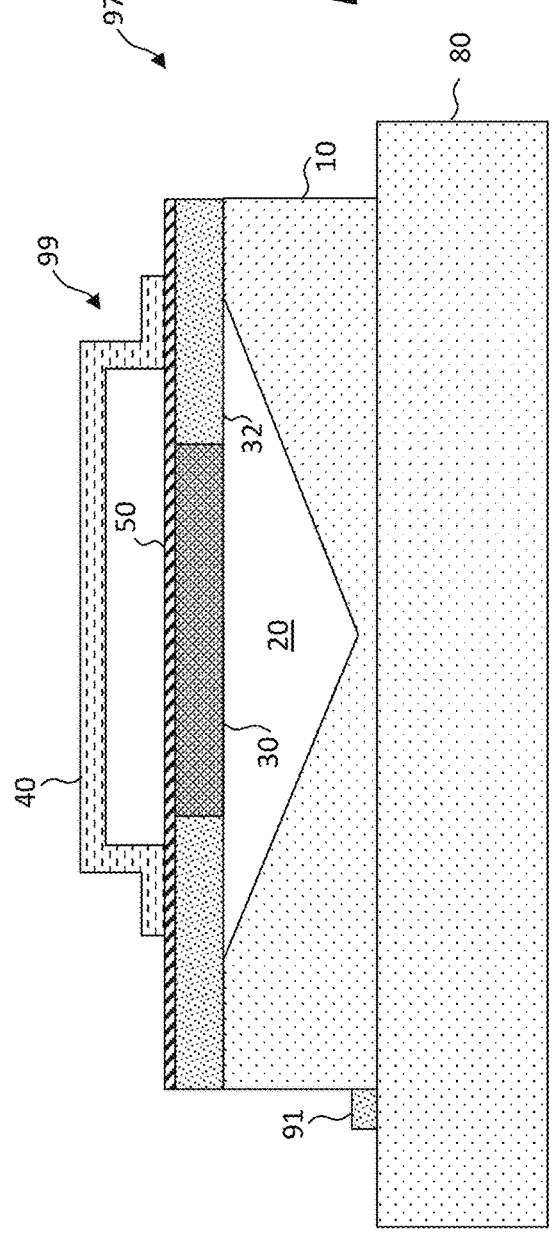

As shown in FIG. 13C and in step 120, component 30 is formed or disposed on or in cavity substrate 10. Component 30 can comprise various material(s) and structure(s) and can be an integrated circuit, a piezoelectric structure, or any other desirable component 30, for example comprising one or more of patterned or unpatterned semiconductor(s), piezoelectric materials such as potassium niobate or lead zirconate titanate, dielectric(s) such as silicon dioxide or silicon nitride, and conductive material(s) such as metals or transparent conductive oxides. Optional extended cavity walls 24E (not shown in FIG. 13C) can be disposed before, after, or during the construction or deposition of component 30 in optional step 130. In step 175 and as shown in FIG. 13D, cavity 20 is formed in cavity substrate 10 beneath component 30 and between component 30 and cavity structure source wafer 90 and component 30 is released from cavity substrate 10 and cavity substrate 10 is released from cavity structure source wafer 90. Cavity substrate 10 can be anisotropically etched, as shown with cavity floor 22 non-orthogonal to substrate surface 12, and a protection layer 36 (not shown in FIG. 13D) between component 30 and cavity substrate 10 provided. In some embodiments, a patterned sacrificial layer 92 with sacrificial portions 94 is provided beneath component 30 that is differentially etchable from component 30 and cavity substrate 10 and etched to form cavity 20 with cavity floor 22 substantially orthogonal to cavity walls 24. Component 30 and cavity substrate 10 are transfer printed in step 185 from cavity structure source wafer 90 to destination substrate 80 using a stamp 70 (e.g., as shown in FIGS. 9I and 9J), as shown in FIG. 13E. As shown in FIG. 13F, in step 150 cap 40 is transfer printed from a cap source wafer 62 onto or over cavity substrate 10 to form cavity structure 99. According to some embodiments, cap 40 is transfer printed (step 150) after cavity structure 99 is disposed on destination substrate 80. Component electrodes 50 can be electrically connected to destination substrate electrical connections 82 (e.g., electrical contact pads or electrical conductors, as shown in FIG. 11H). A subsequent encapsulation layer 60 (shown in FIG. 9F) can be disposed over cavity structure 99 in optional step 160 to complete cavity structure system 97 in step 195.

In some methods in accordance with FIG. 12, cap 40 can be disposed directly on destination substrate 80 (or layers disposed on destination substrate 80), rather than on cavity substrate 10, to form a structure, e.g., as illustrated in FIG. 5F.

Figure 14:
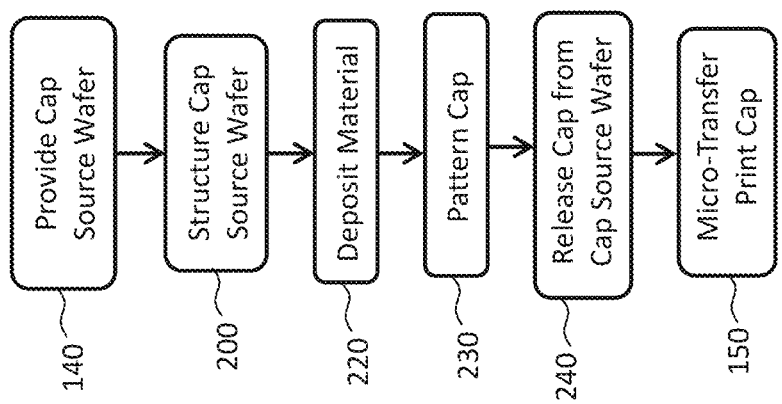
FIG. 14 is a flow diagram of micro-transfer printing and construction processes corresponding to FIGS. 13A to 13F and FIGS. 15A-15G according to illustrative methods of the present disclosure.
Figure 15D:
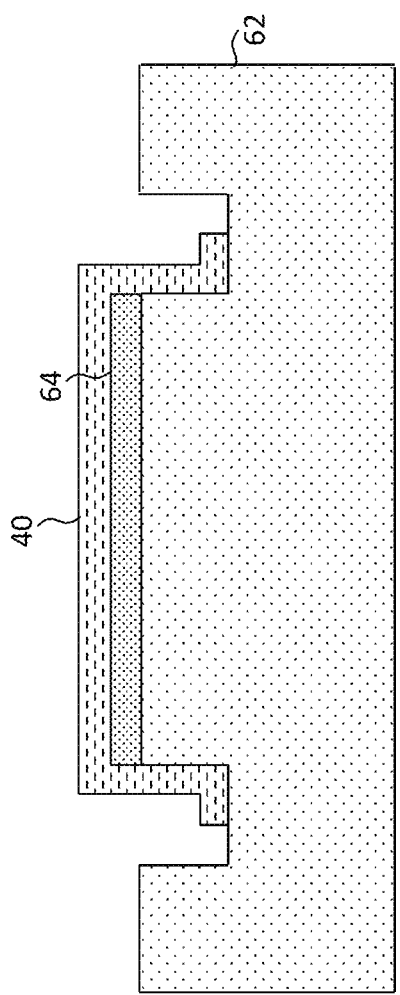
Figure 15E:
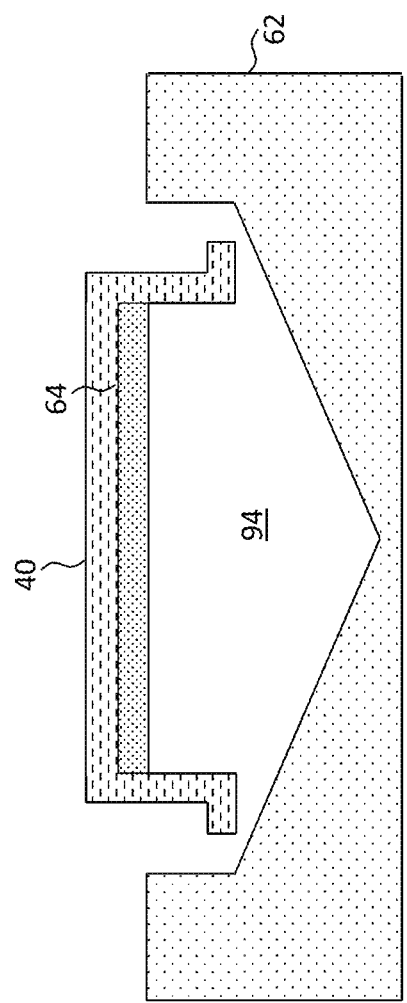
Figure 15F:
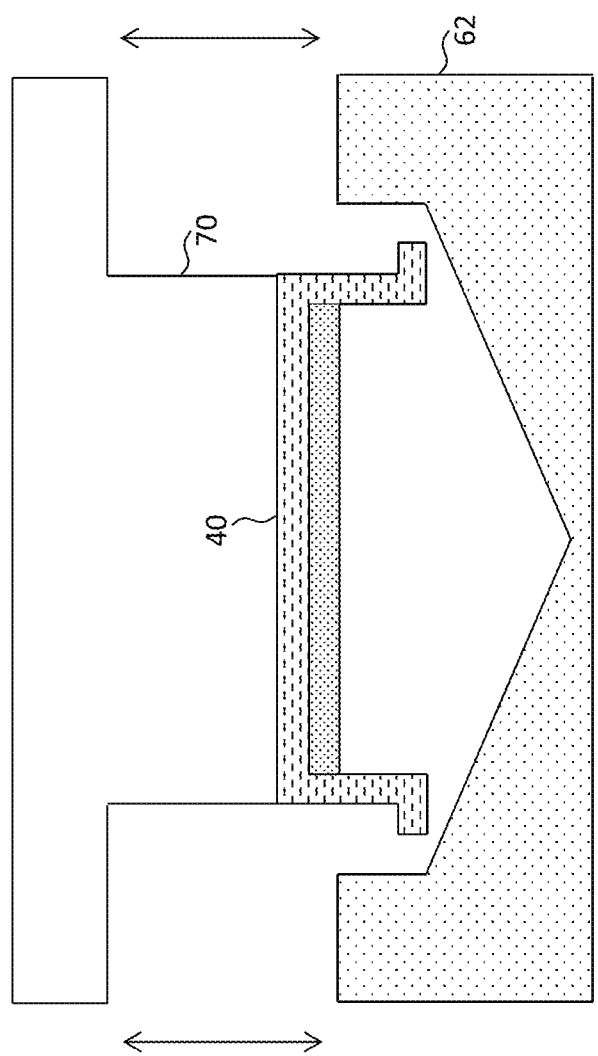
Figure 15G:
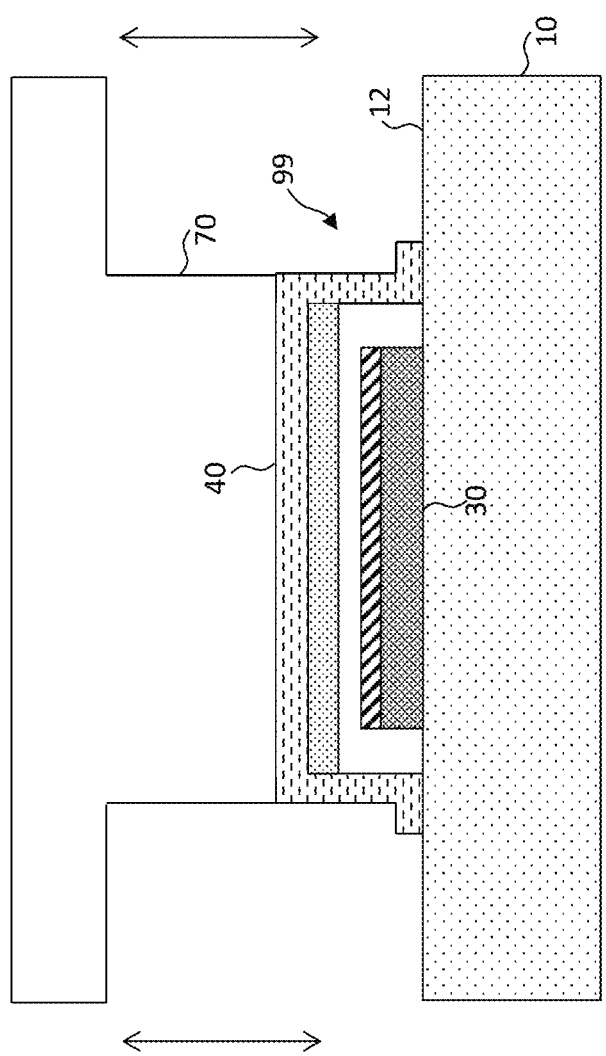
Figure 16A:
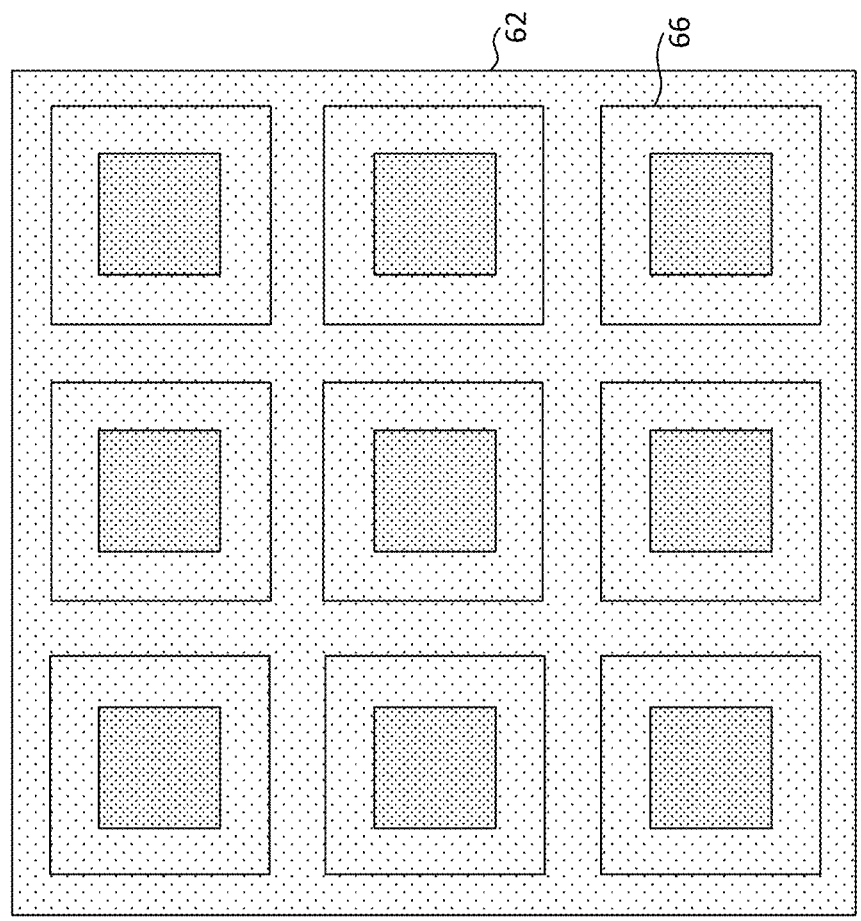
FIG. 16A is a plan view corresponding to FIG. 15C.
Figure 16B:
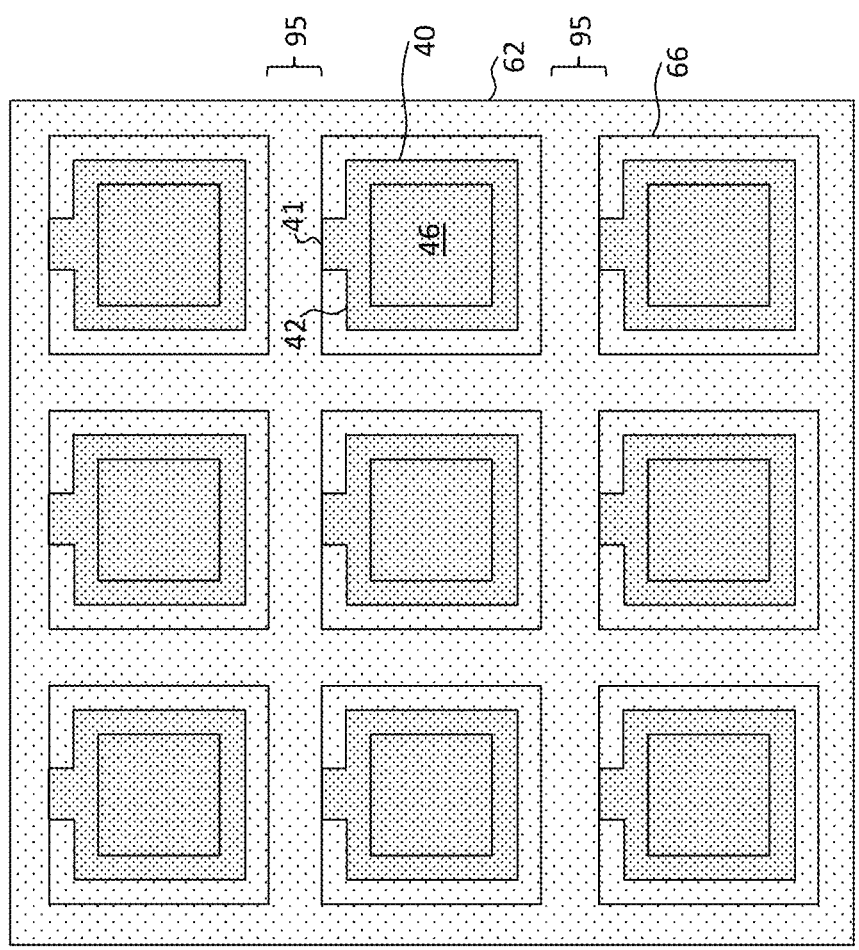
FIG. 16B is a plan view corresponding to FIGS. 15D and 17D.
Figure 16C:
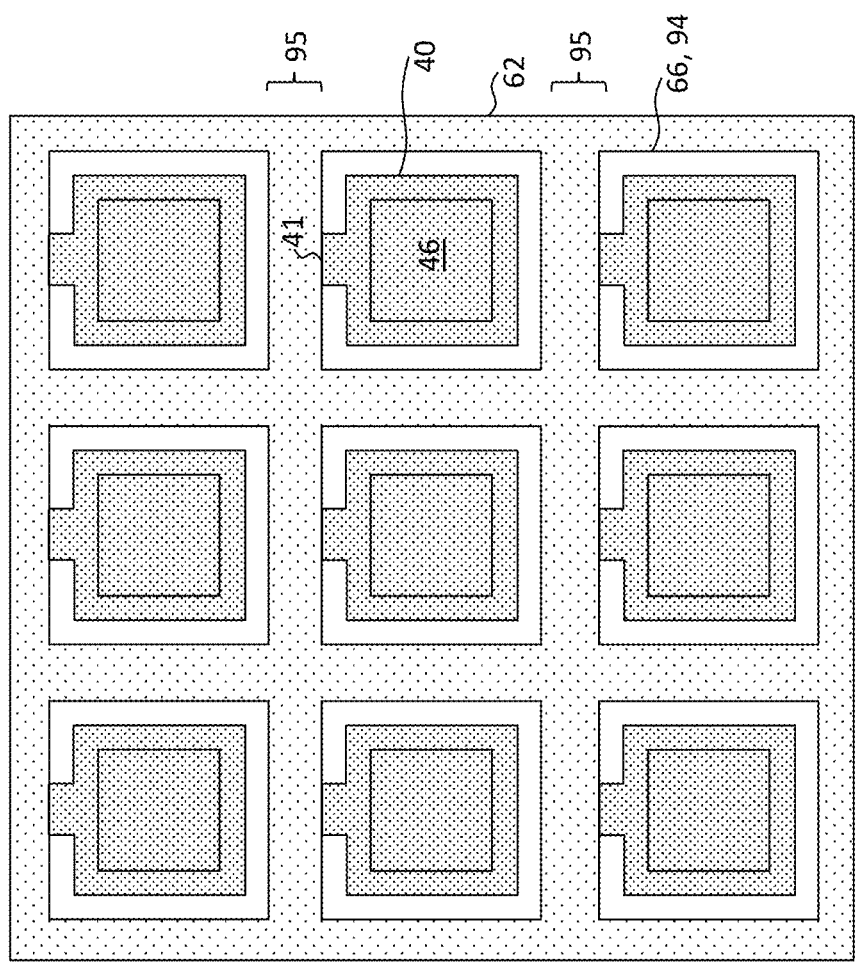
FIG. 16C is a plan view corresponding to FIGS. 15E and 17E according to illustrative methods of the present disclosure.

Cap 40 can be constructed and transfer printed according to various embodiments of the present disclosure, as illustrated in the successive cross sections of FIGS. 15A-15G, the plan views of FIGS. 16A-16C, and the successive cross sections of FIGS. 17A-17E and described with respect to the flow diagram of FIG. 14. Other methods and structures are evident to one of ordinary skill in the art based on these expressly described examples and the present disclosure is not limited to these illustrative examples.

As shown in FIGS. 15A-15G, in some embodiments of the present disclosure, a cap source wafer 62 is provided (e.g., as shown in FIG. 15A) in step 140 and a reinforcement layer 64 is provided over cap source wafer 62 (e.g., as shown in FIG. 15B). Cap source wafer 62 can be a silicon wafer, for example an anisotropically etchable source substrate, or any other suitable substrate. Reinforcement layer 64 can be, for example, a dielectric such as an oxide or a nitride, a metal, or other materials, and can be deposited by evaporation, oxidation, sputtering, or coating. For example, reinforcement layer 64 can comprise a thermal oxide formed by exposing an exposed layer of silicon from cap source wafer 62 to an oxygen plasma at an elevated temperature to convert a few microns of the exposed silicon layer to silicon dioxide (or other silicon oxide, $SiO_x$, for example having $1<x<2$). Cap tether 41 can also comprise a thermal oxide (e.g., as shown in FIG. 16B).

Cap source wafer 62 and reinforcement layer 64 are patterned 200 to form a structure with a non-planar topography having cap source wafer trenches 66, for example by etching through a patterned mask, as shown in FIG. 15C and the top view of FIG. 16A. Reinforcement layer 64 can provide additional structural support to cap 40. For example, if cap 40 includes relatively soft metals, a more rigid reinforcement layer 64 can help to avoid damage to cap 40 (such as unwanted bending of cap top portion 46), particularly when cap 40 is printed and pressed into a substrate by a stamp. As shown in FIGS. 15D and 16B, material such as a nitride (e.g., silicon nitride) is disposed in step 220 and patterned in step 230 (in combined step 210 of FIG. 12) over the structure to form a cap 40, for example using plasma-enhanced chemical vapor deposition (PECVD) to form a layer having a thickness of a few microns (e.g., 1-5 microns or approximately 2 microns) and then patterning the layer. Without wishing to be bound by any particular theory, CVD-deposited silicon nitride (or other nitride) can generally form stronger cap wall portions 44 than could be formed by alternative thermal oxide processes, although at slower rates. Reinforcement layer 64 is indicated as a separate layer from cap 40 in FIG. 15D but can generally be considered to be included in cap 40 (e.g., the cap illustrated in FIG. 15D, which includes reinforcement layer 64, and is subsequently released and printed in FIGS. 15E-G, can be, but is not necessarily, formed and used in embodiments described throughout the disclosure where generally a reinforcement layer 64 is not separately shown or described). Cap 40 is connected to cap anchors 95 by cap tethers 41. Cap tethers 41 can comprise the same material as cap 40 and made in common deposition and patterning steps. For example, a PECVD nitride deposition can be made and patterned with a mask that simultaneously forms cap 40 (e.g., including reinforcement layer 64) and corresponding cap tether(s) 41, and optionally cap anchors 95 that keep cap 40 attached to cap source wafer 62 after etching.

As shown, for example, in FIGS. 15E and 16C, in step 240 cap source wafer 62 can be etched, for example anisotropically etched or another release layer (e.g., a patterned buried oxide sacrificial portion of a sacrificial layer 92) is etched, including the structure beneath a cap top portion 46 of cap 40, to release cap 40 from cap source wafer 62, leaving cap 40 suspended over gap 94 in cap source wafer 62 and connected to cap anchors 95 of cap source wafer 62 by cap tethers 41. Gap 94 is an etched sacrificial portion 94. Cap 40 can be transfer printed in step 150, e.g., with a stamp 70 as shown in FIG. 15F, from cap source wafer 62 to cavity substrate 10 (shown in FIG. 15G) and stamp 70 removed. FIG. 15G can correspond to FIG. 9D, for example. Cap 40 can be transparent to facilitate optical alignment during transfer printing and inspection (e.g., of final alignment, component 30, cavity 20, or other constituent(s) of cavity structure 99) after transfer printing. In some embodiments, cap 40 is transparent to certain frequencies of electromagnetic radiation so that electromagnetic radiation (e.g., visible light) having one or more frequencies in that range that is emitted from component 30 can be transmitted through cap 40.

In some embodiments, cap 40 is formed over component 30 such that in cavity structure 99, component 30 is connected to and suspended from cap 40. Such a structure can be formed by, for example, forming component 30, performing a patterned deposition to deposit material onto component 30 such that it protrudes from a top surface thereof and also defines cap wall portion(s) 44, performing a patterned or unpatterned deposition to form cap top portion 44, and etching under component 30 to remove any material under component 30 (e.g., such that combined cap 40 and component 30 can be together transfer printed) and between cap wall portion(s) 44 and the material protruding upward from component 30 to cap top portion 46. Thus, in some embodiments, cap 40 is also component support 32. In some embodiments, component support 32 protrudes from a top surface of component 30.

Figure 17A:
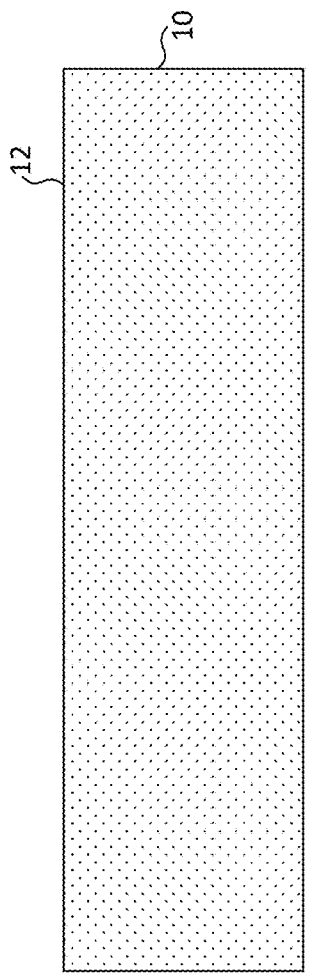
Figure 17B:
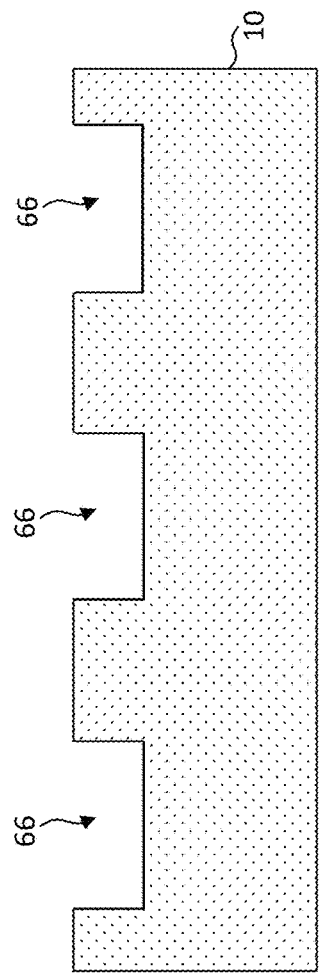
Figure 17C:
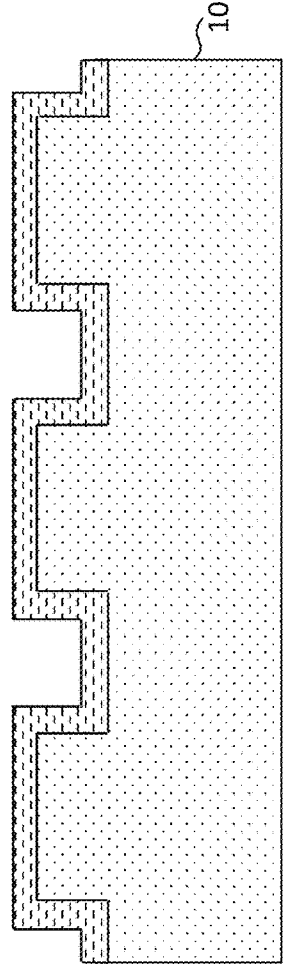

In some illustrative embodiments illustrated in FIG. 17A-17E, cap 40 without reinforcement layer 64 is constructed, for example in an oxide material, by providing cap source wafer 62 (shown in FIG. 17A) in step 140 and structuring the surface of cap source wafer 62, for example using patterned etching (as shown in FIG. 17B), in step 200 to form cap source wafer trenches 66. In step 220, a layer of cap material is deposited over the structure (shown in FIG. 17C), for example by forming a thermal silicon oxide, $SiO_x$, layer (e.g., silicon dioxide layer) formed by oxidizing silicon with an oxygen plasma at elevated temperatures and patterning the cap material in step 230 as shown in FIG. 17D. The thermal oxide can also from a cap tether 41. Cap 40 is released by etching in step 240 as described above with respect to FIG. 9E and shown in FIGS. 17E and 16C and material beneath cap top portion 46 will readily etch together with the sacrificial portion 94 that releases cap 40. Cap 40 can then be printed as shown in FIGS. 9I and 9J in step 150.

In some embodiments, cap 40 is transfer printed with a stamp 70 that contacts cap top portion 46 (as shown in FIG. 9I). In some embodiments, cap 40 is transfer printed with a stamp 70 that contacts flat cap contact portion(s) 42 (e.g., as shown in FIG. 7J1). By contacting only flat cap contact portion(s) 42, stress on cap 40 is reduced when printed onto cavity substrate 10 and a reinforcement layer 64 can be unnecessary, since cap contact portion 42 is supported by cavity substrate 10 during the printing process. In contrast, if only flat cap contact portion(s) 42 are contacted during printing, there is no structural support for cap top portion 46 during printing onto cavity substrate 10.

Figure 18A:
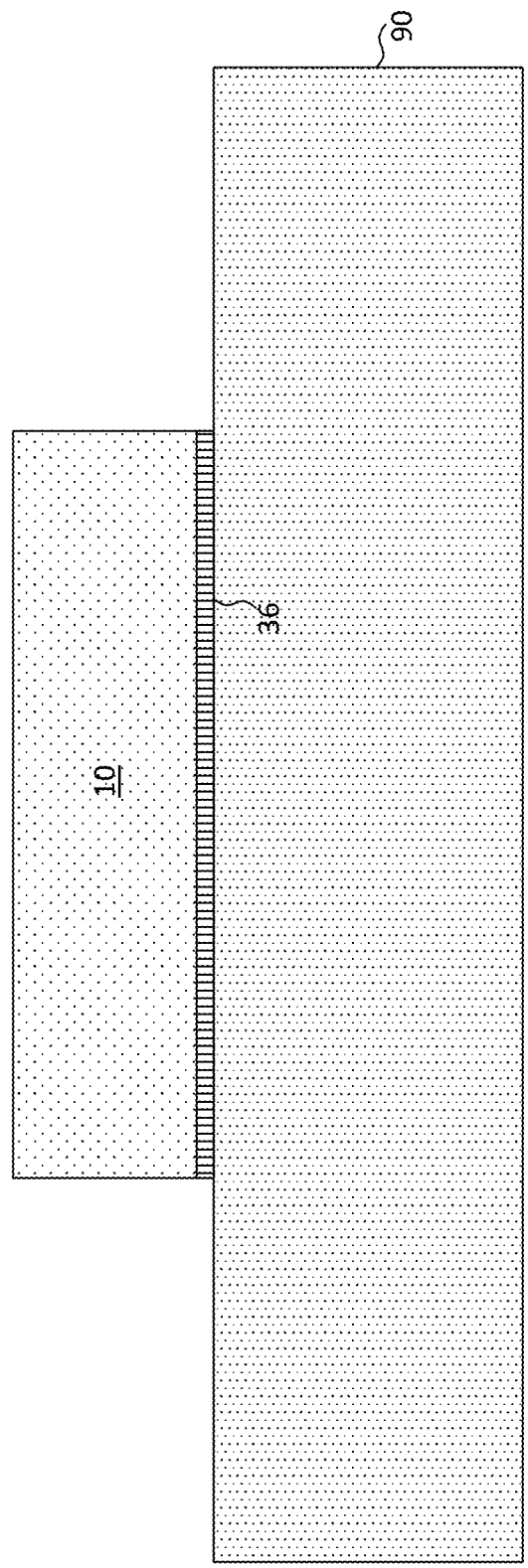
FIGS. 18A-18B are successive cross sections according to illustrative embodiments of the present disclosure.
Figure 18B:
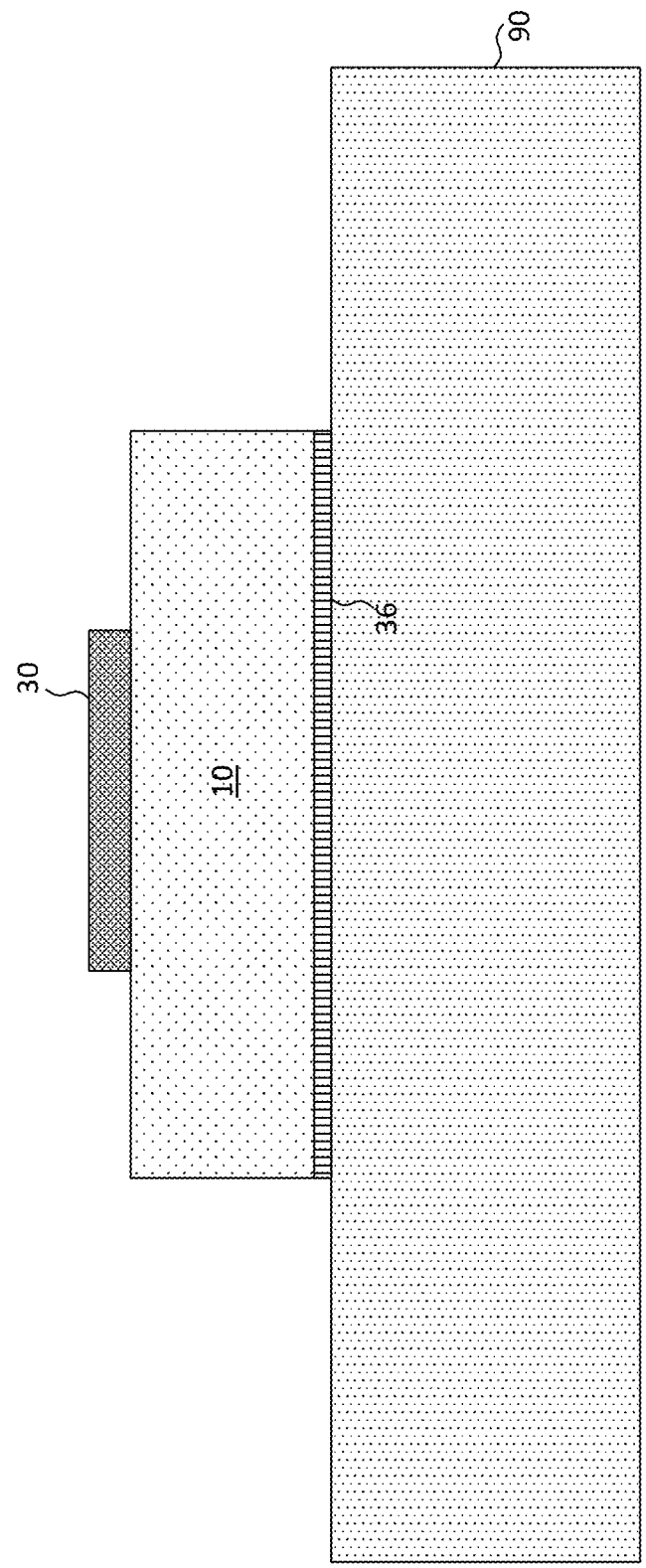

Cap 40 can be transparent and can, for example, comprise a silicon oxide ($SiO_x$), such as silicon dioxide (x=2). According to some embodiments of the present disclosure, cavity substrate 10 can be patterned (e.g., as shown in FIG. 18A) before component 30 is disposed or patterned on cavity substrate 10 (e.g., as shown in FIG. 18B), for example in contrast to FIGS. 7A and 7B, in which cavity substrate 10 is patterned after component 30 is disposed or patterned.

Components Supported by Cavity Floor

According to some embodiments of the present disclosure, component 30 in cavity 20 of cavity substrate 10 is physically connected by component support 32 to cavity walls 24 or substrate surface 12, as shown in FIGS. 2A-3B and 5A-13F. According to some embodiments of the present disclosure, component 30 in cavity 20 of cavity substrate 10 is physically connected by component support 32 to cavity floor 22, as shown, for example, in FIGS. 1, 4B, and 4C and as described further subsequently.

In some embodiments, a component 30 on a component support 32 on substrate surface 12 of cavity substrate 10 extends over an edge of component support 32 in two dimensions, for example as shown in FIG. 1. Component 30 can have a component top side 38 and a component bottom side 39 opposite component top side 38. Component bottom side 39 can be adhered to component support 32 and extends over at least one edge of component support 32. In some embodiments, a component 30 comprises a component material different from a component support 32 material. Component 30 can comprise a separated or broken (e.g., fractured) component tether 31. In some embodiments, a component 30 is adhered or attached to a cavity substrate 10 and component support 32 only by component bottom side 39.

In some embodiments, a component 30 on a component support 32 extends over an edge of component support 32 in one dimension or direction and does not extend over an edge of component support 32 in an orthogonal dimension or direction (e.g., as shown in FIGS. 4A-4C). In some such embodiments, for example, a component support 32 can form a ridge with a length greater than a width that extends in a length direction beyond a component 30 disposed on component support 32 with a component center disposed over component support 32. Thus, according to some embodiments, component 30 extends over one side of component support 32, extends over two sides of component support 32, extends over four sides of component support 32, or extends over opposing sides of component support 32.

In some embodiments, a component support 32 extends over substrate surface 12 of cavity substrate 10 to form a ridge that has a length greater than a dimension of component 30, for example a component support 32 length parallel to substrate surface 12 greater than a width W of component 30 in which the length of component 30 is oriented orthogonally to the length of component support 32 (e.g., as shown in FIGS. 4A, 4C). In some such embodiments, more than one component 30 can be printed on a single ridge or component support 32. Thus, if a component 30 is a first component 30 adhered to a component support 32, cavity structure 99 can comprise a second component 30 adhered to component support 32. The ridge (component support 32) can have a top side opposite cavity substrate 10 to which a component bottom side 39 of a component 30 is adhered. In some embodiments, a component support 32 extends in a straight line and has a rectangular cross section parallel to substrate surface 12 of cavity substrate 10. In some embodiments, a component support 32 extends in one or more directions and can form a square, rectangle, curve, circle, ellipse, polygon, U-shape, X-shape, or other arbitrary collection of connected line segments or curved segments over substrate surface 12. In some embodiments, a component 30 is micro-transfer printed to two or more component supports 32.

Figure 30A:
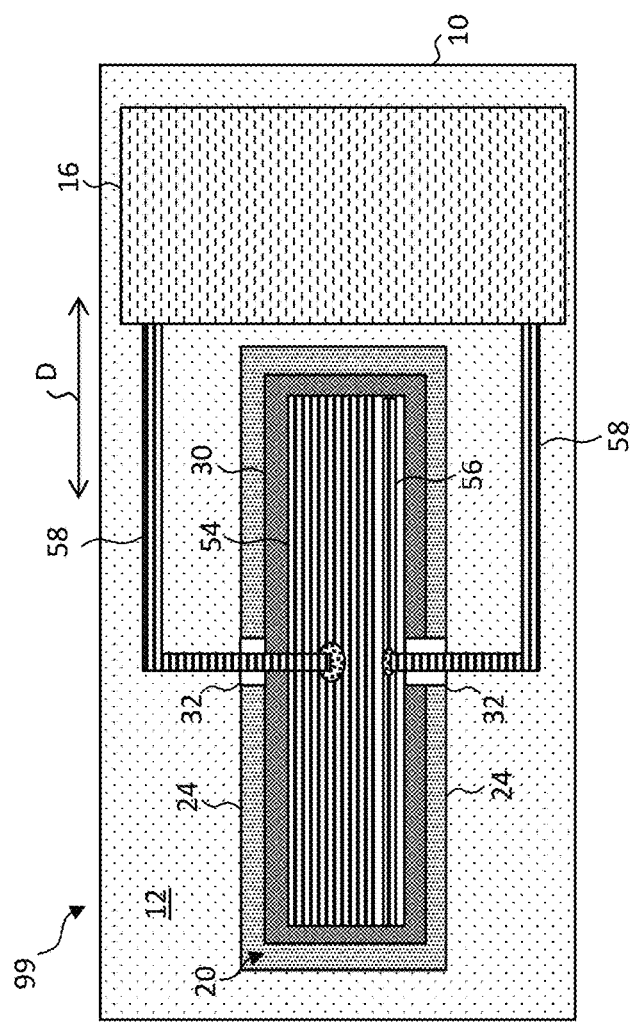
FIG. 30A is a top view according to illustrative embodiments of the present disclosure and FIG. 30B is a partial mask layout for constructing the embodiment of FIG. 27A.

In some embodiments of the present disclosure, a micro-transfer-printed component 30 does not extend over an edge of a component support 32 on substrate surface 12 of cavity substrate 10 (e.g., as in FIG. 7D). An edge of component 30 can be aligned with an edge of a component support 32 on which component 30 is micro-transfer printed or can be spatially set back from a component support 32 edge. Components 30 can be adhered to component supports 32 with a patterned layer of adhesive 48, for example coated on component support 32, or provided as a lamination, or by van der Waals forces. As noted above, components 30 can comprise active component circuits. Cavity substrate 10 can comprise cavity substrate circuits 16 formed in, on, or disposed on cavity substrate 10 (as shown in FIG. 30A discussed below) that are electrically connected to the active circuits in components 30.

In some embodiments, any one, combination, or all of a component center, centroid, or center of mass (any one or more of which is referred to generically as a component center) of component 30 can be disposed over component support 32 so that component support 32 is between component center, component centroid, or component center of mass and cavity substrate 10. It is understood that in a given arrangement, a component center of mass may not be in the same location as a center or centroid of component 30. In some embodiments, this arrangement can provide a robust mechanical structure that can help keep component 30 adhered to component support 32, especially when exposed to mechanical stress, such as vibration.

According to some embodiments and as illustrated in FIG. 20A, a cavity structure 99 comprises a cavity substrate 10 having a substrate surface 12, a cavity 20 formed in cavity substrate 10, and a component support 32 (e.g., a post 32) protruding from cavity floor 22. A component 30 is disposed on component support 32. Component 30 has a component top side 38 adjacent substrate surface 12 and a component bottom side 39 opposite component top side 38 and adjacent to a bulk of cavity substrate 10. Component bottom side 39 is adhered to component support 32 and component 30 extends over at least one edge of component support 32. Component 30 can be adhered or attached to cavity substrate 10 or component support 32 only on component bottom side 39. One or more component electrodes 50 are disposed on component 30. The one or more component electrodes 50 can comprise a component top electrode 54 disposed on component top side 38, a component bottom electrode 56 disposed on component bottom side 39, or both. Component top electrodes 54 and component bottom electrodes 56 are collectively referred to as component electrodes 50. FIG. 20B illustrates an embodiment in which component 30 is disposed on component support 32 (in this case, a post 32) as in FIG. 1 with cap 40 in a tophat configuration adhered to cavity floor 22 and encapsulated with encapsulation layer 60.

According to some embodiments of the present disclosure, cavity structure 99 comprises a cavity 20 formed or disposed in or on substrate surface 12 of cavity substrate 10. Cavity 20 can have a cavity floor 22 and cavity walls 24. Component support 32 (e.g., post 32) can be disposed on cavity floor 22. Cavity structure 99 comprises a cap 40 disposed over cavity 20 to enclose (e.g., surround) cavity 20. In some embodiments, cap 40 can have a small opening (e.g., hole) through cap 40 so that enclosed cavity 20 is not completely sealed (e.g., environmentally) (e.g., such that gas and/or liquid can enter and exit enclosed cavity 20). In some embodiments, cap 40 is adhered to cavity walls 24, for example with a patterned layer of adhesive 48 rather than an unpatterned layer of adhesive 48 as shown in FIG. 1. In some embodiments, the patterned layer of adhesive 48 is applied to a bottom side or surface of cap 40 adjacent to cavity 20. In some embodiments, the patterned layer of adhesive 48 is applied to cavity walls 24 or substrate surface 12.

In some embodiments, component 30 is micro-transfer printed from a component source wafer and includes a separated or broken (e.g., fractured) component tether 31. In some such embodiments, component 30 can be adhered to component support 32, for example with a patterned layer of adhesive 48. In some embodiments, component 30 is not micro-transfer printed and is instead, for example, constructed in place using photolithographic techniques, as described further subsequently. Similarly, in some embodiments, cap 40 is micro-transfer printed from a cap source wafer 62 and includes a separated or broken (e.g., fractured) cap tether 41. In some embodiments, cap 40 is not micro-transfer printed and is, for example, laminated or spread over cavity 20 to enclose cavity 20. According to some embodiments, a cavity structure 99 can be or is printed or placed on a destination substrate 80, such as a printed circuit board (PCB) or a glass, polymer, or semiconductor substrate, for example. In some embodiments, a cavity structure 99 can be constructed on, for example, a semiconductor cavity structure source wafer 90 with sacrificial portions 94 and structure anchors 96 and structure tethers 91 connecting cavity structures 99 to structure anchors 96 (e.g., as shown in FIGS. 7A-7L2 and 9A-9K discussed previously). A method can comprise micro-transfer printing such a cavity structure 99 to a destination substrate 80. In some embodiments, cavity structure 99 is not micro-transfer printable or micro-transfer printed and is instead, for example, constructed in place using photolithographic techniques.

According to some embodiments, two or more component supports 32 are disposed within cavity 20 or two or more components 30 are disposed within cavity 20, or both (e.g., each component 30 on a respective component support 32). In some embodiments, a component support 32 within cavity 20 can have two or components 30 disposed on each component support 32. According to some embodiments, one or more component electrodes 50 of the two or more components 30 disposed within cavity 20 are electrically connected, for example a component top or bottom electrode 54, 56 of a first component 30 is electrically connected to a component top or bottom electrode 54, 56 of a second component 30, where first and second components 30 are both disposed within a common cavity 20 and can be, but are not necessarily, disposed on a common component support 32, e.g., to form a common circuit (e.g., as described further below with respect to FIGS. 32-33).

Figures 21, 22:
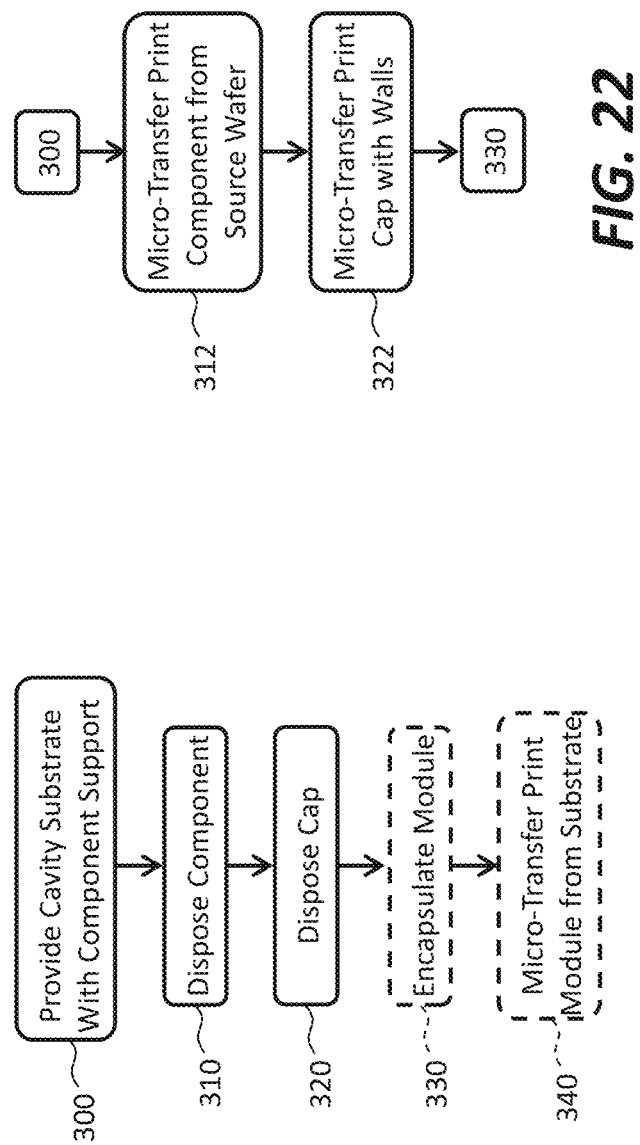
FIGS. 21-25 are flow diagrams of construction methods according to illustrative embodiments of the present disclosure.

According to some embodiments and referring to the flow diagram of FIG. 21 and cavity structure 99 of FIGS. 20A and 20B, a method of making a cavity structure 99 comprises providing a cavity substrate 10 having a substrate surface 12 and a component support 32 (e.g., post 32) protruding from cavity floor 22 of cavity 20 formed in cavity substrate 10 or a layer disposed on cavity floor 22 in step 300. In step 310, a component 30 is disposed on component support 32, component 30 having a component top side 38 and a component bottom side 39 opposite component top side 38. Component bottom side 39 is disposed on component support 32 and component 30 extends over at least one edge of component support 32. One or more component electrodes 50 are disposed on component 30. In step 320, a cap 40 is disposed over component 30 and cavity substrate 10 to enclose component 30 in cavity 20. In optional step 330, cavity structure 99 is encapsulated and in optional step 340, cavity structure 99 is micro-transfer printed.

In some embodiments, providing component electrodes 50 can comprise providing a component top electrode 54 disposed on component top side 38, providing a component bottom electrode 56 disposed on component bottom side 39, or both. In some embodiments, a substrate is patterned to form cavity substrate 10 and component support 32, for example a glass or polymer substrate patterned using photolithographic methods and materials.

In some embodiments and as shown in FIG. 22, component 30 is provided in step 310 by micro-transfer printing component 30 from a component source wafer to component support 32 (step 312). In some embodiments, a cavity 20 is provided in or on a cavity substrate 10, cavity 20 having a cavity floor 22 and cavity walls 24. In some embodiments, cavity 20 is provided by micro-transfer printing a cap 40 comprising extended cavity walls 24E from a cap source wafer 62 to substrate surface 12 or a layer on substrate surface 12 of cavity substrate 10 in step 322.

Figure 24:
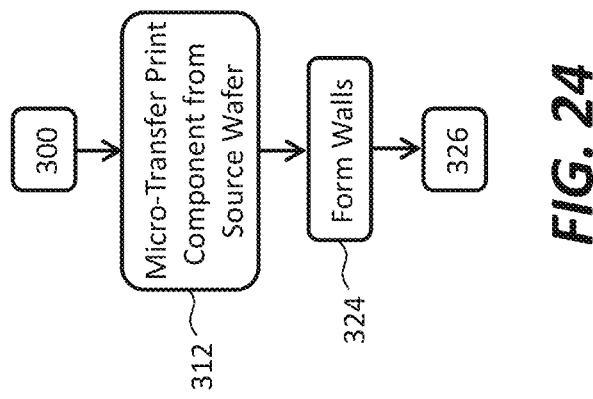
Figure 23:
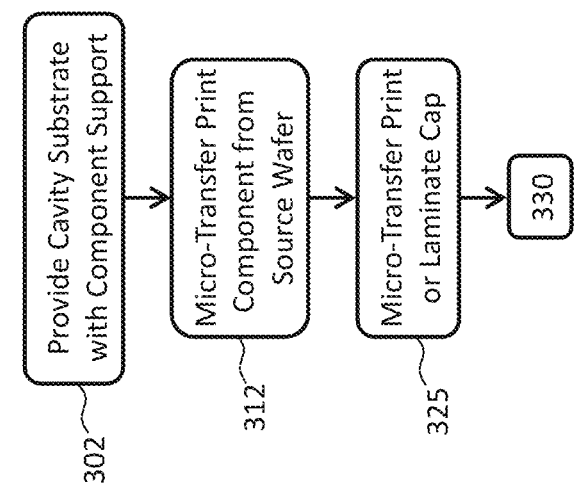

In some embodiments and as shown in FIG. 23, cavity 20 is provided by forming extended cavity walls 24E on substrate surface 12 or a layer on substrate surface 12 of cavity substrate 10 in step 302 as part of forming cavity substrate 10 and cavity 20, for example using photolithographic materials and processes. Component 30 can then be provided in step 312, for example by micro-transfer printing component 30 from a component source wafer to component support 32. Cap 40 can be provided by micro-transfer printing or laminating cap 40 to extended cavity walls 24E in step 325. As illustrated in the flow diagram of FIG. 24, in some embodiments, any one or more of cavity 20, extended cavity walls 24E, and component support 32 are formed (step 324) after component 30 is disposed on a component support 32 (step 314).

Figure 25:
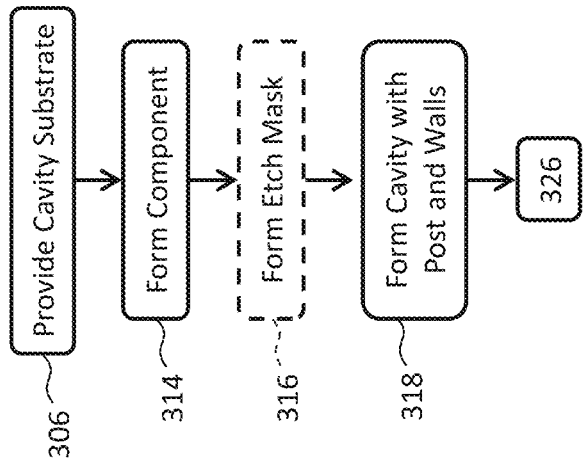

As described with respect to FIGS. 21-24, in some embodiments, component 30 can be provided by micro-transfer printing. In some embodiments, component 30 is constructed or formed on or over cavity substrate 10 or a layer disposed on cavity substrate 10 before cavity 20 is formed. As shown in FIG. 25, a cavity substrate 10 can be provided in step 306, a component 30 formed over, on, or in cavity substrate 10 in step 314, and an optional etch-mask layer provided and patterned in step 316. In step 318, cavity substrate 10 is etched to form cavity substrate 10 with cavity 20, cavity walls 24, any extended cavity walls 24E, and component support 32, providing cavity structure 99.

Components Disposed Over Divided Cavity

Figure 26A:
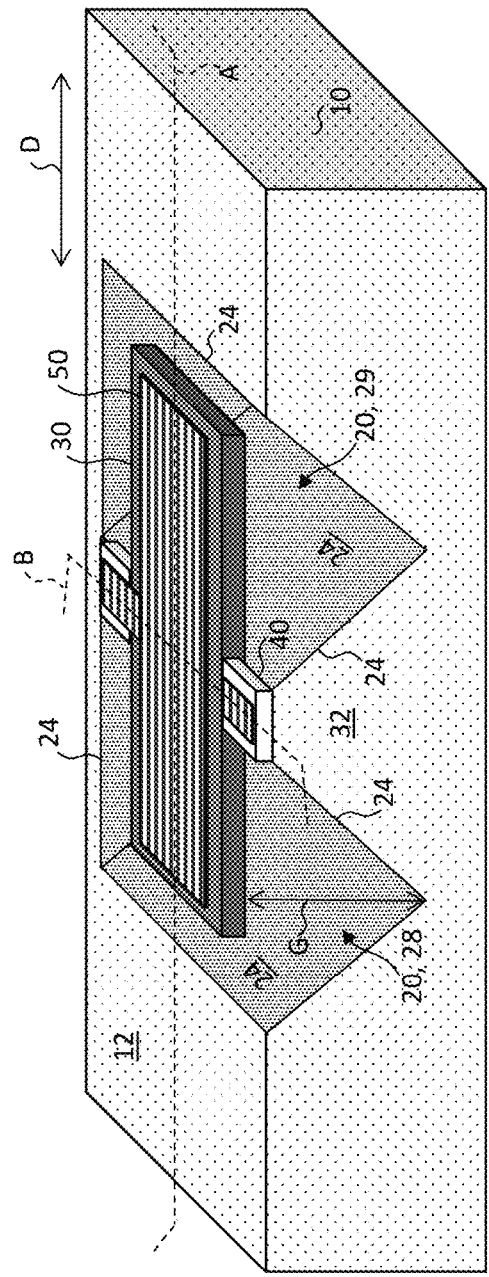
FIG. 26A is a cut-away perspective according to illustrative embodiments of the present disclosure.
Figure 26B:
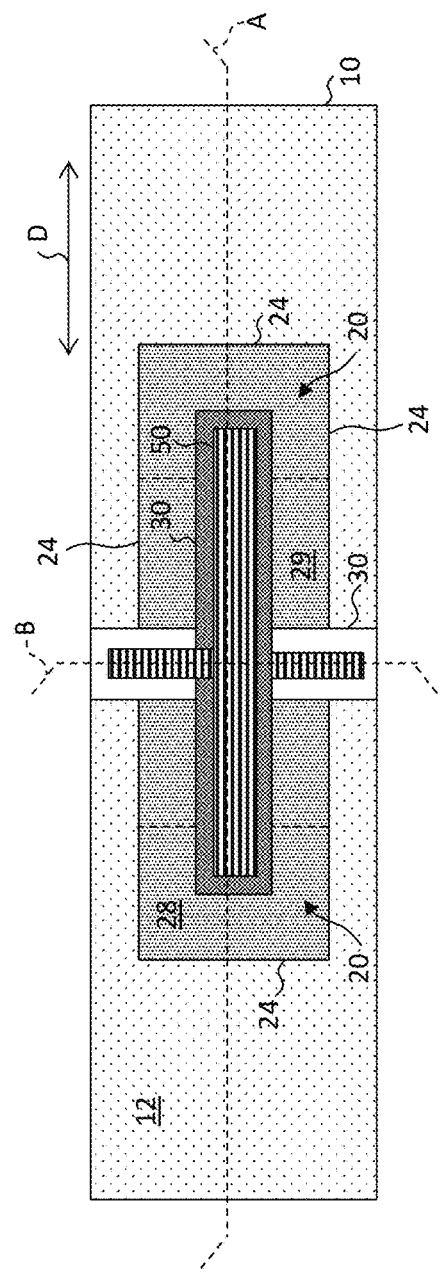
FIG. 26B is a top view of the structure of FIG. 26A according to illustrative embodiments of the present disclosure.
Figure 26C:
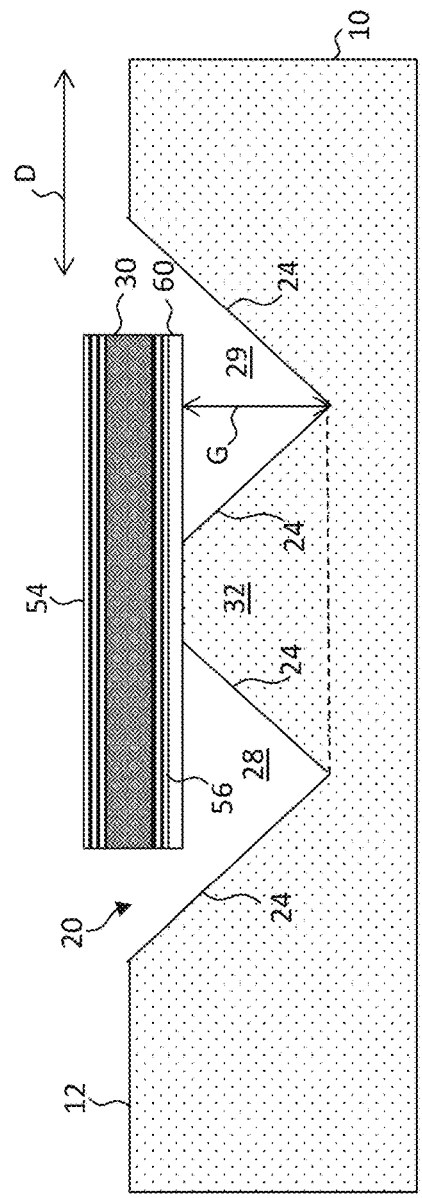
FIG. 26C is a length-wise cross section of the structure of FIGS. 26A and 26B taken along cross section line A according to illustrative embodiments of the present disclosure.
Figure 26D:
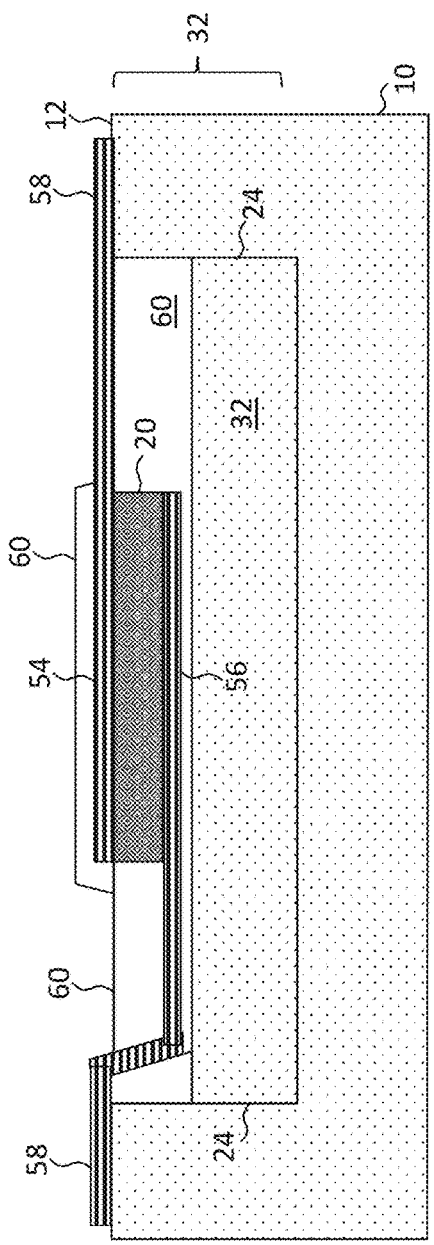
FIG. 26D is a width-wise cross section of the structure of FIGS. 26A and 26B taken along cross section line B according to illustrative embodiments of the present disclosure.
Figure 26E:
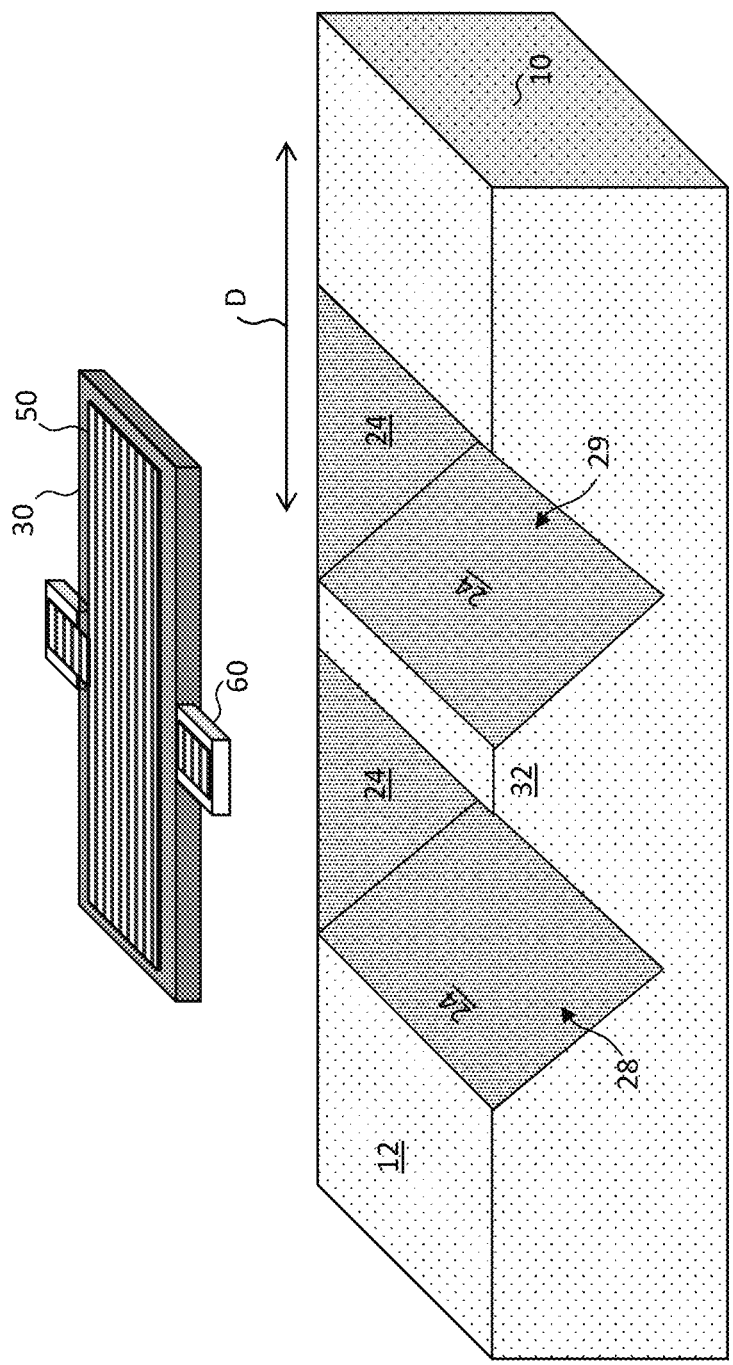
FIG. 26E is an exploded cut-away perspective of the structure of FIG. 26A according to illustrative embodiments of the present disclosure.
Figure 26F:
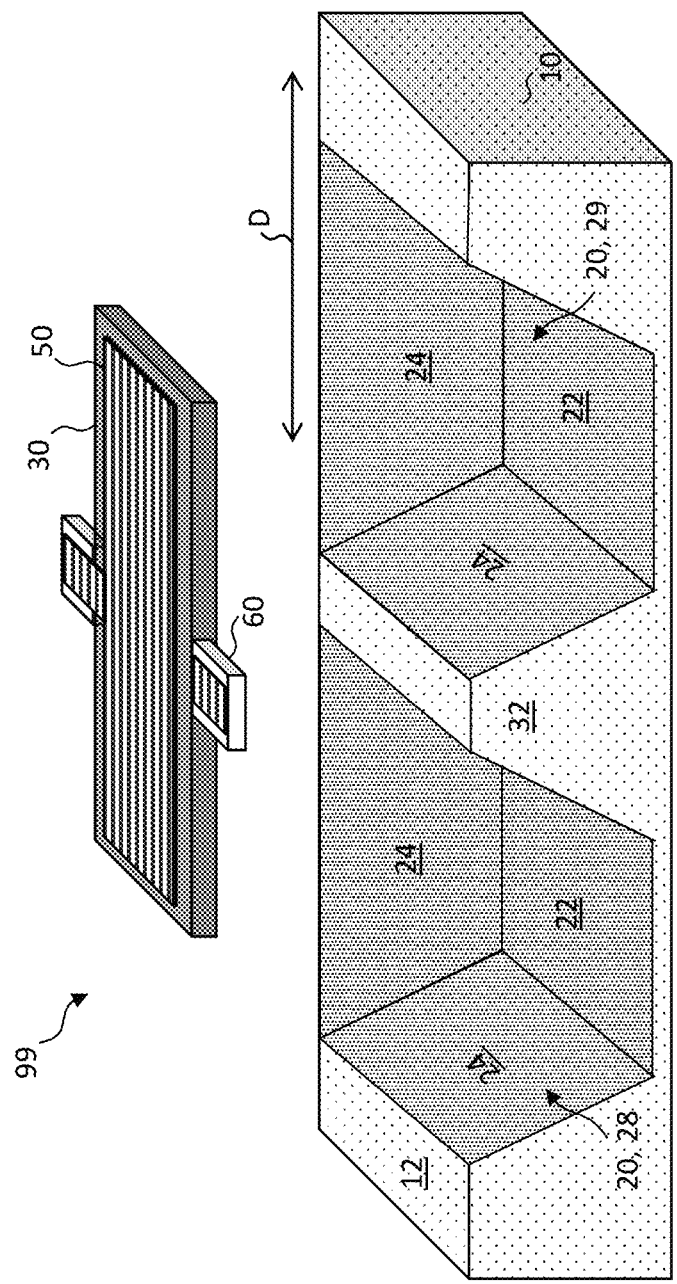
FIG. 26F is an exploded cut-away perspective according to illustrative embodiments of the present disclosure.

According to some embodiments of the present disclosure and as shown in FIGS. 26A-26F and 27A-27B, a cavity structure 99 comprises a cavity substrate 10 having a substrate surface 12. A cavity 20 is disposed in or on cavity substrate 10. In some embodiments, a cavity 20 can have a cavity floor 22 (e.g., a bottom of cavity 20 as shown in FIG. 26F). Cavity 20 comprises opposing cavity walls 24 that can each be a part of cavity substrate 10 and extend to substrate surface 12 or project from cavity substrate 10 over substrate surface 12 with extended cavity walls 24E (e.g., as in FIG. 2A). Cavity walls 24 can extend in a length direction greater than a width direction of cavity 20 and can extend in a wall direction D that is substantially parallel to substrate surface 12 of cavity substrate 10. A component support 32 (e.g., wall or ridge) extends from opposing cavity walls 24 so that component support 32 at least partially divides cavity 20, for example into first cavity portion 28 and second cavity portion 29. Cavity 20 can also comprise cavity walls 24 disposed at ends of cavity 20 opposite component support 32. Cavity walls 24 can also be walls of component support 32, as shown in FIG. 26A.

A component 30 can be disposed on or in contact (e.g., direct contact) with component support 32 and can extend from component support 32 into cavity 20 over cavity floor 22. Component 30 can extend in wall direction D beyond component support 32 in one or two directions and a portion of component 30 can be at least partially separated by a gap G from cavity substrate 10 (shown in cross section 26C), for example separated from a bottom of cavity 20 (e.g., cavity floor 22). Thus, the extended portions (ends) of component 30 are not in contact (e.g., direct physical contact) with cavity substrate 10 and are suspended over cavity floor 22 in cavity 20. Indeed, with the exception of the portion of component 30 in contact with component support 32, component 30 is not in contact with any cavity substrate 10 structure, such as cavity walls 24, or a bottom (cavity floor 22) of cavity 20. The portion of component 30 in contact with component support 32 can be no more than 50% of the area or dimension (e.g., length) of a surface of component 30 (e.g., no more than 40% of the area or dimension, no more than 30% of the area or dimension, no more than 20% of the area or dimension, no more than 10% of the area or dimension, or no more than 5% of the area or dimension). Suitable gaps G can have a size of no more than ten microns (e.g., no more than five microns, no more than two microns, or no more than one micron), for example.

Component support 32 can extend entirely along a height of cavity walls 24 so that the top of component support 32 can be substantially co-planar with substrate surface 12 or can extend to only a portion of and less than the height of cavity walls 24 (e.g., as shown in FIGS. 26C and 26D). Thus, component support 32 can extend from a bottom of cavity 20 to a top of cavity 20 or only part-way to the top of cavity 20, for example where a top of cavity 20 is coincident with substrate surface 12 of cavity substrate 10. Component 30 or a surface of component 30 can be co-planar with substrate surface 12 or layers (e.g., component top and bottom electrodes 54, 56) provided on component 30 can be co-planar with substrate surface 12. In some embodiments, component 30 or layers on component 30 are not co-planar with substrate surface 12. Component 30 can protrude above or be entirely disposed above substrate surface 12.

In some embodiments of a cavity structure 99 of the present disclosure, cavity substrate 10 has a substrate surface 12 and component 30 is disposed within cavity 20 so that a component surface 34 of component 30 opposite cavity substrate 10 does not extend beyond substrate surface 12. In some embodiments, component support 32 can extend to substrate surface 12 and component 30 can be disposed at least partially above substrate surface 12 in a direction opposite cavity substrate 10. In some embodiments of a cavity structure 99 of the present disclosure, cavity substrate 10 has a substrate surface 12 and a component surface 34 of component 30 opposite cavity substrate 10 extends beyond substrate surface 12 and protrudes above substrate surface 12 so that component 30 is disposed at least partially above substrate surface 12. In some embodiments, component 30 is disposed completely above substrate surface 12.

Component support 32 can at least partially divide cavity 20 into first and second cavity portions 28, 29 and component 30 can extend into first cavity portion 28 and second cavity portion 29. For example, a first end of component 30 can extend into first cavity portion 28 and a second end of component 30 opposite the first end can extend into second cavity portion 29. (First and second cavity portions 28, 29 together can comprise cavity 20. First and second cavity portions 28, 29 can be formed separately or together (e.g., simultaneously). Cavity 20 can have a length greater than a width, that is have a rectangular non-square perimeter and/or cross section. Cavity 20 can have a curved cross section so that first and second cavity walls 24 are curved, for example if cavity 20 forms a half cylinder or vertically oriented cylinder. The cavity walls 24 are then the opposing sides of cavity 20.

Component support 32 can substantially bisect cavity 20. By substantially bisect, it is meant that component support 32, within the normal limitations of a useful manufacturing process, divides the length of cavity 20 into two substantially equal portions or pockets (e.g., first cavity portion 28 and second cavity portion 29). In some embodiments, cavity 20 is formed by etching two portions of cavity substrate 10 that each define one of first cavity portion 28 and second cavity portion 29 with component support 32 disposed therebetween. In some embodiments, cavity 20 is formed (e.g., by etching) and component support 32 is subsequently or consequently disposed or formed therebetween. First and second cavity portions 28, 29 can be substantially identical (e.g., in one or more of shape and size) or have different shapes and sizes. One or more patterned layers of dielectric 60 (encapsulation layer 60) can insulate portions of component 30, form portions of component support 32, or can encapsulate structures such as component 30 or component top and bottom electrodes 54, 56, or both. Thus, component support 32 can comprise materials of cavity substrate 10, component 30, dielectric layer 60, or component top and bottom electrodes 54, 56.

Components 30 can comprise one or more layers of different materials (e.g., including one or more layers of piezoelectric material) or one or more layers can be provided on component 30 (for example component top and bottom electrodes 54, 56, dielectric layers 60, or encapsulation layers 60). A component 30 is on or in contact with component support 32 if one or more layers of component 30 are in direct or indirect physical contact with component support 32. For example, component 30 can be in physical contact with component support 32 through one or more layers disposed on component 30 or through one or more layers disposed on component support 32.

As shown in FIGS. 26A-26F and 27A-27B, in some embodiments, cavity substrate 10 has a substrate surface 12, cavity walls 24 extend into cavity substrate 10 from substrate surface 12, and cavity 20 is formed in cavity substrate 10 so that substrate surface 12 is above or is co-planar with the top of cavity 20. In some embodiments, bottom of cavity 20 can be flat and form a cavity floor 22, for example in a plane parallel to substrate surface 12 (e.g., as shown in FIG. 26F). In some embodiments, a cavity floor 22 of cavity 20 need not be flat or form a single planar surface but can be non-planar or effectively one-dimensional (e.g., as in FIG. 26A) and can comprise multiple portions each in a different plane and can incorporate one or more cavity walls 24 (e.g., as shown in FIGS. 26A, 26C, 26E, and 27A, 27B), for example including one or more of cavity walls 24 or side walls of component support 32. A cavity floor 22 of cavity 20 can be parallel to substrate surface 12 or, in some embodiments, need not be parallel to substrate surface 12 but can comprise one or more portions that are at a non-zero angle with respect to substrate surface 12. For example, in some embodiments, a bottom of cavity 20 can comprise curved portions. Cavity walls 24 need not be orthogonal to substrate surface 12 but can be at a non-orthogonal angle to substrate surface 12 (e.g., as shown in FIGS. 27A, 27B). Cavity substrate 10 can comprise a material, such as a semiconductor material, like crystalline silicon with a {100} or {111} crystal orientation, that is anisotropically etchable and a bottom of cavity 20, cavity walls 24, and support side walls of component support 32 can be defined by etching planes of cavity substrate 10 material. Thus, a cavity floor 22 of cavity 20 or cavity walls 24 can comprise a plurality of V-shaped lengthwise cross sections (e.g., as shown in FIGS. 26A, 26C, and 26E) or trapezoidal lengthwise cross sections (e.g., as shown in FIGS. 26F, 27A and 27B), for example forming each of first and second cavity portions 28, 29 of cavity 20. Cavity 20 can be etched into cavity substrate 10 and a bottom of cavity 20, cavity walls 24, and support side walls of component support 32 can comprise cavity substrate 10 materials. FIG. 27B is a top view illustrating that each of a bottom of cavity 20, cavity walls 24, and support side walls of component support 32 are non-orthogonal to substrate surface 12 and can be formed by etch planes resulting from anisotropic etching of cavity substrate 10 to form cavity 20. (Cavity 20 can comprise first and second cavity portions 28 and 29).

The perspectives of FIGS. 26A, 26E, 26F, and 27A and the top view of FIG. 26B employ shading to illustrate the various walls of the cavity 20. However, according to some embodiments of the present disclosure, the materials comprising cavity substrate 10, cavity walls 24, component support 32, and support side walls can all comprise or be the same material, for example an anisotropically etchable crystalline material such as a semiconductor, e.g., silicon.

Figure 28A:
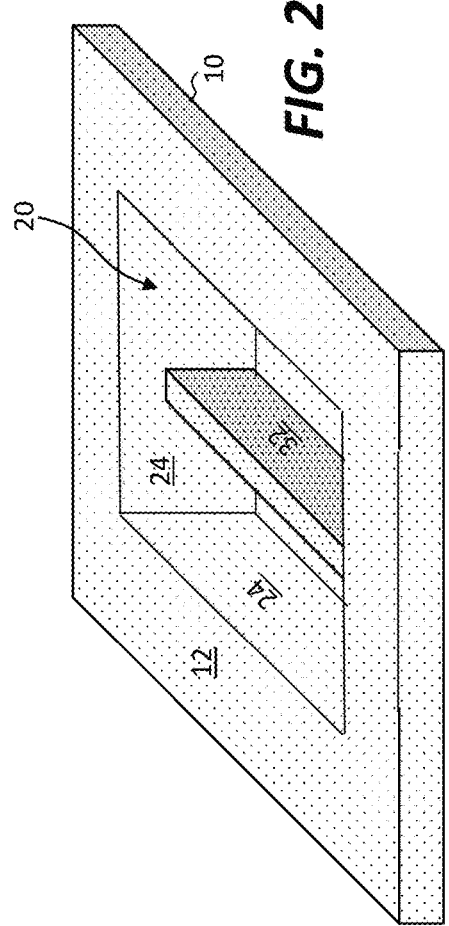
FIG. 28A is a partial perspective according to illustrative embodiments of the present disclosure.
Figure 28B:
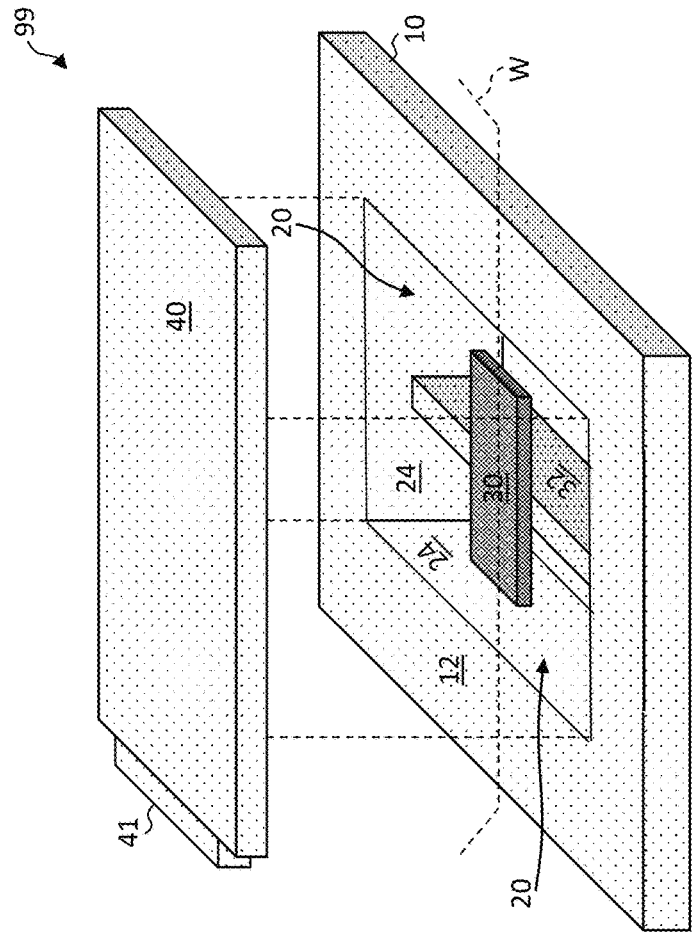
FIG. 28B is an exploded perspective corresponding to FIG. 28A according to illustrative embodiments of the present disclosure.
Figure 28C:
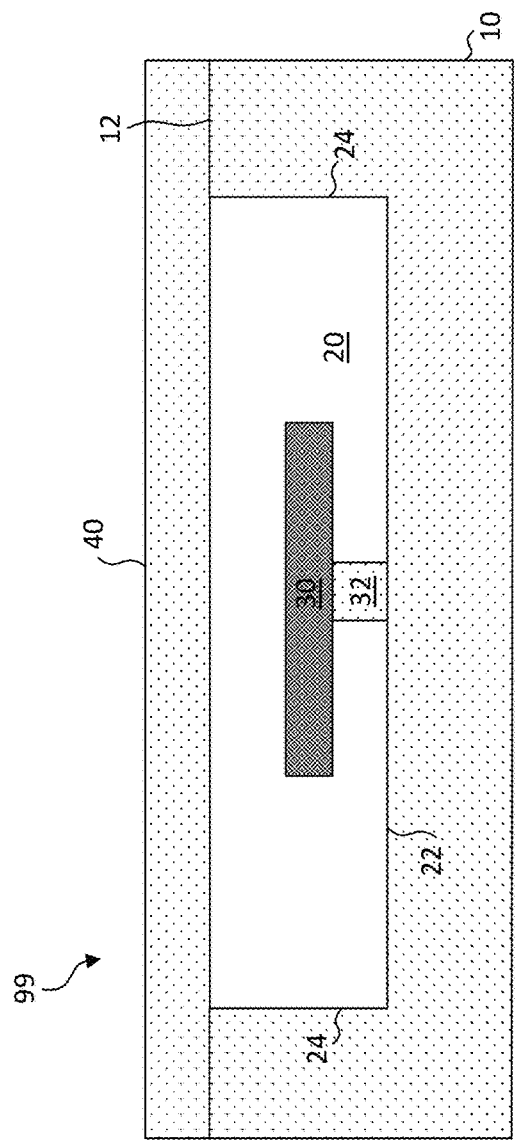
FIG. 28C is a cross section taken along cross section line W of FIG. 28B according to illustrative embodiments of the present disclosure.
Figure 29:
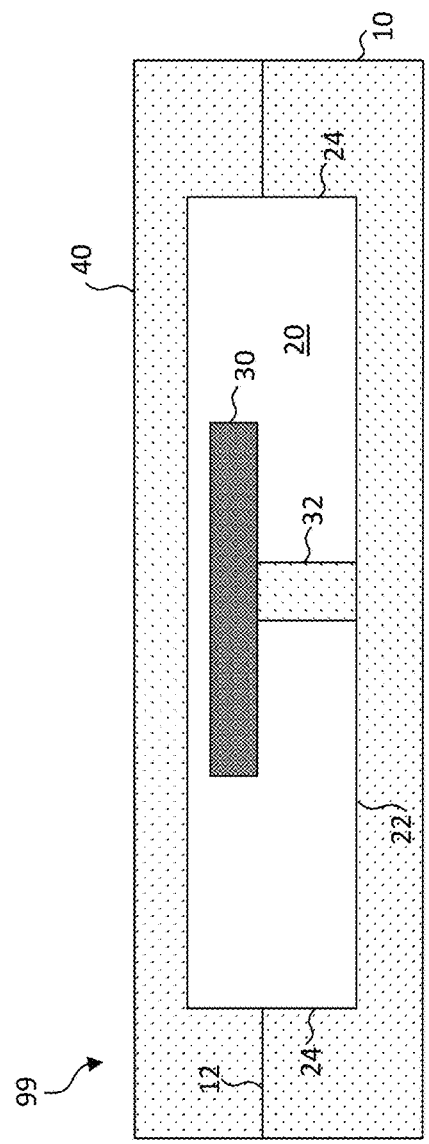
FIG. 29 is a cross section according to illustrative embodiments of the present disclosure.

In some embodiments of the present disclosure, cavity 20 has substantially planar, vertical, and rectangular cavity walls 24 and cavity floor 22. Cavity 20 can be disposed or formed in cavity substrate 10 and can be disposed partially above substrate surface 12, for example as shown in FIGS. 28A-29. FIG. 28A-28C illustrates cavity 20, cavity walls 24, and component support 32 disposed below substrate surface 12 in cavity substrate 10. FIG. 28C illustrates cavity structure 99 in cross section. FIG. 29 illustrates cavity 20, cavity walls 24, and component support 32 disposed partially above substrate surface 12 of cavity substrate 10.

Cavity structure 99 can comprise a cap 40 disposed over cavity 20 and in contact with and adhered to cavity substrate 10 (as shown in FIG. 28C). In some embodiments, cap 40 comprises cavity walls 24 in a common structure (e.g., as shown in FIG. 29). Cavity 20 can thus be disposed completely in cavity substrate 10 (e.g., as in FIGS. 28A-28C or comprise portions that are both disposed in cavity substrate 10 and above substrate surface 12 of cavity substrate 10 (e.g., as shown in FIG. 29). Cap 40 can be micro-transfer printed from a cap source wafer 62 and can comprise a broken or separated cap tether 41 as a consequence of the micro-transfer printing process. In some embodiments, component 30 is micro-transfer printed and comprises a broken or separated component tether 31 (not shown in FIGS. 28A-29).

Figure 30B:
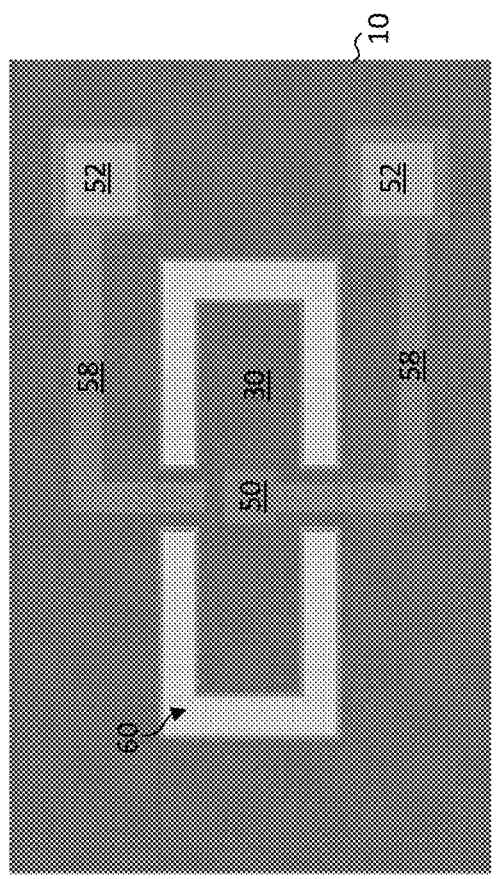

In some embodiments of the present disclosure and as shown in FIGS. 30A and 30B, cavity substrate 10 is a semiconductor substrate (such as silicon) and comprises an electronic cavity substrate circuit 16. Cavity substrate circuit 16 can be electrically connected through cavity substrate electrodes 58 and component top and bottom electrodes 54, 56 to control, provide signals to, or respond to component 30, a circuit in component 30, or some combination thereof. Cavity substrate circuit 16 can be disposed in cavity 20, extend beyond cavity 20, or be disposed on or in substrate surface 12 in a portion of cavity substrate 10 different from cavity 20 (e.g., as shown in FIG. 30A). Cavity substrate circuit 16 can interface with other electronic devices external to cavity 20, for example by electrically connecting to the other electronic devices, such as control circuits, with cavity substrate electrodes 58 extending along substrate surface 12. Cavity substrate circuit 16 can comprise cavity substrate 10 material, for example semiconductor material or can comprise electronic devices disposed on cavity substrate 10, for example by micro-transfer printing, and therefore comprise a broken (e.g., fractured) or separated component tether 31 (not shown in FIG. 30A or 30B).

Figure 31:
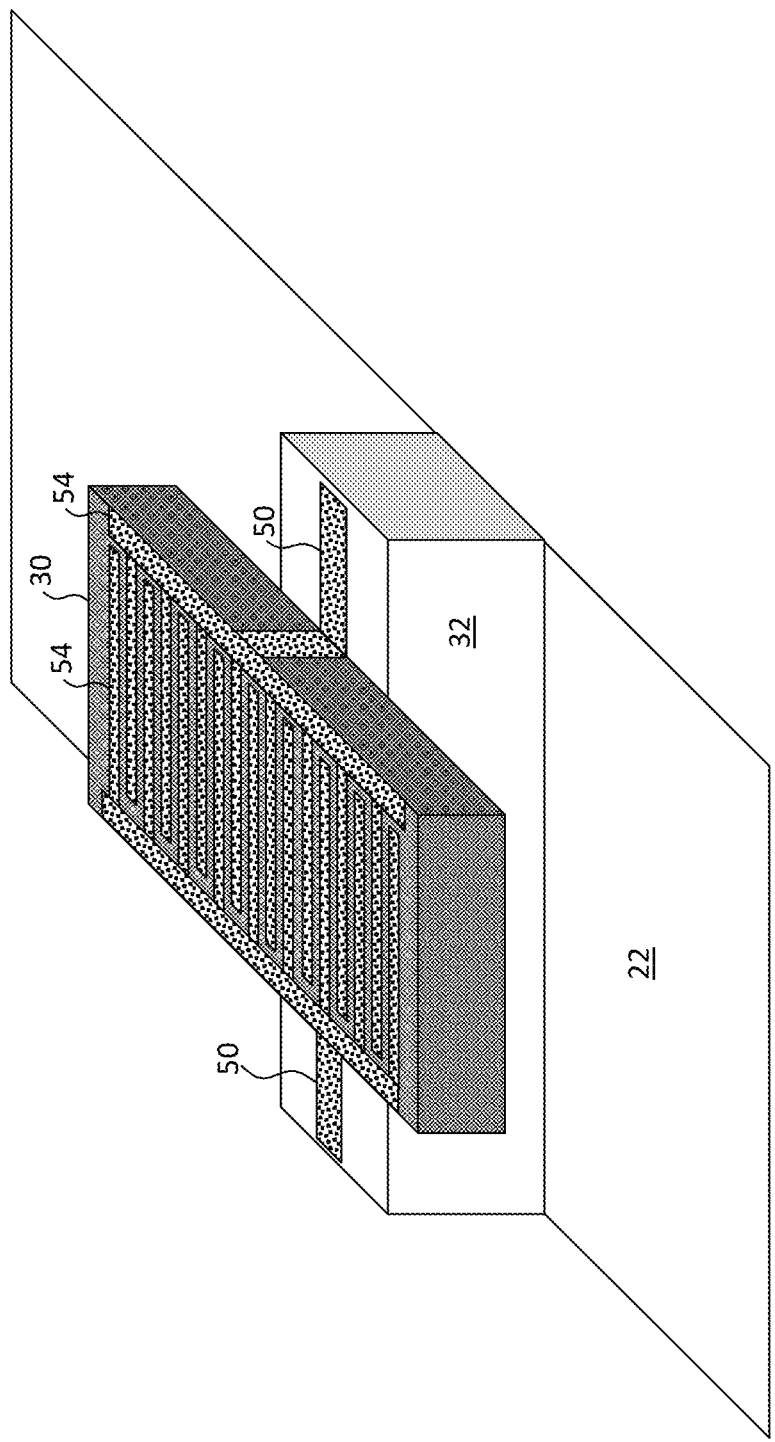
FIG. 31 is a cut-away perspective excluding cavity walls and comprising interdigitated electrodes according to illustrative embodiments of the present disclosure.

Component top electrode 54 can be disposed on a side of component 30 opposite cavity 20 and cavity substrate 10 and component bottom electrode 56 can be disposed on a side of component 30 adjacent cavity 20 and cavity substrate 10. As used in this context, an opposite side is a side for which component 30 is between the side and the cavity 20 or cavity substrate 10. As used in this context, an adjacent side is a side for which component 30 is not between the side and the cavity 20 or cavity substrate 10. Component top and bottom electrodes 54, 56 can electrically control or respond to component 30. Although only one each of component top and bottom electrodes 54, 56 are illustrated in FIGS. 26A-27B, in some embodiments of the present disclosure, multiple component top electrodes 54, for example two are provided (e.g., as shown in FIG. 31), or multiple component bottom electrodes 56, for example two, are provided, or multiple component top electrodes 54 and multiple component bottom electrodes 56 are provided. In some examples, a pair of component top and bottom electrodes 54, 56 can provide input signals and another different pair of component top and bottom electrodes 54, 56 can receive output signals to component 30 or a pair of component top electrodes 54 can provide input signals to, and a corresponding pair of component bottom electrodes 56 can receive output signal from, component 30, or vice versa.

Figure 32:
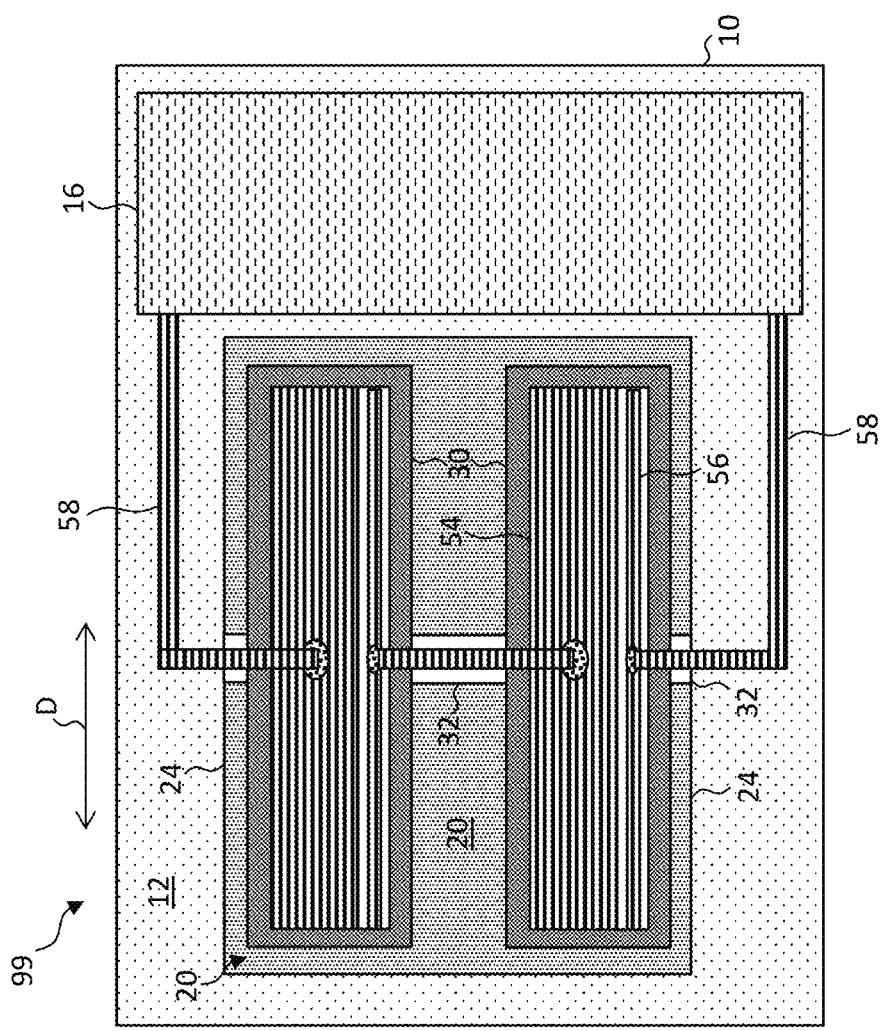
FIG. 32 is a top view of two devices provided on a common component support and in a common cavity according to illustrative embodiments of the present disclosure.

In some embodiments of the present disclosure, component support 32 has a first support end in contact with first cavity wall 24 and a second support end in contact with second cavity wall 24. Component top electrode 54 can extend along component support 32 to the first support end and first cavity wall 24 and component bottom electrode 56 can extend along component support 32 to the second support end and second cavity wall 24. Referring to FIG. 32, in some embodiments of the present disclosure, two or more component top electrodes 54 or two or more component bottom electrodes 56 are interdigitated. In some embodiments, a length greater than a width of fingers of any interdigitated electrodes can extend across the width of component 30, to induce or respond to component 30 movement in the lengthwise direction of component 30.

Figure 33:
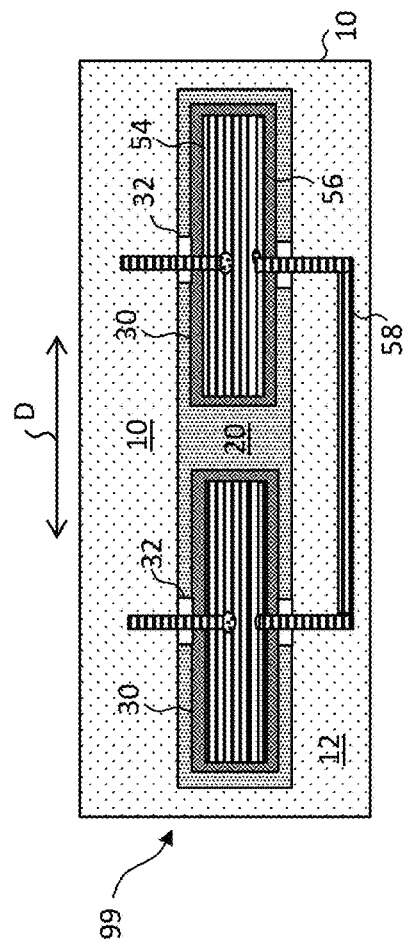
FIG. 33 is a top view of two devices, each provided on a separate support and in a common cavity, according to illustrative embodiments of the present disclosure.

In some embodiments and as shown in FIGS. 32 and 33, two or more components 30 are provided on a component support 32 in a common cavity 20. Cavity 20 can optionally be enclosed by cap 40, such as a tophat cap. As shown in FIG. 32, in some embodiments of the present disclosure two or more components 30 are in contact with a common component support 32 in a common cavity 20. Referring to FIG. 33, in some embodiments of the present disclosure, two or more components 30 are each disposed on a separate component support 32 but are provided in a common cavity 20. In some embodiments of the present disclosure, a cavity structure 99 comprises two or more component supports 32, each component support 32 extending from first cavity wall 24 to second cavity wall 24. Each of the two or more component supports 32 can at least partially divide cavity 20, for example into three cavity portions, for example as shown in FIG. 33. A component 30 is in contact (e.g., direct contact) with each component support 32 and extends in wall direction D beyond each component support 32 and is above and separated by a gap G from a bottom of cavity 20 (e.g., as shown in FIG. 26A).

The two or more components 30 in a common cavity 20 can be electrically connected, as shown, or can be electrically separate. By providing two or more components 30 in a common cavity 20, more components 30 can be provided in a smaller area or structure and additional signal processing can be provided by components 30. The two or more components 30 can all be a same kind of component 30 or can be different kinds of devices, the two or more components 30 can all comprise similar or the same materials or can comprise one or more different materials. The two or more components 30 can provide similar or the same one or more functions or can provide one or more different functions.

Figure 34:
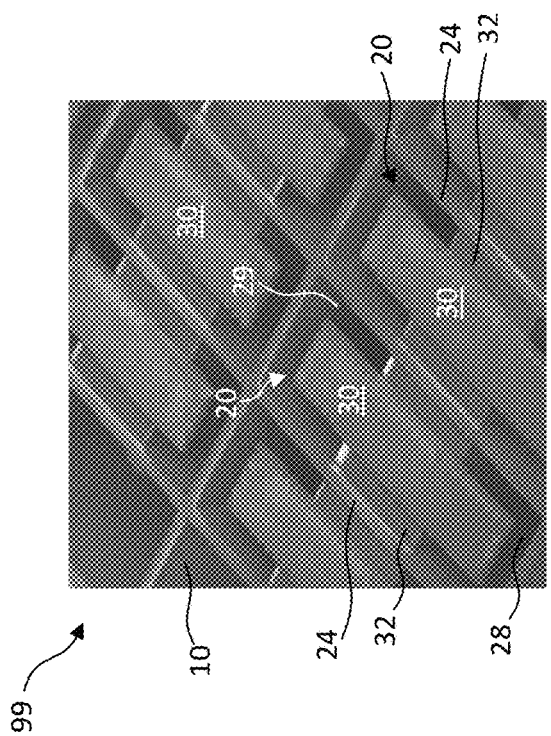
FIG. 34 is a micrograph of devices, each in a separate cavity, according to illustrative embodiments of the present disclosure.
Figure 35:
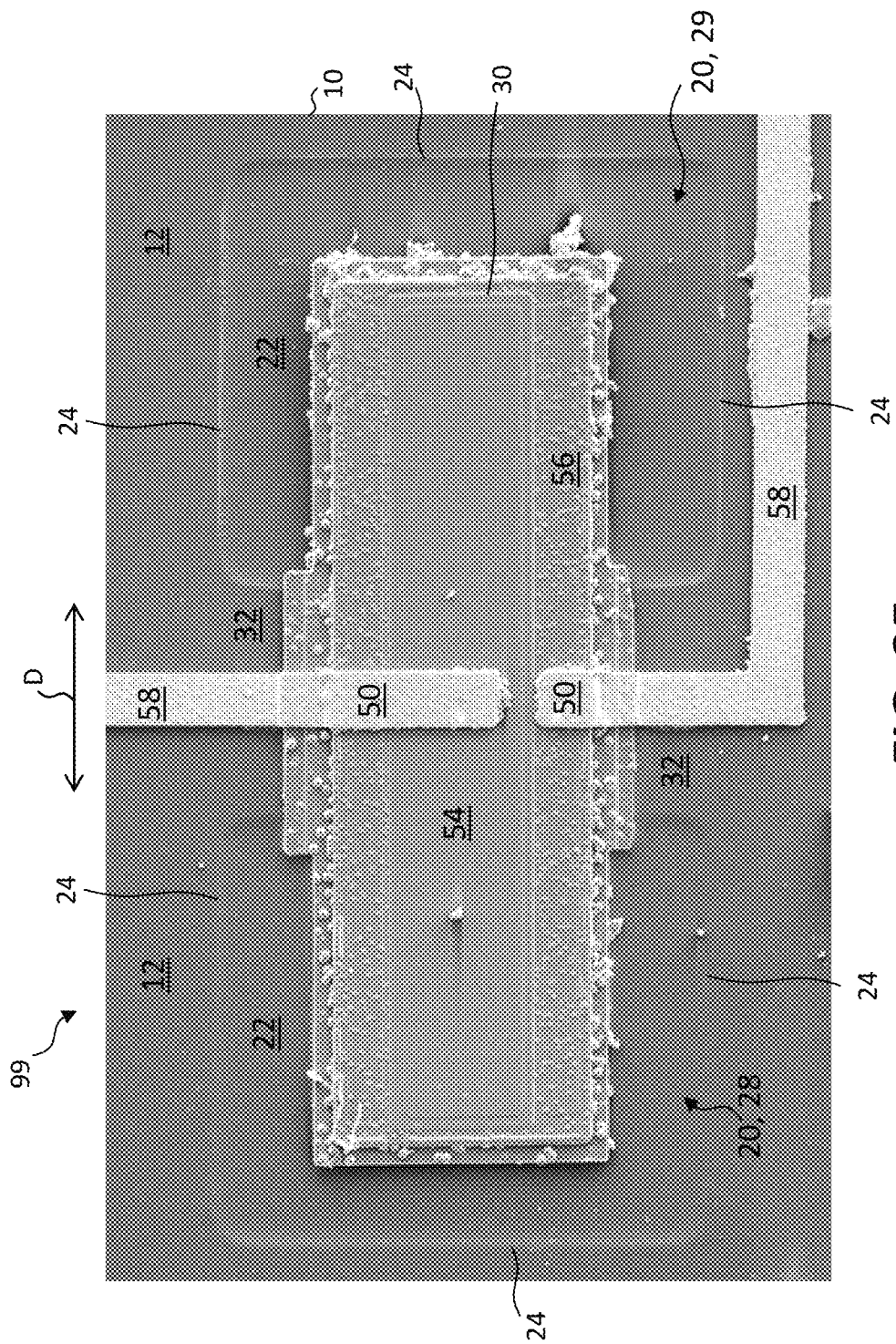
FIG. 35 is a micrograph of a device according to illustrative embodiments of the present disclosure.

FIG. 34 is a micrograph providing a perspective view of several constructed cavity structures 99 (excluding cap 40), each comprising a component 30 disposed in a common cavity substrate 10 and a component support 32 extending between first and second cavity walls 24. FIG. 35 is a top view micrograph of a component 30 coated with a component top electrode 54 and a component bottom electrode 56 (extending from under component 30) on component support 32. Component support 32 extends from first cavity wall 24 to second cavity wall 24 in cavity substrate 10. One end of component 30 is disposed over first cavity portion 28 and the other opposite end of component 30 is disposed over second cavity portion 29. (First and second cavity portions 28, 29 together form cavity 20.) Cavity substrate electrodes 58 electrically connected to component top and bottom electrodes 54, 56 extend over substrate surface 12 and can be electrically connected to a cavity substrate circuit 16 (not shown in FIGS. 34, 35).

Figure 36:
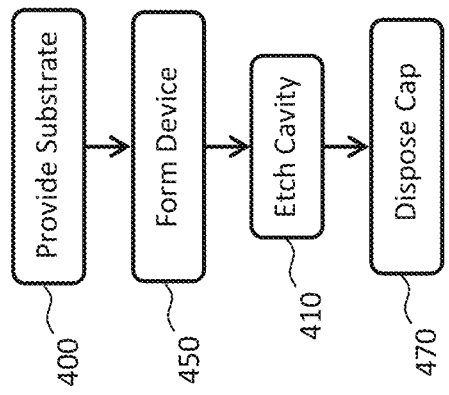

In some embodiments of the present disclosure, a method is performed in accordance with FIG. 36. In step 400 an anisotropically etchable cavity substrate 10 such as crystalline silicon or a cavity substrate 10 with a patterned etchable sacrificial layer, for example an oxide layer having two portions corresponding to first and second cavity portions 28, 29, is provided. Metal (for example, aluminum, tin, silver, gold or other conductive materials) is deposited, for example by evaporation, and patterned, for example using coated photoresist patterned with UV radiation through a pattern mask that is developed, etched, and stripped, to form bottom electrode 56. Cavity substrate electrodes 58 can be formed at the same time in the same steps. Any circuits 16 can be formed before or after the metal patterning steps (or later in the process). A device material, for example a piezoelectric material such as PZT or KNN is deposited and patterned in step 450 to form component 30, for example using evaporative deposition and a patterned dry etch. Alternatively, component 30 can be transferred (e.g., microtransfer printed) onto cavity substrate 10, for example from a source wafer. After component 30 is provided in step 450, a second metal layer is deposited and patterned to form component top electrode 54, similarly to the formation of bottom electrode 56. Cavity 20 is then etched in step 410, for example with trimethylammonium hydroxide (TMAH) to form cavity 20 comprising first and second cavity portions 28, 29, and component support 32 (for example as shown in FIGS. 26A-27B). An anisotropic etch proceeds quickly in some directions and slowly in others, to form first and second cavity portions 28, 29, as illustrated, for example in FIGS. 26A-27B. When two fast-etching planes meet, they cannot proceed and self-annihilate, forming a V-shaped cross section, for example inverted pyramids in three dimensions, for example as shown in the FIGS. 26A, 26C, 26E or forming a trapezoidal-shaped cross section, for example as shown in FIGS. 26F, 278A, and 27B. Thus, the differentially etchable etch planes can form a triangular cross section in the width direction of component 30 and, in the length direction of component 30, can form a triangular cross section (as in FIG. 26A, 26D) or a trapezoidal cross section (as in FIGS. 26F, 27A, and 27B), depending on the relative dimensions of cavity 20 and component support 32 and the crystalline structure of cavity substrate 10. In some embodiments of the present disclosure, anisotropic etching of cavity substrate 10 to provide cavity 20 can form cavity walls 24 on the ends and sides of cavity 20. Component support 32 can also comprise cavity walls 24. In step 470, a cap 40 is provided and disposed over cavity 20 and adhered to substrate surface 12 of cavity substrate 10 or cavity floor 22. Cap 40 can include, provide, or comprise portions of first and second cavity walls 24 for example as shown in FIG. 29, so that cavity 20 extends above substrate surface 12. For example, cavity walls 24 can be a single structure (e.g., comprising one or more etch planes of an anisotropically etchable substrate) or include multiple structures (e.g., one or more etch planes and a portion of a cap 40 disposed on cavity substrate 10). Various structures according to certain embodiments of the present disclosure have been constructed as described herein.

According to some embodiments of the present disclosure, a method of making a cavity structure 99 comprises providing a cavity substrate 10 having a substrate surface 12, cavity substrate 10 comprising a material that is anisotropically etchable, disposing a component 30 on substrate surface 12, for example by constructing or micro-transfer printing component 30 on substrate surface 12, etching cavity substrate 10 to undercut component 30 thereby forming component support 32 on which component 30 is disposed and cavity 20 into which component 30 extends, and optionally disposing a cap 40 over cavity 20 to enclose cavity 20. Cap 40 can comprise portions of cavity walls 24 so that cavity 20 extends above substrate surface 12, for example as shown in FIG. 29.

Additional layers, for example patterned titanium, nickel, or gold layers can be provided to coat or protect various elements of overhanging device cavity structure 99, for example component 30, from etchants or other process steps. Such layers can have a thickness of one micron or less, for example about 100 nm. Cavity substrate circuit 16 can be formed using conventional photolithographic methods and materials before, after, or during any steps used to form overhanging device cavity structure 99. Alternatively, cavity substrate circuit 16 can be transferred (e.g., micro-transfer printed) to substrate surface 12 before, after, or during any steps used to form overhanging device cavity structure 99.

Figure 37:
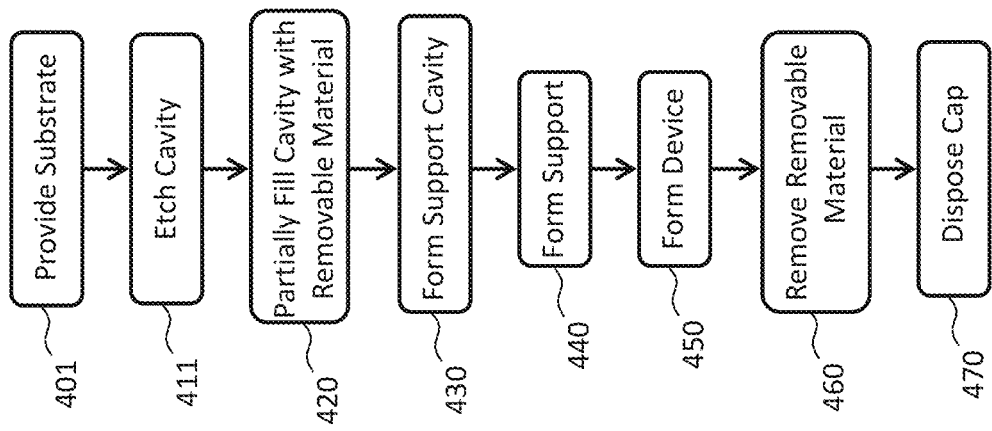
FIGS. 36-37 are flow diagrams according to illustrative embodiments of the present disclosure.
Figure 38A:
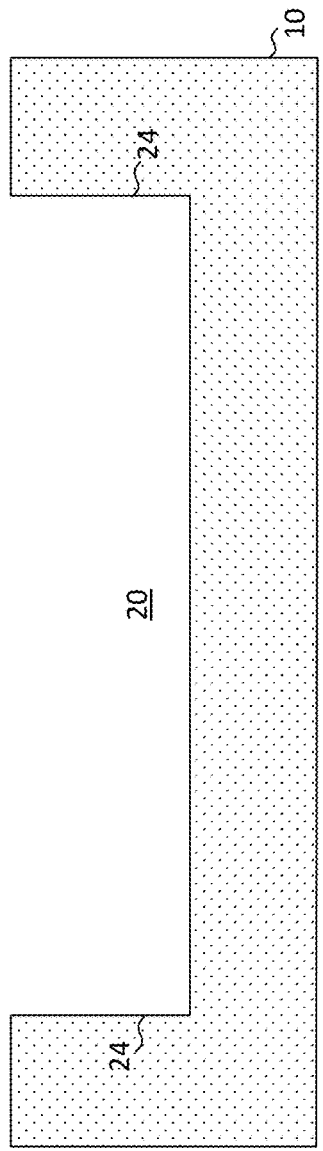
Figure 38B:
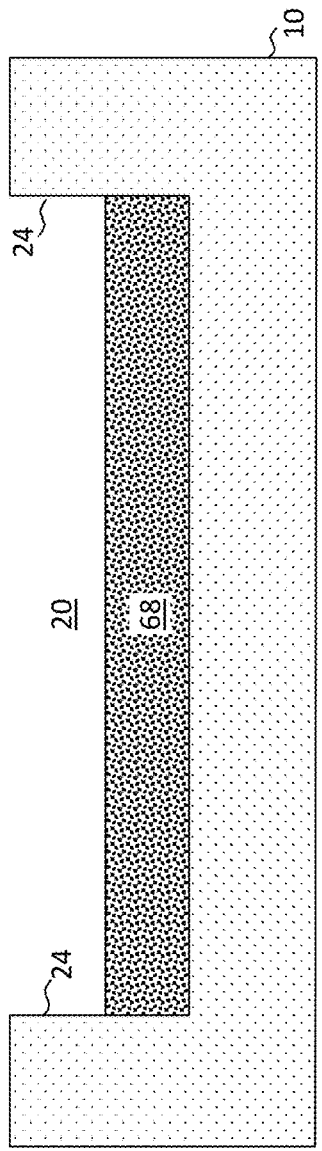
Figure 38C:
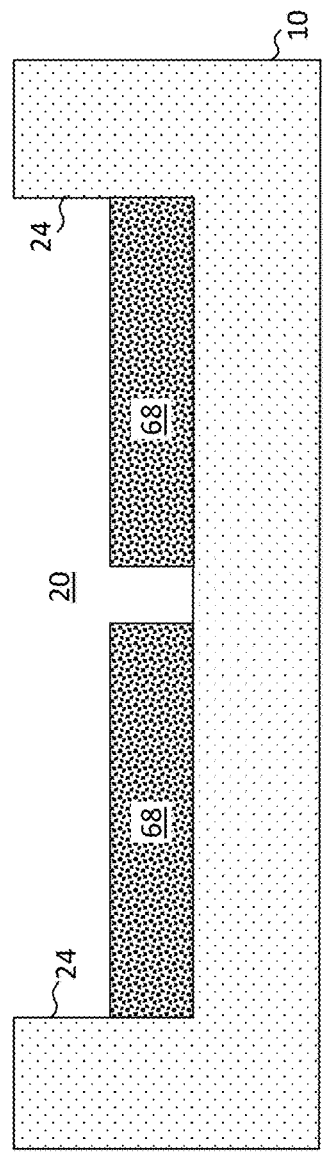

In some embodiments of the present disclosure a method is performed in accordance with FIG. 37. In step 401 a cavity substrate 10, for example with a patterned etchable sacrificial layer having sacrificial portions laterally separated by anchors is provided. Cavity 20 can be formed in step 411, for example by etching the sacrificial portions, for example as shown in FIG. 38A. In step 420, cavity 20 is at least partially filled with a removable material 68, for example an organic material such as a polyimide or other polymer or resin (or other differentially etchable material), for example as shown in FIG. 38B. Removable material 68 is then patterned in step 430 to form a support cavity (e.g., as shown in FIG. 38C) that is then filled with material, for example with silicon dioxide, in step 440 to form component support 32 (e.g., as shown in FIG. 38D). Support cavity can have a shape corresponding to, for example, any of the component supports 32 disclosed herein, such as component support 32 in FIGS. 26A-27B. Component 30 is then formed (for example by deposition and patterning) or otherwise disposed (for example by transferring (e.g., micro-transfer printing) on removable material 68 and component support 32 in step 450, for example as shown in FIG. 38E. Removable material 68 is then removed in step 460, leaving component 30 disposed on component support 32 with the ends of component 30 suspended over (overhanging) the bottom of cavity 20, for example as shown in FIG. 38F. A cap 40 is then disposed over cavity 20 and adhered to cavity substrate 10 in step 470. In some embodiments, a cap 40 is provided when component 30 is disposed entirely within cavity 20 in order to form an enclosed cavity 20.

According to some embodiments of the present disclosure, a method of making a cavity structure 99 comprises providing a cavity substrate 10 and forming a cavity 20 in the cavity substrate 10, cavity 20 comprising a first cavity wall 24 and a second cavity wall 24 opposing the first cavity wall 24. Cavity 20 is at least partially filled with a removable material 68 and a support cavity is formed in removable material 68 that extends from the first cavity wall 24 to the second cavity wall 24. A component support 32 is formed in the support cavity that at least partially divides cavity 20. A component 30 is disposed on component support 32 and removable material 68. Removable material 68 is then removed so that component 30 extends from component support 32 into cavity 20. Optionally, a cap 40 is disposed over cavity 20. In some embodiments, a cap 40 is provided when component 30 is disposed entirely within cavity 20 thereby forming an enclosed cavity.

As noted above, if a material comprising cavity substrate 10 is anisotropically etchable, cavity 20 can be formed in cavity substrate 10 by anisotropically etching the cavity material. In some embodiments of the present disclosure, a method of making a cavity structure 99 comprises providing a cavity substrate 10 having a substrate surface 12 and spaced-apart sacrificial portions 94 separated by a component support 32. A component 30 is disposed on the substrate surface 12 and covering at least a portion of sacrificial portions 94 and component support 32 such that no portion of component 30 extends beyond the area that bounds sacrificial portions 94 and component support 32. Sacrificial portions 94 are etched to undercut component 30 and form a cavity 20 comprising a first cavity wall 24 and a second cavity wall 24 opposing first cavity wall 24. The component support 32 extends from first cavity wall 24 to second cavity wall 24 and at least partially divides cavity 20. A cap 40 is optionally disposed over cavity 20. In some embodiments, cavity 20 is at least partially filled with removable material 68 after sacrificial portions 94 are etched, component 30 is then at least partially disposed on removable material 94, and removable material 94 is removed.

Examples of Components, Wafers, Structures, Materials, and Methods

According to some embodiments of the present disclosure, micro-transfer printing can include any method of transferring components 30 from a cavity structure source wafer 90 to a destination substrate 80 by contacting components 30 on cavity structure source wafer 90 with a patterned or unpatterned stamp 70 to remove components 30 from cavity structure source wafer 90, transferring stamp 70 and contacted components 30 to destination substrate 80, and contacting components 30 to a surface of destination substrate 80. Components 30 can be adhered to stamp 70 or destination substrate 80 by, for example, van der Waals forces, electrostatic forces, magnetic forces, chemical forces, adhesives, or any combination of the above depending on the construction of stamp 70. In some embodiments, components 30 are adhered to stamp 70 with separation-rate-dependent adhesion, for example kinetic control of viscoelastic stamp materials such as can be found in elastomeric transfer devices such as a PDMS stamp 70.

Cavity Structures

Figure 5D:
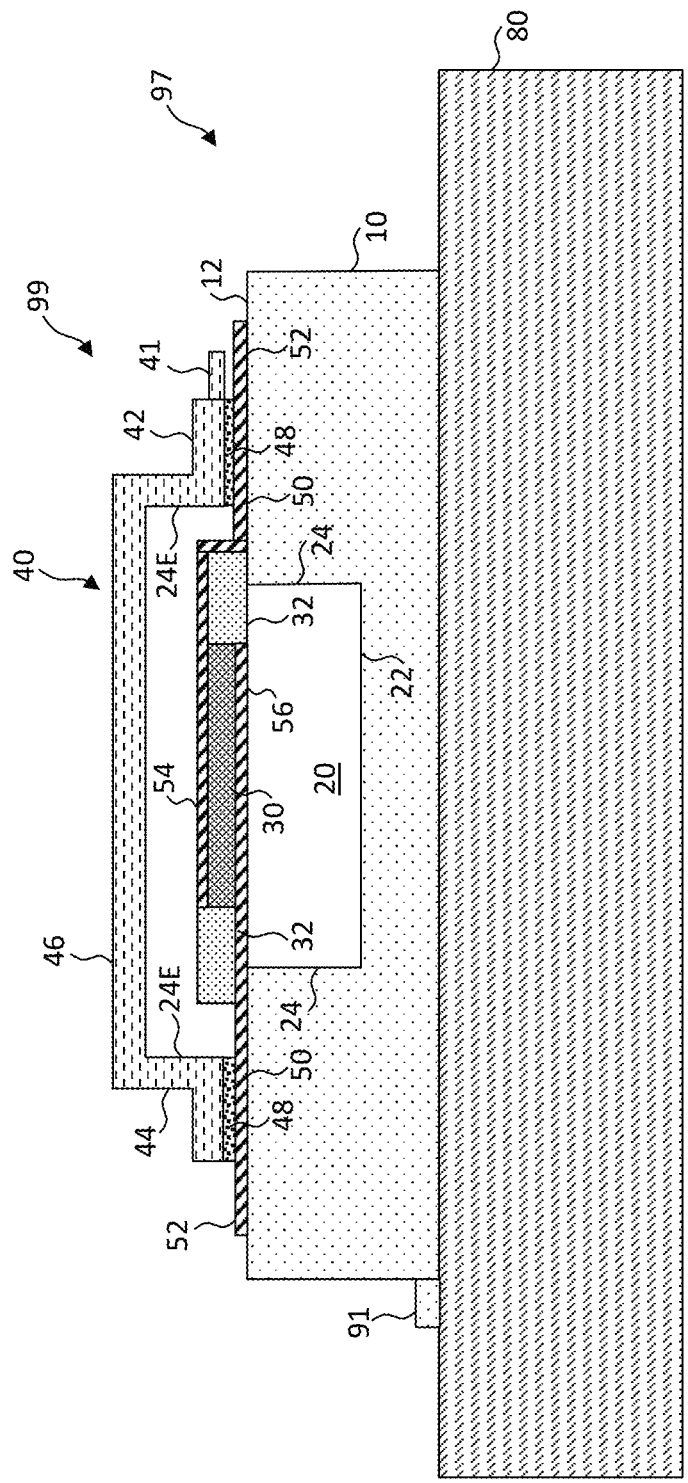
FIG. 5D is a cross section comprising a tophat cap corresponding to FIGS. 5A-5B and including a destination substrate according to illustrative embodiments of the present disclosure.
Figure 5E:
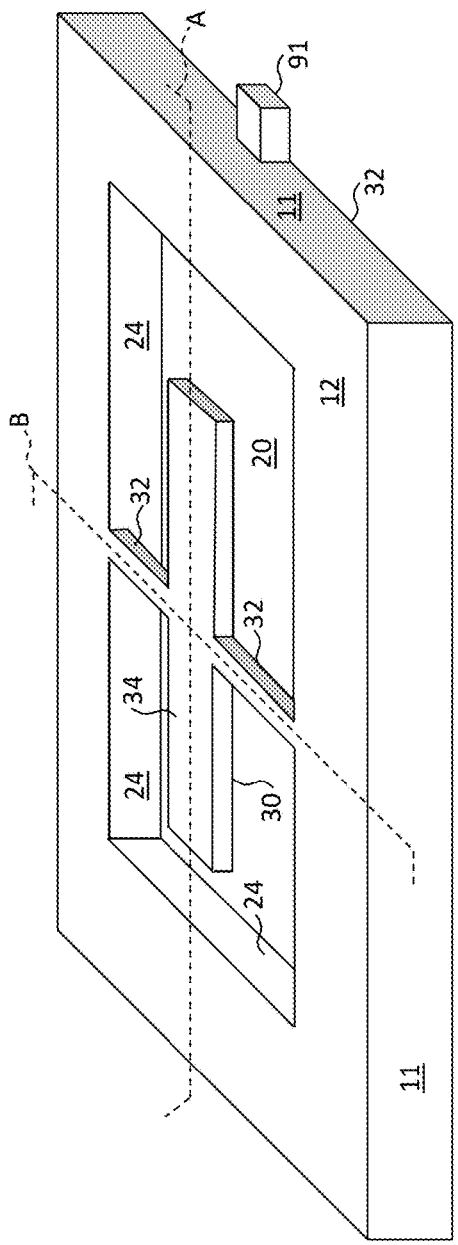
FIG. 5E is an interior perspective excluding the tophat cap corresponding to FIGS. 5A-5B according to illustrative embodiments of the present disclosure.
Figure 5F:
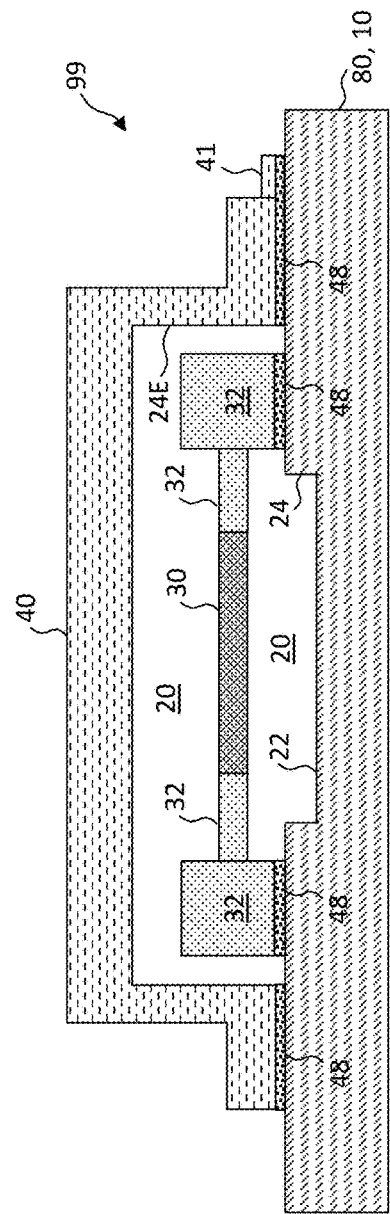
FIG. 5F is a cross section comprising a tophat cap and including a destination substrate with a cavity according to illustrative embodiments of the present disclosure.

Cavity structure 99 can comprise component top and bottom electrodes 54, 56 on opposing component top and bottom sides 38, 39 of component 30, for example as shown in FIGS. 5A, 5B, and 5D. Component top and bottom electrodes 54, 56 can be electrically connected to respective destination substrate electrical connections 82 to receive or provide an electrical power or ground or control or information signals. Component electrodes 50 or destination substrate electrical connections 82 can extend beyond cavity 20 and can be controlled by devices external to cavity 20, for example by extending along substrate surface 12 and optionally to electronic cavity substrate circuits 16 formed in or on cavity substrate 10 (see FIG. 30A) or in or on destination substrate 80 to control, provide signals to, or respond to component 30.

Components

Components 30 can be any transfer printable structure and can include any one or more of a wide variety of active or passive (or active and passive) components 30 including MEMs and piezoelectric devices. Components 30 can be any one or more of integrated devices, integrated circuits (such as CMOS circuits), light-emitting diodes, photodiodes, sensors, electrical or electronic devices, optical devices, opto-electronic devices, magnetic devices, magneto-optic devices, magneto-electronic devices, and piezoelectric device, materials or structures. Components 30 can comprise electronic component circuits that operate component 30. Component 30 can be responsive to electrical energy, to optical energy, to electromagnetic energy, to mechanical energy, or to a combination thereof, for example. In some embodiments, an acoustic wave transducer comprises component 30. In some embodiments, two acoustic wave transducers both comprise component 30, for example when used in an acoustic wave filter or sensor.

In some embodiments, component 30 comprises a piezoelectric material. Component 30 can be at least a portion of a piezoelectric transducer or piezoelectric resonator. For example, component 30 can be used in an acoustic wave filter or sensor, such as a bulk acoustic wave filter or sensor or a surface acoustic wave filter or sensor. For example, in some embodiments in which component top and bottom electrodes 54, 56 extend over a substantial portion of component top and bottom sides 38, 39 of component 30 comprising a piezoelectric material, respectively, component top and bottom electrodes 54, 56 can provide an electrical field in component 30 that, when controlled at a suitable frequency can cause resonant mechanical vibrations in component 30 such that component 30 and component electrodes 50 serve as an acoustic wave transducer. In some embodiments, a component top electrode 54 and a component bottom electrode 56 are provided on component top and bottom sides 38, 39, respectively, to form a two-electrode acoustic wave filter for a component 30 comprising a piezoelectric material. In some embodiments, two component top electrodes 54 and two component bottom electrodes 56 are provided on component top and bottom sides 38, 39, respectively, to form a four-electrode acoustic wave filter for a component comprising a piezoelectric material. Two component top electrodes 54 can be interdigitated or two component bottom electrodes 56 can be interdigitated, or both. In some embodiments, because one or more ends of component 30 are not adhered to a surface and are free to move, resonant frequencies of mechanical vibration in component 30 can be controlled and a high quality (high Q) acoustic wave transducer (or filter) is provided. Similarly, high-quality sensors and the like can be achieved when components 30 can deform more readily (e.g., because they overhang a component support 32 or are laterally suspended in an enclosed cavity 20). Various arrangements and patterns of component top and bottom electrodes 54, 56 can be used in various embodiments and can be implemented in bulk or surface acoustic wave transducers (e.g., in bulk or surface acoustic wave filters, respectively) with a corresponding variety of resonant modes in component 30 using two, three, four or more component electrodes 50.

Components 30 can comprise one or more different component materials, for example non-crystalline (e.g., amorphous), polycrystalline, or crystalline semiconductor materials such as silicon or compound semiconductor materials or crystalline piezoelectric materials. In some embodiments, component 30 comprises a layer of piezoelectric material disposed over or on a layer of dielectric material, for example an oxide or nitride such as a silicon oxide (e.g., silicon dioxide) or silicon nitride. In some embodiments, component 30 comprises a component material different from the component support 32 material. In some embodiments, the component 30 material can be the same as or substantially similar to the component support 32 material.

In certain embodiments, components 30 can be native to and formed on sacrificial portions of cavity substrate 10 and can include seed layer(s). Components 30 and cavity structures 99 can be constructed, for example using photolithographic processes and materials. Components 30 and cavity structures 99 can be micro-devices having at least one of a length and a width less than or equal to 500 microns (e.g., a length and a width less than or equal to 200 microns, a length and a width less than or equal to 100 microns, a length and a width less than or equal to 50 microns, a length and a width less than or equal to 25 microns, a length and a width less than or equal to 15 microns, a length and a width less than or equal to 10 microns, or a length and a width less than or equal to five microns), and alternatively or additionally a thickness of less than or equal to 250 microns (e.g., less than or equal to 100 microns, less than or equal to 50 microns, less than or equal to 25 microns, less than or equal to 15 microns, less than or equal to 10 microns, less than or equal to five microns, less than or equal to two microns, or less than or equal to one micron).

Components 30 can be unpackaged dice (each an unpackaged die) transferred directly from native component source wafers on or in which components 30 are constructed to cavity substrate 10 (e.g., to component support 32 thereon or therein). Anchors and component tethers 31 can each be or can comprise portions of component source wafer that are not sacrificial portions and can include layers formed on component source wafers, for example dielectric or metal layers and for example layers formed as a part of photolithographic processes used to construct or encapsulate components 30.

For example, in some embodiments in which top and bottom component electrodes 50, extend over a substantial portion of component top and bottom sides 38, 39 of component 30, respectively, component electrodes 50 can provide an electrical field in component 30 that, when controlled at a suitable frequency can cause resonant mechanical vibrations in component 30 such that the component 30 and component electrodes 50 serve as an acoustic wave transducer. In some embodiments, a component top and bottom electrode 54, 56 are provided on component top and bottom sides 38, 39, respectively, to form a two-electrode acoustic wave filter. In some embodiments, two component top electrodes 54 and two component bottom electrodes 56 are provided on component top and bottom sides 38, 39, respectively, to form a four-electrode acoustic wave filter. Two component top electrodes 54 can be interdigitated or two component bottom electrodes 56 can be interdigitated, or both. In some embodiments, because one or more ends of component 30 are not adhered to (or otherwise in contact with) a surface and are free to move, resonant frequencies of mechanical vibration in component 30 can be controlled and a high quality (high Q) acoustic wave transducer (or filter) is provided. Various arrangements and patterns of component top and bottom electrodes 54, 56 can be used in various embodiments and can implement bulk or surface acoustic wave transducers (e.g., in bulk or surface acoustic wave filters, respectively) with a corresponding variety of resonant modes in component 30 using two, three, four or more component electrodes 50.

In some embodiments according to the present disclosure, components 30 can have a variety of shapes and form factors, for example a rectangular form factor commonly used for integrated circuits. In some embodiments, for example where components 30 are used in acoustic transducers, various component 30 shapes can be useful, for example circular or disc-shaped or x-shaped, cross-shaped, or the shape of a plus sign. In general, according to some embodiments, components 30 can have any useful shape in either two dimensions or three dimensions. Such shapes can be useful, for example in enabling vibrational resonance modes for acoustic devices.

In some embodiments, component 30 comprises a piezoelectric material and is a piezoelectric device. Component 30 can be at least a portion of a piezoelectric transducer or piezoelectric resonator. In some embodiments of the present disclosure, component 30 is an acoustic wave filter, sensor, or a resonator. Component 30 can be a surface acoustic wave filter or a bulk acoustic wave filter. In some embodiments of cavity structure 99, component 30 comprises one or more of aluminum nitride, zinc oxide, bismuth ferrite, lead zirconate titanate, lanthanum-doped lead zirconate titanate, potassium niobate, or potassium niobate, and (K,Na)NbO$_3$ (KNN).

A component material of component 30 can be or include one or more of a semiconductor, a compound semiconductor, a III-V semiconductor, a II-VI semiconductor, or a ceramic (e.g., a synthetic ceramic). For example, a component material can be or include one or more of GaN, AlGaN, AlN, gallium orthophosphate (GaPO$_4$), Langasite (La$_3$Ga$_5$SiO$_{14}$), lead titanate, barium titanate (BaTiO$_3$), lead zirconate titanate (Pb[Zr$_x$Ti$_{1-x}$]O$_3$ 0≤x≤1), potassium niobate (KNbO$_3$), lithium niobate (LiNbO$_3$), lithium tantalate (LiTaO$_3$), sodium tungstate (Na$_2$WO$_3$), Ba$_2$NaNb$_5$O$_5$, Pb$_2$KNb$_5$O$_{15}$, zinc oxide (ZnO), Sodium potassium niobate ((K,Na)NbO$_3$) (NKN), bismuth ferrite (BiFeO$_3$), Sodium niobate (NaNbO3), bismuth titanate (Bi$_4$Ti$_3$O$_{12}$), sodium bismuth titanate (Na$_{0.5}$Bi$_{0.5}$TiO$_3$), wurtzite, and polyvinylidene fluoride. A component material can be or include a piezoelectric material that exhibits a piezoelectric effect.

Components 30 formed or disposed in or on cavity structure 99 can be processed, formed, or constructed using integrated circuit, micro-electro-mechanical, or photolithographic methods and materials, for example. Photolithographic methods and materials are also useful to form top and bottom component electrodes 50 and any component circuit. Components 30, in certain embodiments, can be constructed using foundry fabrication processes used in the art. Layer(s) of materials can be used, including materials such as metals, oxides, nitrides and other materials used in the integrated-circuit art. Each component 30 can be or include a complete semiconductor integrated circuit and can include, for example, any combination of one or more of a transistor, a diode, a light-emitting diode, and a sensor. Components 30 can have different sizes, for example, at least 100 square microns (e.g., at least 1,000 square microns, at least 10,000 square microns, at least 100,000 square microns, or at least 1 square mm). Alternatively or additionally for example, components 30 can be no more than 100 square microns (e.g., no more than 1,000 square microns, no more than 10,000 square microns, no more than 100,000 square microns, or no more than 1 square mm). Components 30 can have variable aspect ratios, for example between 1:1 and 10:1 (e.g., 1:1, 2:1, 5:1, or 10:1). Components 30 can be rectangular or can have other shapes, such as polygonal or circular shapes for example.

In some embodiments, component 30 comprises a device material different from a component support 32 material. In some embodiments, component support 32 can comprise component 30 material. A component support 32 material can be or comprise a patterned dielectric layer 60, can comprise conductors, or can comprise an electrical conductor (e.g., a metal).

Component Source Wafers

According to various embodiments, a component source wafer can be provided with components 30, patterned sacrificial portions, component tethers 31, and anchors already formed, or they can be constructed as part of a method in accordance with certain embodiments. A component source wafer and components 30, micro-transfer printing device (e.g., a stamp 70), and cavity substrate 10 can be made separately and at different times or in different temporal orders or locations and provided in various process states.

The spatial distribution of any one or more of components 30 and cavity structures 99 is a matter of design choice for the end product desired. In some embodiments, all components 30 in an array on a component source wafer or cavity structures 99 in an array on a cavity structure source wafer 90 are transferred to a transfer device (e.g., stamp 70). In some embodiments, a subset of components 30 or cavity structures 99 is transferred. By varying the number and arrangement of stamp posts 72 on transfer stamps 70, the distribution of components 30 on stamp posts 72 of transfer stamp 70 can be likewise varied, as can the distribution of components 30 on cavity substrate 10 or cavity structures 99 on cavity structure source wafer 90.

A component source wafer can be any source wafer or substrate with transfer printable components 30 that can be transferred with a transfer device 70 (e.g., a stamp 70). For example, a component source wafer can be or comprise a semiconductor (e.g., silicon) in a crystalline or non-crystalline form, a compound semiconductor (e.g., comprising GaN or GaAs), a glass, a polymer, a sapphire, or a quartz wafer. Sacrificial portions (comparable to sacrificial portions 94 of cavity structure source wafer 90 or in cavity substrate 10) can be formed of a patterned oxide (e.g., silicon dioxide) or nitride (e.g., silicon nitride) layer or can be an anisotropically etchable portion of a sacrificial layer of a component source wafer.

Stamps

Stamps 70 can be patterned or unpatterned and can comprise stamp posts 72 having a stamp post area on the distal end of stamp posts 72. Stamp posts 72 can have a length, a width, or both a length and a width that is similar (e.g., within 50% of) or substantially equal (e.g., within 1% of) to a length, a width, or both a length and a width of component 30, respectively, or not. In some embodiments, stamp posts 72 can be smaller than components 30 or have a dimension, such as a length and/or a width, substantially equal to or smaller than a length or a width of component support 32 in one or two orthogonal directions. In some embodiments, stamp posts 72 each have a contact surface of substantially identical area.

In exemplary methods, a viscoelastic elastomer (e.g., PDMS) stamp 70 (e.g., comprising a plurality of stamp posts 72 that can be patterned) is constructed and arranged to retrieve and transfer arrays of components 30 from their native component source wafer onto non-native target substrates, e.g., cavity substrates 10. In some embodiments, stamp 70 mounts onto motion-plus-optics machinery (e.g., an opto-mechatronic motion platform) that can precisely control stamp 70 alignment and kinetics with respect to both component source wafers and cavity substrates 10 with component supports 32. During micro-transfer printing, the motion platform brings stamp 70 into contact with components 30 on a component source wafer, with optical alignment performed before contact. Rapid upward movement of the print-head (or, in some embodiments, downward movement of component source wafer) breaks (e.g., fractures) or separates component tether(s) 31 forming broken (e.g., fractured) or separated component tethers 31, transferring component(s) 30 to stamp 70 or stamp posts 72. The populated stamp 70 then travels to cavity substrate 10 (or vice versa) and one or more components 30 are then aligned to component supports 32 and printed. Similarly, a cavity structure 99 can be micro-transfer printed with a stamp 70 from a cavity structure source wafer 90 to a destination substrate 80 forming broken (e.g., fractured) or separated structure tethers 91.

Cavity Substrates

Cavity substrate 10 can be any target substrate, for example with component supports 32, to which components 30 are transferred (e.g., micro-transfer printed) or formed. Cavity substrate 10 can be any suitable substrate, for example as found in the integrated circuit or display industries and can include one or more glass, polymer, semiconductor, crystalline semiconductor, compound semiconductor, ceramic, sapphire, quartz, or metal materials. Cavity substrates 10 can be semiconductor substrates (for example silicon) or compound semiconductor substrates. In certain embodiments, cavity substrate 10 is or comprises a member selected from the group consisting of polymer (e.g., plastic, polyimide, PEN, or PET), resin, metal (e.g., metal foil) glass, quartz, a semiconductor, and sapphire. In certain embodiments, a cavity substrate 10 has a thickness from 5 microns to 20 mm (e.g., 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm). In some embodiments, cavity substrate 10 can be processed using photolithographic methods and include photolithographic materials. Cavity substrate 10 can comprise multiple layers (e.g., including an adhesive layer) and substrate surface 12 can be the top, exposed surface of cavity substrate 10. In some embodiments, cavity substrate comprises a single uniform material composition rather than comprising multiple layers.

Cavities

Cavity 20 (e.g., enclosed cavity 20) can be of any useful size, for example having at least one of a length and a width no greater than 10 mm (e.g., no greater than 1 mm, no greater than 500 microns, no greater than 100 microns, no greater than 50 microns, no greater than 25 microns, or no greater than 10 microns). Cavity 20 can have a length greater than a width and component support 32 can extend across a width of cavity 20. In some embodiments, component support 32 physically extends from (e.g., attaches to) side(s) of cavity 20, for example from cavity walls 24 or substrate surface 12, and edge(s) of component 30 and does not attach to cavity floor 22. The length of cavity 20 can be at least 1.5 times (e.g., at least two times, at least three times, or at least four times) greater than the width of cavity 20. Cavity 20 can have a depth of no greater than 1 mm (e.g., no greater than 500 microns, no greater than 100 microns, no greater than 50 microns, no greater than 20 microns, no greater than 10 microns, or no greater than 5 microns). In some embodiments, component 30 has a thickness of not more than two microns (e.g., not more than one micron, or not more than 500 nm) and can be separated from a floor of cavity 20 by no more than 50 microns (e.g., no more than 20 microns, no more than 10 microns, no more than 5 microns, or no more than 2 microns). Components 30 having a length of approximately 250 microns provided on a component support 32 have been constructed (e.g., in accordance with the embodiments shown in FIG. 34 and FIG. 35).

Cavity Structure Source Wafers

A cavity structure source wafer 90 can be any source wafer or substrate with transfer printable cavity structures 99 that can be transferred with a transfer device (e.g., a stamp 70). For example, a cavity structure source wafer 90 can be or comprise a semiconductor (e.g., silicon) in a crystalline or non-crystalline form, a compound semiconductor (e.g., comprising GaN or GaAs), a glass, a polymer, a sapphire, or a quartz wafer. Sacrificial portions 94 can be formed of a patterned oxide (e.g., silicon dioxide) or nitride (e.g., silicon nitride) layer or can be an anisotropically etchable portion of sacrificial layer 92 of cavity structure source wafer 90.

Structure anchors 96 and structure tethers 91 can each be or can comprise portions of cavity structure source wafer 90 that are not sacrificial portions 94 and can include layers formed on cavity structure 99, for example dielectric or metal layers and for example layers formed as a part of photolithographic processes used to construct or encapsulate cavity structure 99.

Destination Substrates

Destination substrate 80 can be any destination substrate or target substrate to which cavity structure 99 are transferred (e.g., micro-transfer printed), for example integrated circuit substrates, printed circuit boards, or similar substrates used in various embodiments. Destination substrate 80 can be, for example substrates comprising one or more of glass, polymer, quartz, ceramics, metal, and sapphire. Destination substrates 80 can be semiconductor substrates (for example silicon) or compound semiconductor substrates. In certain embodiments, destination substrate 80 is or comprises a member selected from the group consisting of polymer (e.g., plastic, polyimide, PEN, or PET), resin, metal (e.g., metal foil) glass, a semiconductor, and sapphire. In certain embodiments, a destination substrate 80 has a thickness from 5 microns to 20 mm (e.g., 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm). One of ordinary skill in the art will recognize that where embodiments are described as including cavity substrate 10 or destination substrate 80, for example having cavity 20 disposed therein, analogous embodiments exist using destination substrate 80 or cavity substrate 10 in their place, respectively.

Electrical Conductors

In some embodiments of the present disclosure, components 30 can have one or more component electrodes 50 on a component top side 38 (e.g., component surface 34) of components 30 or components 30 can have one or more component electrodes 50 on a component bottom side 39 of components 30 on a side of component 30 adjacent to cavity floor 22. Component electrodes 50 can be electrically connected to destination substrate electrical connections 82.

Patterned electrical conductors such as component electrodes 50 (e.g., wires, traces, or electrodes (e.g., electrical contact pads) such as those found on printed circuit boards, flat-panel display substrates, and in thin-film circuits) can be formed on any combination of components 30, component supports 32, cavity substrate 10, and destination substrate 80, and any one can comprise electrodes (e.g., electrical contact pads) that electrically connect to components 30. Such patterned electrical conductors and electrodes (e.g., contact pads) can comprise, for example, metal, transparent conductive oxides, or cured conductive inks and can be constructed using photolithographic methods and materials, for example metals such as aluminum, gold, or silver deposited by evaporation and patterned using pattern-wise exposed, cured, and etched photoresists, or constructed using imprinting methods and materials or inkjet printers and materials, for example comprising cured conductive inks deposited on a surface or provided in micro-channels in or on any combination of component 30, cavity substrate 10, component supports 32, or destination substrate 80.

Component Supports

In some embodiments, component support 32 extends or protrudes from a cavity surface (e.g., cavity floor 22 or cavity wall 24) of cavity 20 of cavity substrate 10. In some embodiments, component supports 32 have a substantially rectangular cross section parallel to substrate surface 12. In some embodiments, component supports 32 have non-rectangular cross sections, such as circular or polygonal cross sections for example. In some embodiments, component supports 32 have a flat surface on a distal end of each component support 32 in a direction parallel to cavity substrate 10 substrate surface 12, e.g., can be a mesa.

A component support 32 can be a pedestal, post, wall, or ridge of patterned and shaped material. A component support 32 can comprise the same material as cavity substrate 10 or can comprise a different material from cavity substrate 10 or component 30 or both. For example, in some embodiments, component supports 32 comprise the same material (e.g., silicon or other semiconductor materials) as cavity substrate 10 and are patterned in cavity substrate 10, for example by patterned etching using photoresists and other photolithographic processes, by stamping, or by molding. In some embodiments, component supports 32 are formed on cavity substrate 10 (e.g., by coating). In some embodiments, component supports 32 comprise different materials from cavity substrate 10, for example by coating a material in a layer on cavity substrate 10 and pattern-wise etching the coated layer to form component supports 32.

A component support 32 material can be a dielectric, can comprise conductors (e.g., electrodes), or can be a conductor (e.g., a metal). In some embodiments, component supports 32 can comprise any material to which components 30 can be adhered or connected. For example, a component support 32 can be or comprise a dielectric material, such as an oxide (e.g., silicon dioxide) or nitride (e.g., silicon nitride) or polymer, resin, or epoxy and can be organic or inorganic. Component supports 32 can be a cured resin and can be deposited in an uncured state and cured or patterned before components 30 are micro-transfer printed to component supports 32 or cured after components 30 are micro-transfer printed to component supports 32. Component supports 32 can be electrically conductive and comprise, for example, metals or metallic materials or particles. Component supports 32 can be formed using photolithographic processes, for example component supports 32 can be formed by coating a resin over a substrate and then patterning and curing the resin using photolithographic processes (e.g., coating a photoresist, exposing the photoresist to patterned radiation, curing the photoresist, etching the pattern to form component supports 32 and cavity substrate 10, and stripping the photoresist). In some embodiments, component supports 32 can be constructed by inkjet deposition or imprinting methods, for example using a mold, and can be imprinted structures. In some embodiments, component supports 32 can be printed into cavity 20.

Adhesive

In some embodiments, a layer of adhesive 48, such as a layer of resin, polymer, or epoxy, either curable or non-curable, adheres components 30 onto component supports 32 of cavity substrate 10 and can be disposed, for example by coating or lamination. In some embodiments, a layer of adhesive 48 is disposed in a pattern and can be disposed using inkjet, screening, or photolithographic techniques, for example. In some embodiments, a layer of adhesive 48 is coated, for example with a spray or slot coater, and then patterned, for example using photolithographic techniques. In some embodiments, solder is pattern-wise coated and disposed on component support 32 or component electrodes 50, for example by screen printing, and improves an electrical connection between a component 30 and an electrical conductor on component support 32.

Construction

Certain embodiments of the present disclosure can be constructed, for example, by photolithographic methods and materials, including material deposition by evaporative, spin, or slot coating, patterning, curing, etching, and stripping photoresists, and pattern-wise or blanket etching deposited materials, for example with gas, wet, or dry etchants. Materials can include metals (for example, such as aluminum, gold, silver, tin, tungsten, and titanium), polymers (for example such as photoresists, resins, epoxies, and polyimide), and oxides and nitrides (for example such as silicon dioxide and silicon nitride). Some elements of a cavity structure 99 can be micro-transfer printed from a source wafer, for example component 30, cap 40, or cavity substrate circuit 16. In some embodiments, if a component 30 is micro-transfer printed from a source wafer, component 30 can comprise a component tether 31. Likewise, in some embodiments, if cap 40 is micro-transfer printed from a source wafer, cap 40 can comprise a cap tether 41. In some embodiments, if cavity substrate circuit 16 is micro-transfer printed from a source wafer, cavity substrate circuit 16 can comprise a circuit tether (not shown in the Figures).

Figure 39:
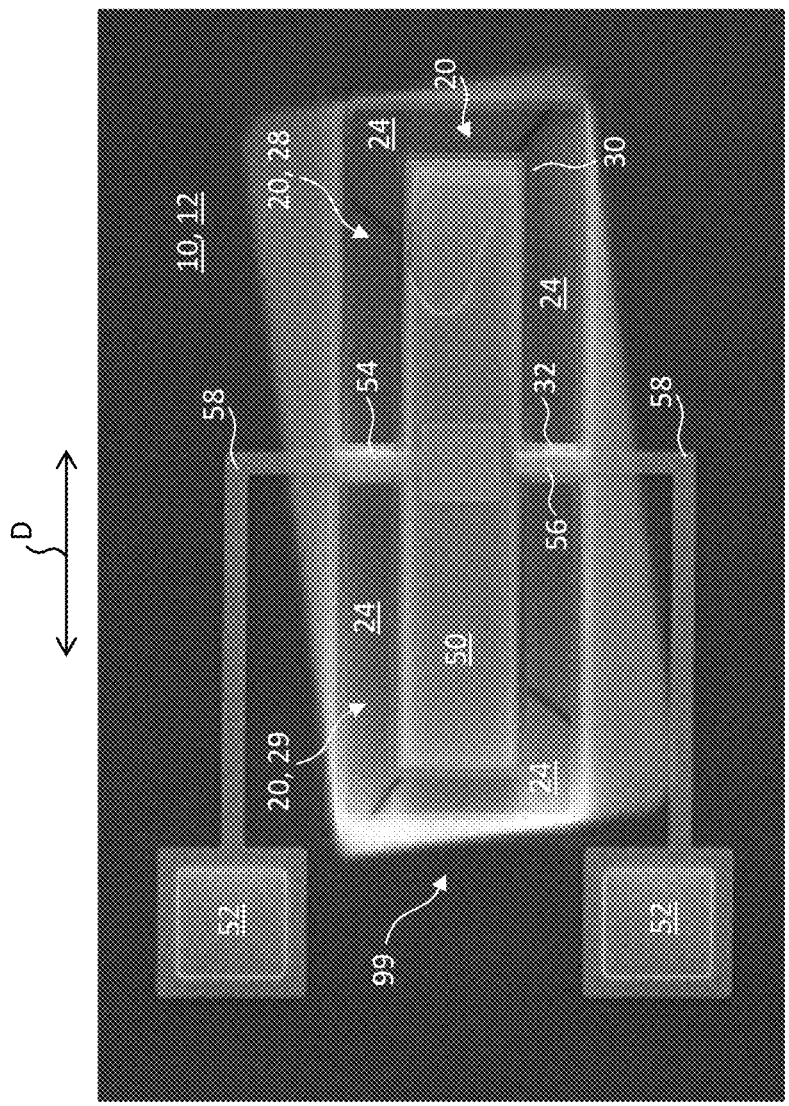
FIG. 39 is a micrograph of an overhanging device cavity structure according to illustrative embodiments of the present disclosure.
Figure 40:
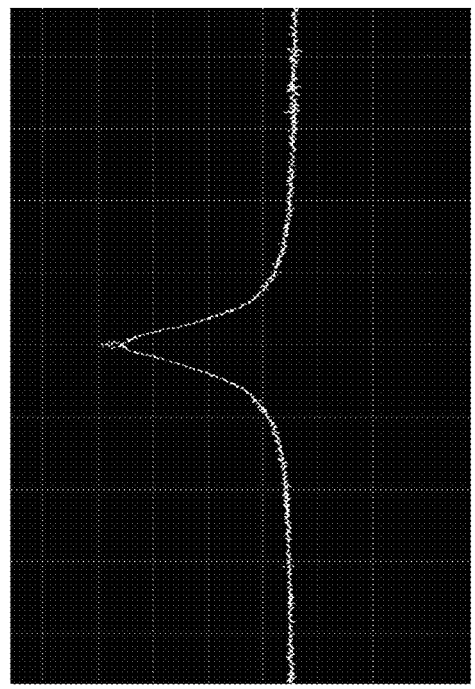
FIG. 40 is an enlarged graph illustrating the performance of the device of FIG. 39 useful in understanding certain embodiments of the present disclosure.

As shown in FIG. 39, a cavity structure 99 of cavity substrate 10 comprising piezoelectric resonant component 30 disposed on component support 32 in cavity 20 with first and second cavity walls 24 and having ends suspended over (overhanging) first and second cavity portions 28, 29 with component top and bottom electrodes 54, 56, for example as shown in FIGS. 27A and 27B and made in accordance with FIG. 36, has been constructed. Cavity structure 99 has further been electrically tested with probes connected to component contact pads 52 through cavity substrate electrodes 58 and demonstrated to work with desirable frequency response and selectivity, as shown in FIG. 40. FIG. 40 is an enlarged graph showing the frequency response of overhanging device cavity structure 99 with a full-width half-max value of less than 10 kHz over a 20 MHz range.

Various embodiments of structures and methods were described herein. Structures and methods were variously described as transferring components 30, printing components 30, transfer printing components 30, or micro-transferring components 30. As used herein, micro-transfer-printing involves using a transfer device (e.g., an elastomeric stamp 70, such as a polydimethylsiloxane (PDMS) stamp 70) to transfer a component 30 using controlled adhesion. For example, an exemplary transfer device can use kinetic or shear-assisted control of adhesion between a transfer device and a component 30. It is contemplated that, in certain embodiments, where a method is described as including micro-transfer-printing a component 30, other analogous embodiments exist using a different transfer method. As used herein, transferring a component 30 or transfer printing a component 30 (e.g., from a cavity structure source wafer 90 to a destination substrate 80) can be accomplished using any one or more of a variety of known techniques. For example, in certain embodiments, a pickand-place method can be used. As another example, in certain embodiments, a flip-chip method can be used (e.g., involving an intermediate, handle or carrier substrate). In methods according to certain embodiments, a vacuum tool, electrostatic tool or other transfer device is used to transfer (e.g., transfer print) a component 30.

Examples of micro-transfer printing processes suitable for disposing components 30 onto destination substrates 80 are described in *Inorganic light-emitting diode displays using micro-transfer printing* (Journal of the Society for Information Display, 2017, DOI #10.1002/jsid.610, 1071-0922/17/ 2510-0610, pages 589-609), U.S. Pat. No. 8,722,458 entitled Optical Systems Fabricated by Printing-Based Assembly, U.S. Pat. No. 10,103,069 entitled Pressure Activated Electrical Interconnection by Micro-Transfer Printing, U.S. Pat. No. 8,889,485 entitled Methods for Surface Attachment of Flipped Active Components, U.S. Pat. No. 10,468,363 entitled Chiplets with Connection Posts, U.S. Pat. No. 10,224,460 entitled Micro-Assembled LED Displays and Lighting Elements, and U.S. Pat. No. 10,153,256, entitled Micro-Transfer Printable LED Component, the disclosure of each of which is incorporated herein by reference in its entirety.

For a discussion of various micro-transfer printing techniques, see also U.S. Pat. Nos. 7,622,367 and 8,506,867, each of which is hereby incorporated by reference in its entirety. Micro-transfer printing using compound microassembly structures and methods can also be used in certain embodiments, for example, as described in U.S. patent application Ser. No. 14/822,868, filed Aug. 10, 2015, entitled Compound Micro-Assembly Strategies and Devices, which is hereby also incorporated by reference in its entirety. In some embodiments, any one or more of component 30, cavity structure 99, or cavity structure system 97 is a compound micro-assembled structure (e.g., a compound micro-assembled macro-system).

Operation

In certain embodiments a structure including component 30 disposed on component support 32 can be operated, for example, by providing power or control signals to component top and bottom electrodes 54, 56, for example from cavity substrate circuit 16 or an external controller (not shown in the Figures) and, optionally, cavity substrate electrodes 58. In some such embodiments, component 30 responds to the power and control signals and operates to process any signals provided. Cavity substrate circuit 16 can control or otherwise operate or respond to components 30. Component 30 can be, for example, a mechanically resonant piezoelectric device. By adhering or otherwise contacting a center portion of component 30 to component support 32, some resonant modes of component 30, for example undesired modes, can be controlled, inhibited, suppressed, or reduced. In particular, resonant modes that extend and contract the length of component 30 can be preferentially enabled and other modes suppressed, similarly to a solidly mounted resonator, but in a more mechanically isolated structure, providing better performance in a more controlled structure that can be more easily constructed with fewer externally induced complications.

As is understood by those skilled in the art, the terms "over" and "under" are relative terms and can be interchanged in reference to different orientations of the layers, elements, and substrates included in various embodiments of the present disclosure. Furthermore, a first layer or first element "on" a second layer or second element, respectively, is a relative orientation of the first layer or first element to the second layer or second element, respectively, that does not preclude additional layers being disposed therebetween. For example, a first layer on a second layer, in some implementations, means a first layer directly on and in contact with a second layer. In other implementations, a first layer on a second layer includes a first layer and a second layer with another layer therebetween (e.g., and in mutual contact). In some embodiments, a component 30 has connection posts extending therefrom and is disposed "on" a cavity substrate 10 or a component support 32 with connection posts disposed between cavity substrate 10 or component support 32 and component 30.

Headings are provided herein for the convenience of the reader and are not intended to be limiting with respect to any particular subject matter. One of ordinary skill in the art, having read the specification as a whole, will readily appreciate and understand that embodiments expressly described under one heading may be used with, adapted to, modified from, or otherwise relate to embodiments expressly described under another heading.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific elements, or where processes and methods are described as having, including, or comprising specific steps, it is contemplated that, additionally, there are apparatus and systems of the disclosed technology that consist essentially of, or consist of, the recited elements, and that there are processes and methods according to the disclosed technology that consist essentially of, or consist of, the recited processing steps.

It should be understood that the order of steps or order for performing certain action is immaterial so long as operability is maintained. Moreover, two or more steps or actions in some circumstances can be conducted simultaneously. The disclosure has been described in detail with particular reference to certain embodiments thereof, but it will be understood that variations and modifications can be effected within the spirit and scope of the following claims.

PARTS LIST

A cross section line/direction
B cross section line/direction
D wall direction
D1 distance
D2 distance
G gap
L cavity length
S separation distance
W cavity width
10 cavity substrate
11 substrate edge
12 substrate surface
16 cavity substrate circuit
20 cavity/enclosed cavity
22 cavity floor/cavity bottom
24 cavity wall
24E extended cavity wall
28 first cavity portion
29 second cavity portion
30 component
31 component tether 32 component support/post/wall/ridge
34 component surface
35 mask
36 protection layer
38 component top side
39 component bottom side
40 cap
41 cap tether
42 cap contact portion
44 cap wall portion
46 cap top portion
48 adhesive
50 component electrode
52 component contact pad
54 component top electrode
56 component bottom electrode
58 cavity substrate electrode
60 encapsulation layer/dielectric layer
62 cap source wafer
64 reinforcement layer
66 cap source wafer trench
68 removable material
70 stamp/transfer device
72 stamp post/structured stamp post
80 destination substrate
82 destination substrate electrical connections
84 destination substrate adhesive layer
90 cavity structure source wafer
91 structure tether
92 sacrificial layer
93 etch front
94 sacrificial portion/gap
95 cap anchor
96 structure anchor
97 cavity structure system
98 cavity structure wafer
99 cavity structure
100 provide structure source wafer step
110 provide cavity substrate step
111 form component support
120 form component step
130 optional form sidewalls step
140 provide cap source wafer step
150 dispose cap step
160 optional encapsulation step
165 provide destination substrate step
170 form cavity step
175 form cavity and release cavity structure step
180 release cavity structure step
185 micro-transfer print component step
190 micro-transfer print cavity structure step
195 done step
200 structure cap source wafer step
210 deposit and pattern cap step
220 deposit material step
230 pattern cap step
240 release cap from cap source wafer step
300 provide patterned substrate with substrate post step
302 provide patterned substrate with substrate post and walls step
306 provide substrate step
310 dispose component step
312 micro-transfer print component from component source wafer step
314 form component step
316 optional form etch mask step
318 form cavity with substrate post and walls step
320 dispose cap step
322 micro-transfer print cap with walls step
324 form walls step
325 micro-transfer print or laminate cap step
330 optional encapsulate module step
340 optional micro-transfer print module from module substrate step
400 provide substrate step
401 provide substrate step
410 etch cavity step
411 etch cavity step
420 partially fill cavity with removable material step
430 form support cavity step
440 form support step
450 form device step
460 remove removable material step
470 optional dispose cap step

What is claimed is:

1. A method of making a cavity structure, comprising:
providing a cavity structure source wafer, a protection layer disposed on the cavity structure source wafer, and a component support disposed on the protection layer;
disposing a component on or over the component support;
disposing a mask over the component and over a portion of the component support, the portion of the component support defining walls;
etching the component support to form the walls and etching the protection layer to expose at least a portion of the cavity structure source wafer; and
encapsulating the component and the walls with a patterned encapsulation layer physically connecting the component to the walls, defining a structure tether, and exposing a portion of the cavity structure source wafer.

2. The method of claim 1, comprising etching the cavity structure source wafer to release the component and the walls from the cavity structure source wafer so that the component and the walls are physically connected to a structure anchor of the cavity structure source wafer by the structure tether.

3. The method of claim 2, comprising printing the component and walls from the cavity structure source wafer to a destination substrate, thereby breaking or separating the structure tether.

4. The method of claim 3, comprising printing a cap onto the walls or onto the destination substrate to enclose the component.

5. A cavity structure, comprising:
a component support forming walls defining sides of a volume;
a component disposed in or over the volume and physically connected to the component support;
a patterned encapsulation layer disposed over the component support, wherein the patterned encapsulation layer physically connects the component to the component support; and
at least a portion of a structure tether physically connected to the component support exterior to the volume.

6. The cavity structure of claim 5, comprising a cavity substrate and wherein the component support is disposed on the cavity substrate.

7. The cavity structure of claim 6, comprising a cap disposed over the component and the component support on a side of the component opposite the cavity substrate and adhered to the cavity substrate.

8. The cavity structure of claim 5, wherein the component is suspended at least partially within the volume.

9. The cavity structure of claim 5, comprising a cavity substrate comprising a cavity, wherein the component support is disposed such that the component is suspended over the cavity.

10. The cavity structure of claim 9, wherein a cross section of the cavity is triangular.

11. The cavity structure of claim 5, comprising a cap disposed over the component and the component support and adhered to the component support.

12. The cavity structure of claim 5, comprising a cap having a top hat structure disposed over the component and the component support.

13. The cavity structure of claim 5, wherein the component extends above the component support.

14. The cavity structure of claim 5, wherein the component is disposed entirely within the volume.

15. The cavity structure of claim 5, wherein an interior perimeter of the component support and an exterior perimeter of the component support each form a periphery of a rectangle.

16. The cavity structure of claim 5, wherein the component is separated from the walls.

* * * * *